United States Patent

Yamada et al.

[11] Patent Number: 5,990,629
[45] Date of Patent: Nov. 23, 1999

[54] ELECTROLUMINESCENT DISPLAY DEVICE AND A DRIVING METHOD THEREOF

[75] Inventors: Hiroyasu Yamada, Hachioji; Masaharu Shioya, Akiruno, both of Japan

[73] Assignee: Casio Computer Co., Ltd., Tokyo, Japan

[21] Appl. No.: 09/013,708

[22] Filed: Jan. 26, 1998

[30] Foreign Application Priority Data

| Jan. 28, 1997 | [JP] | Japan | 9-027323 |
| Feb. 21, 1997 | [JP] | Japan | 9-052543 |
| May 22, 1997 | [JP] | Japan | 9-148719 |
| May 29, 1997 | [JP] | Japan | 9-154320 |

[51] Int. Cl.$^6$ ................................ G09G 3/10
[52] U.S. Cl. ............... 315/169.3; 345/76; 345/92; 257/71; 349/42
[58] Field of Search ............. 315/169.3, 169.2, 315/169.1; 345/76, 84, 92, 94, 100; 257/71, 72, 88; 340/825.81; 349/42, 44; 437/21, 40, 59; 313/500, 506

[56] References Cited

U.S. PATENT DOCUMENTS

| 4,888,523 | 12/1989 | Shoji et al. ............... 315/169.3 |
| 5,095,248 | 3/1992 | Sato ........................ 315/169.3 |
| 5,550,066 | 8/1996 | Tang et al. ................ 437/40 |
| 5,610,628 | 3/1997 | Yamamoto et al. ......... 345/100 |
| 5,736,752 | 4/1998 | Hseuh et al. .............. 257/72 |

FOREIGN PATENT DOCUMENTS

| 0720139 A2 | 7/1996 | European Pat. Off. . |
| 0762374 A1 | 3/1997 | European Pat. Off. . |
| WO 93/24921 | 12/1993 | WIPO . |

Primary Examiner—Haissa Philogene
Attorney, Agent, or Firm—Frishauf, Holtz, Goodman, Langer & Chick P.C.

[57] ABSTRACT

A controller stores image signals Sp represented as binary values for every unit of frame. The controller divides one frame into a plurality of sub-frames representing an image by image data of two gradation levels, in accordance with respective figures of the stored image signals Sp for one frame. The image data of two gradation levels for each of the sub-frames is written into capacitors Cp from a drain driver, for every row. When the image data is "1", a drive transistor is turned on. A common driver applies a voltage of a predetermined level for every sub-frame, to control the voltage applied between electrodes of an organic EL element. As a result, the organic EL element emit light with brightness which differs between sub-frames. Images of the sub-frames are visually synthesized, so that gradation is expressed in one frame.

25 Claims, 33 Drawing Sheets

ELECTROLUMINESCENT DISPLAY DEVICE AND A DRIVING METHOD THEREOF

BACKGROUND OF THE INVENTION

The present invention relates to a display device and a driving method thereof, and particularly, to a display device and a driving method thereof suitable for gradation display of an organic electroluminescent device or an organic EL element.

As mobile computing has become popular, demands for a flat type display apparatus have increased. As a flat type display apparatus, a liquid crystal display apparatus has been conventionally used. However, a liquid crystal display apparatus has a problem that the view angle is narrow and the response characteristic is low.

In contrast, attention has recently been paid to a display apparatus which achieves display by light emission with use of an organic electroluminescent element, as another flat type display apparatus which has a wide view angle and an excellent response characteristic. Pixels of an organic electroluminescent panel used in such a display apparatus are respectively constructed by organic EL elements 31, drive transistors 32 consisting of TFTs (thin film transistors), and selection transistors 33 also consisting of TFTs, as shown in FIG. 32. Further, the gate of the selection transistor 33 is connected to a gate line GL connected to a gate driver (not shown), and the drain of the selection transistor 33 is connected to a drain line DL connected to a drain driver (not shown). The source of the selection transistor 33 is respectively connected to the gate of the drive transistor 32. The source of the drive transistor 32 is connected to the cathode of corresponding organic EL element 31, and the drain thereof is grounded. The anodes of all the organic EL elements 31 are connected to be always supplied with a constant voltage of a reference potential Vdd.

In case where a full-color image is displayed on the organic EL display apparatus, light-emission luminance gradation display of each organic EL element 31 is achieved by controlling each of voltages applied through the drain line DL and the selection transistor 33 to the drive transistor 32 from the drain driver, thereby to control a source-drain current of the drive transistor 32.

Specifically, as is shown in the characteristic graph in FIG. 33, with the reference potential Vdd kept set to be constant, i.e., with the source-drain voltage Vsd of the drive transistor 32 kept set to be constant, the drain current Isd between the source and drain of the drive transistor 32 is changed by changing the gate voltage Vg of the drive transistor 32. In this manner, the amount of current flowing through the organic EL element 31 changes thereby changing the energy excited when holes and electrons are respectively coupled with each other in the organic EL layer of the organic EL element 31. As a result, the amount of light emitted by the organic EL element 31 changes. The gate voltage Vg of the drive transistor 32 is changed by a change of the drain signal voltage applied to the drain of a selection transistor 33.

It is very difficult that the gate voltages and the source-drain currents of the drive transistors 32 connected to all the organic EL elements 31 in a panel are provided with uniform characteristics, according to increase of number of pixels. Therefore, the source-drain current varies even if the gates of the drive transistors 32 are applied with a voltage of an equal value. As a result, the values of currents flowing through organic EL elements 31 greatly vary, or in other words, the amounts of the holes and the electrons greatly vary, so that the amount of light emitted by an organic EL element 31 varies for every pixel even though one same signal is outputted to drain lines DL, resulting in that the quality of an image displayed on the organic EL panel is degraded.

The problem described above leads to another problem that the yield of organic EL panels is lowered.

BRIEF SUMMARY OF THE INVENTION

The present invention has an object of providing an electroluminescent display apparatus with high image quality, in which uniform light emission amounts can be obtained for respective pixels and each panel, and a driving method of the electroluminescent display apparatus by which excellent light emission luminance gradation can be obtained.

In order to achieve the above object, an electroluminescent display apparatus according to the present invention is characterized by comprising: a plurality of electroluminescent elements for emitting light in response to a voltage or a current applied, each of the electroluminescent elements including a first electrode, an electroluminescent layer in contact with the first electrode, constructed by at least one layer, and a second electrode in contact with the electroluminescent layer; a plurality of first switching circuits respectively connected to the first electrodes of the electroluminescent elements, for applying a first drive voltage to electroluminescent elements selected in each of address periods, in each of light emission setting periods, each of the first switching circuits having a smaller resistance ratio than that of each of the plurality of electroluminescent elements, during each of the light emission setting periods; and a second switching circuit connected to each of the second electrodes of the electroluminescent elements, for applying a second drive voltage different from the first drive voltage, to all the electroluminescent elements, in each of the light emission setting periods.

In addition, the electroluminescent display apparatus according to the present invention may be an electroluminescent display apparatus comprising: first and second groups each consisting of electroluminescent elements for emitting light in response to a voltage or a current applied, each of the electroluminescent elements including a first electrode, an electroluminescent layer in contact with the first electrode, constructed by at least one layer, and a second electrode in contact with the electroluminescent layer; a plurality of first switching circuits respectively connected to the first electrodes of the electroluminescent elements, for applying a first drive voltage to electroluminescent elements selected in each of address periods, in each of light emission setting periods, each of the first switching circuits having a smaller resistance ratio than that of each of the plurality of electroluminescent elements, during each of the light emission setting periods; and a second switching circuit connected to each of the second electrodes of the electroluminescent elements, for applying a second drive voltage different from the first drive voltage, to the first group of the electroluminescent elements, and subsequently, to the second group of the electroluminescent elements, in each of the light emission setting periods.

According to the display apparatuses as described above, the resistance ratio of the first switching circuits in each of the light emission setting periods is smaller than that of the plurality of electroluminescent elements. Therefore, influences onto the electroluminescent elements are small even if the characteristics of the first switching circuit vary, and therefore, uniform luminance gradation control can be performed by the second switching circuit.

Also, in order to achieve the above object, a driving method of an electroluminescent display apparatus, according to the present invention, is characterized by comprising: a step of including a plurality of electroluminescent elements for emitting light in response to a voltage or a current applied, each of the electroluminescent elements including a first electrode, an electroluminescent layer in contact with the first electrode, and a second electrode in contact with the electroluminescent layer; a first drive voltage supply step of supplying a first drive voltage to the first electrodes of the electroluminescent elements which are addressed, in each of light emission setting periods, in a frame period for forming an image by synthesizing a plurality of sub-frames each consisting of an address period for addressing the plurality of electroluminescent elements, and one of the light emission setting periods for making the addressed electroluminescent elements emit light; and a second drive voltage supply step of supplying a second drive voltage different from the first drive voltage, to the second electrodes of all the electroluminescent elements, in each of the light emission setting periods.

According to the present invention, another driving method of an electroluminescent display apparatus comprises: (A) a step of including first and second groups each consisting of electroluminescent elements for emitting light in response to a voltage or a current applied, each of the electroluminescent elements including a first electrode, an electroluminescent layer in contact with the first electrode, and a second electrode in contact with the electroluminescent layer; (B-1) a first electroluminescent element group address step of addressing the first group of the electroluminescent elements; (B-2) a first electroluminescent element group light emission step of applying a common voltage to the electroluminescent elements addressed by the first electroluminescent element group address step; (B-3) a second electroluminescent element group address step of addressing the second group of the electroluminescent elements, after the first electroluminescent element group address step; and (B-4) a second electroluminescent element group light emission step of applying a common voltage to the electroluminescent elements addressed by the second electroluminescent element group address step, wherein the first electroluminescent element group address step, the first electroluminescent element group light emission step, the second electroluminescent element group address step, and the second electroluminescent element group light emission step are carried out, in one of sub-frames of a frame period for forming an image by synthesizing the sub-frames each consisting of an address period for sequentially addressing the first and second groups, and a light emission setting period for making those of the electroluminescent elements of the first and second groups, which are addressed in the address period, emit light.

According to the driving methods of an electroluminescent display apparatus, as described above, one frame period for forming one image is divided into a plurality of sub-frame periods, and excellent luminance gradation can be obtained by synthesizing the sub-frame periods.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

In the following, embodiments of the present invention will be explained with reference to the drawings.

In the first embodiment, explanation will be made of an example of an organic EL display apparatus in which one frame period as a period for substantially displaying one image of one frame is divided into four sub-frame periods and the light-emission amounts of the sub-frames are set to a ratio of 1:2:4:8, to display 16-gradation levels.

Figure 1:
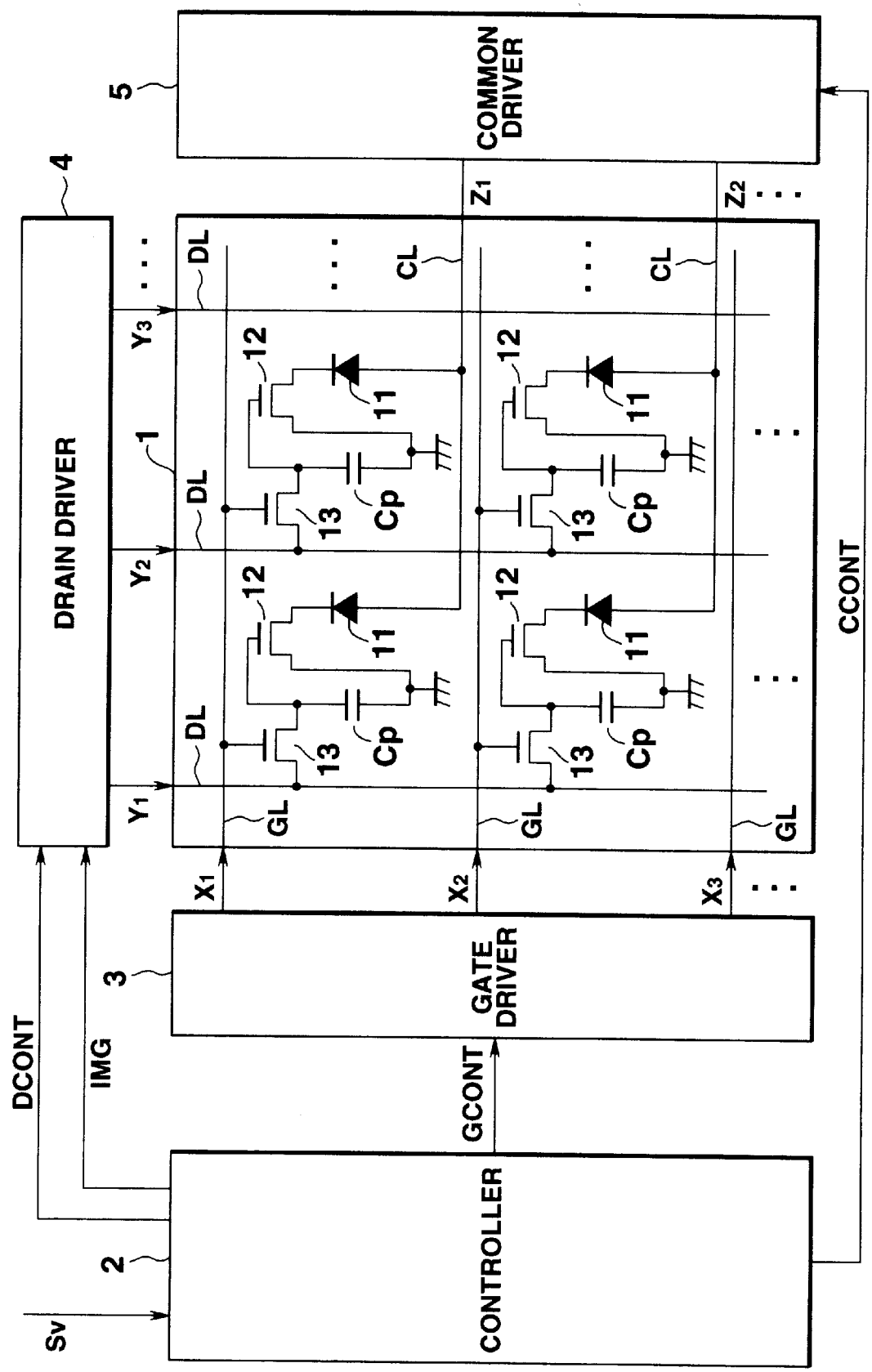
FIG. 1 is a circuit configuration showing a structure of an organic EL display apparatus according to first and fifth embodiments of the present invention.

FIG. 1 is a block diagram showing a structure of an organic EL display apparatus according to the embodiment.

As shown in the figure, the organic EL display apparatus comprises an organic EL panel 1, a controller 2, a gate driver 3, a drain driver 4, and a common driver 5.

In the organic EL panel 1, as shown in the circuit configuration of an equivalent circuit in the figure, each of the pixels of the organic EL panel 1 includes an organic EL element 11, a drive transistor 12, a selection transistor 13, and a capacitor Cp.

Organic EL elements 11 which emit light in red, green, and blue are arrayed in a predetermined order in a matrix consisting of N lines (or pieces) in the row direction (or the lateral direction in the figure) and M rows (or pieces) in the line direction (or the longitudinal direction in the figure). When a voltage equal to or higher than a threshold value Vth is applied between an anode and a cathode of the organic EL element 11, as shown in the characteristic graph in FIG. 2, a current flowing in the organic EL layer (described later) of the element rapidly rises and the element emits light with a luminance corresponding to the value of the current. Since the voltage thus applied and the luminance can be substantially represented by a linear function within a range of Vth to (Vth+Vx), the luminance gradation can be controlled by controlling the applied voltage applied between both ends of the organic EL layer, within the range. The amount of the current flowing through the organic EL layer, and accordingly, the light emission amount of the organic EL element 11 are saturated when the voltage applied between the anode and the cathode of the organic EL layer is more than (Vth+Vx).

Each drive transistor 12 is made of a TFT. The gate of the drive transistor 12 is connected to a source of the selection transistor 13, and the source of the drive transistor 12 is connected to a cathode electrode of the organic EL element 11. The drain of the drive transistor 12 is grounded. The drive transistor 12 is used as a switch for turning on and off a power supplied to the organic EL element 11.

When the organic EL element 11 is applied with a common signal of a predetermined voltage value or a predetermined current value from the common driver 5 described later, the ON resistance of the drive transistor 12 becomes sufficiently smaller (by, for example, 1/10 time) than the resistance of the organic EL element 11, and the OFF resistance becomes sufficiently larger (by, for example, 10 times) than the resistance of the organic El element 11. Therefore, while the drive transistor 12 is turned on, most of the voltage outputted from the common driver 5 is distributed to the organic EL element 11. Therefore, the ON resistance of the drive transistor 12 is negligibly small, in comparison with the resistance of the organic EL element 11 while the drive transistor 12 is turned on. Meanwhile, while the drive transistor 12 is turned off, most of the voltage outputted from the common driver 5 is distributed to between the source and drain of the drive transistor 12. In other words, since the partial voltage distributed to the drive transistor 12 is extremely small in comparison with the partial voltage distributed to the organic EL element 11, the resistance ratio of the drive transistor 12 to the organic EL element 11 is small in accordance with the Kirchhoff's law, so that influences onto the luminance of the organic EL element 11 can be extremely reduced even if each of the ON resistance and the OFF resistance of the drive transistor 12 varies. If the drive transistor 12 uses a semiconductor layer made of amorphous silicon, the difference between the OFF resistance and the ON resistance is as large as a number of six figures or more. If the drive transistor 12 uses a semiconductor layer made of polysilicon, the difference between the OFF resistance and the ON resistance is as large as a number of seven figures or more. Any of these drive transistors can sufficiently function as a switch. Even if the difference between the OFF resistance and the ON resistance thus differs by one figure, the in-plane luminance balance can be maintained. Since the drain of the drive transistor 12 is connected to a reference voltage line SL, light emission of the organic EL element 11 mainly depends on a common signal Z outputted from a common line CL.

Each selection transistor 13 is made of a TFT. The gate of the selection transistor 13 is connected to one of gate lines GL respectively provided for rows of the organic EL panel 1, and the drain of the selection transistor 13 is connected to one of drain lines DL respectively provided for lines of the organic EL panel 1. The source of the selection transistor 13 is connected to the gate of the drive transistor 12. The selection transistor 13 is used as a switch for supplying binary ON and OFF signals to the gate of the drive transistor 12, relating to a drive signal from the drain driver 4 described later. All the selection transistors 13 are capable of applying a voltage higher than 10(V) to a gate electrode 12a (FIG. 3) of a corresponding drive transistor 12, although the voltage varies more or less. Therefore, a drain current Isd flowing through the drive transistor 12 depends only on the source-drain voltage Vsd.

Each capacitor Cp maintains a drive signal supplied from the drain driver 4 described later, for a predetermined period.

The structure of an organic EL panel 1 will be described in details, below.

Figure 3:
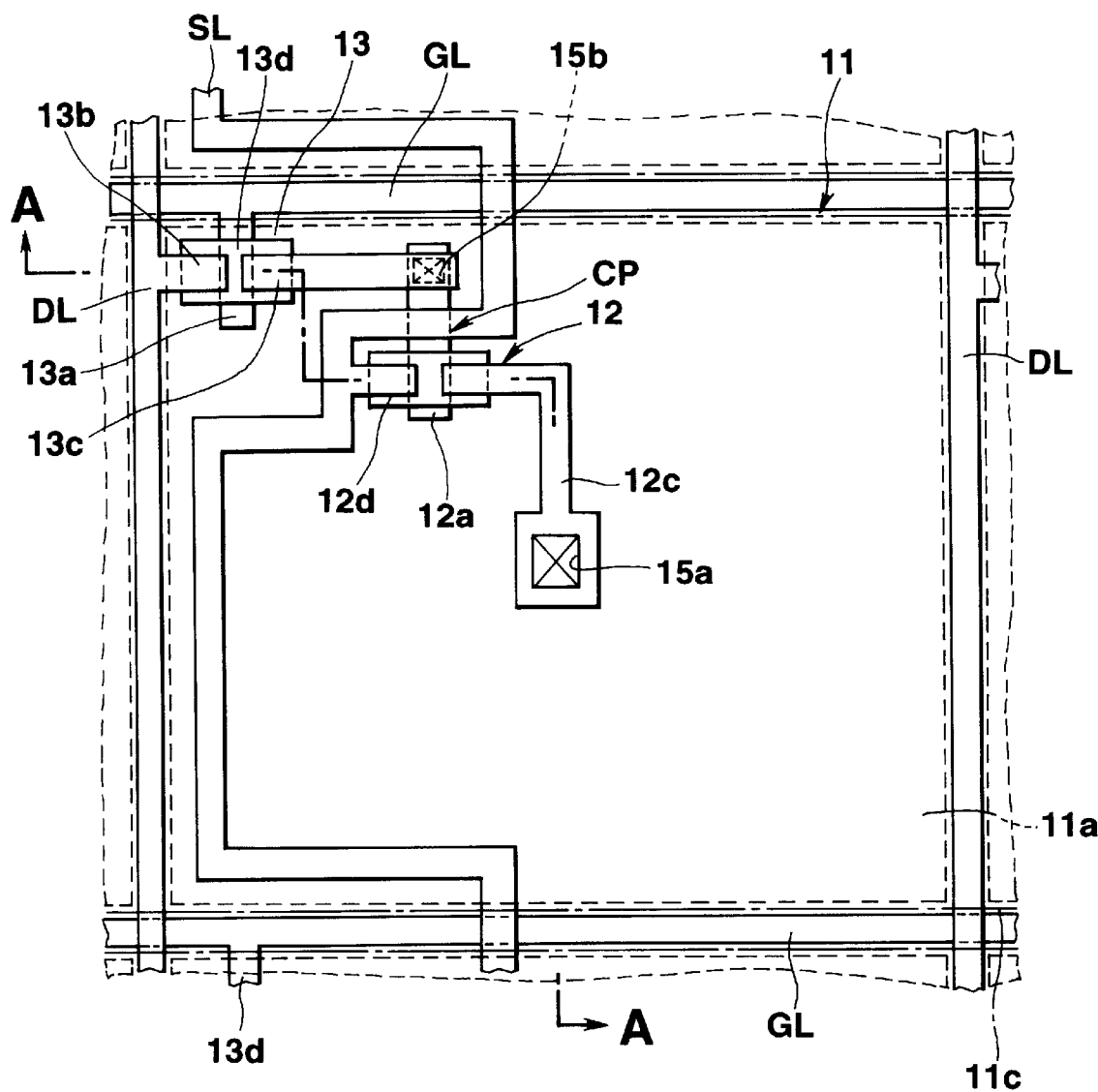
FIG. 3 is a plan view showing the structure of the organic EL element shown in FIG. 1.
Figure 4:
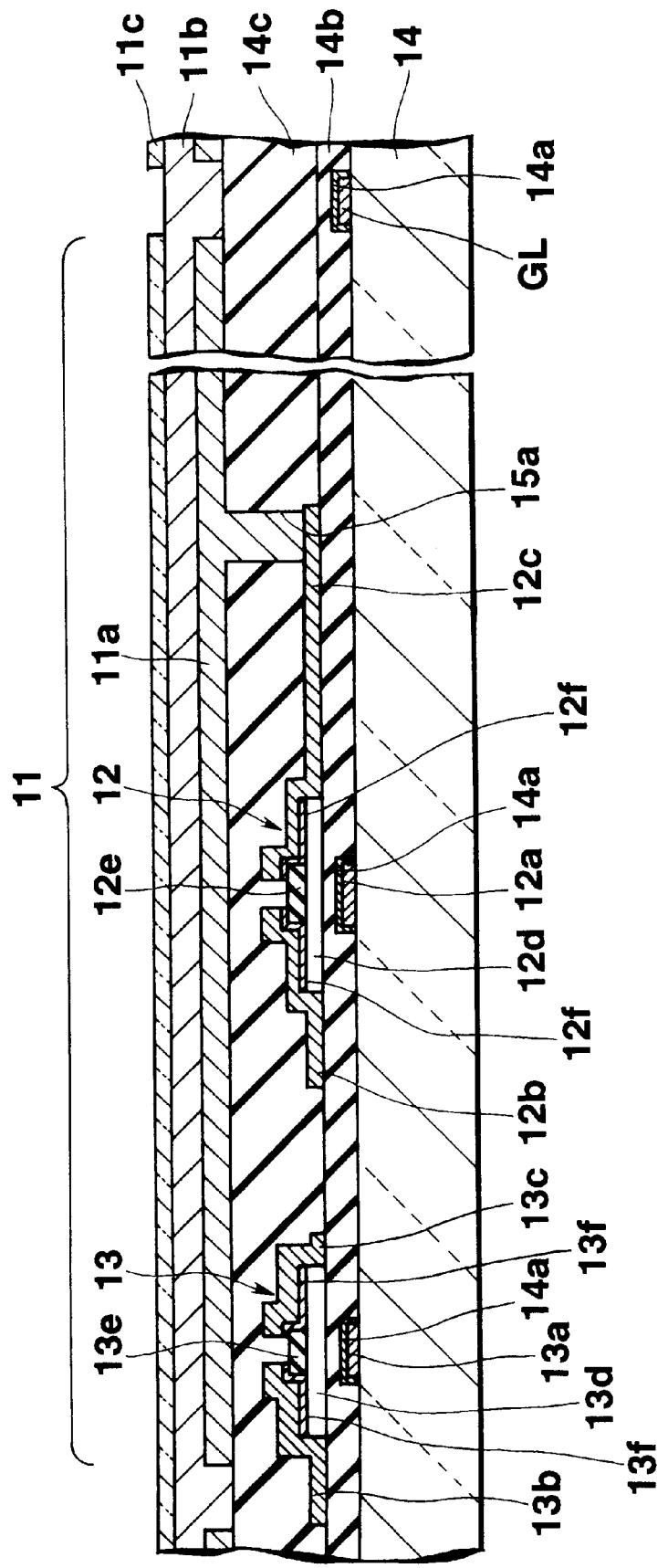
FIG. 4 is a cross-sectional view cut along a line A—A of FIG. 3.

FIG. 3 is a plan view showing a structure of one pixel of the organic EL panel 1. FIG. 4 is a cross-section cut along a line A—A in FIG. 3.

As shown in these figure, the organic EL panel 1 is constructed by forming organic EL elements 11, drive transistors 12, and selection transistors 13, on a glass substrate 14.

Specifically, a gate line GL consisting of a gate metal film made of aluminum, a gate electrode 13a of a selection transistor 13 integral with the gate line GL, and a gate electrode 12a of a drive transistor 12 are formed, by patterning, on the glass substrate 14. Anode oxide films 14a are respectively formed on the gate line GL and the gate electrodes 12a and 13a. Further, a gate insulating film 14b made of silicon nitride is formed on the substrate 14 including the anode oxide films 14a.

A semiconductor layer 13d made of amorphous silicon or polysilicon is formed on the gate insulating film 14b in the upper side of the gate electrode 13a. A blocking layer 13e is formed in the center of the semiconductor layer 13d, and ohmic layers 13f made of n-type amorphous silicon are formed in both sides of the blocking layer 13e. A drain electrode 13b of the selection transistor 13, formed to be integral with a data line DL, is formed to be partially layered on one of the ohmic layers 13f. Meanwhile, a source electrode 13c of the selection transistor 13 is formed to be partially layered on the other ohmic layer 13f, in the opposite side. Each selection transistor 13 is thus formed. Note that the source electrode 13c of the selection transistor 13 is connected to the gate electrode 12a of the drive transistor 12, through a contact hole 15b provided in the gate insulating film 14b.

A semiconductor layer 12d made of amorphous silicon or polysilicon is formed on the gate insulating film 14b above the gate electrode 12a. On the center of the semiconductor layer 12d, a blocking layer 12e is formed, and an ohmic layers 12f made of amorphous silicon doped with n-type impurities are formed in both sides of the blocking layer 12e. Further, a drain electrode 12b of the drive transistor 12, formed to be integral with a reference voltage line SL, is formed to be partially layered on one of the ohmic layers 12f. Meanwhile, a source electrode 12c of the drive transistor 12 is formed to be partially layered on the other ohmic layer 12f, in the opposite side. The drive transistor 12 is thus formed. The reference voltage line SL formed on the gate insulating film 14b is grounded.

An interlayer insulating film 14c made of silicon nitride is formed on the drive transistor 12 and the selection transistor 13 formed as described above, except for a portion corresponding to a contact hole 15a formed at an end portion of the source electrode 12c of the drive transistor 12. A cathode electrode 11a which reflects visible light and is made of MgIn (magnesium indium), MgAg (magnesium silver), or the like is formed, by patterning, on the interlayer insulating film 14c. The cathode electrode 11a is connected to the source electrode 12c of the drive transistor 12, through the contact hole 15a. Organic EL layers 11b, each having a light emission layer of one of three types of emitting light in red, green, and blue are provided on the cathode electrode 11a, such that organic EL layers 11b of the three types are arrayed in a matrix in a predetermined layout, on the cathode electrodes 11a. A plurality of anode electrodes 11c made of ITO (indium-tin oxide) having a high transparency for visible light are provided on the organic EL layers 11b, and the anode electrodes 11c are formed such that the anode electrodes 11c respectively extend over the pixel regions in the row direction of the matrix in correspondence with gate lines GL and such that the anode electrodes 11c each having an equal width are arranged apart from each other over the pixel regions in the line direction. In this manner, the organic EL elements 11 are formed. A capacitor Cp consisting of the reference voltage line SL, the gate insulating film 14b, and the gate electrode 12a is provided for every pixel.

Each of the organic EL layers 11b of the organic EL elements 11 for red is comprised of an electron-transmissible light emission layer formed in the side of the cathode electrode 11a and a hole-transmissible layer formed in the side of the anode electrode 11c.

An electron-transmissible light emission layer consists of Aluminum-tris(8-hydroxyquinolinate) (which will be hereinafter referred to as Alq3) as a host and 4-(dicyanomethylene)-2-methyl-6-(p-dimethylaminostyryl)-4H-pyran (which will be hereinafter referred to as DCM-1) as a guest dispersed in the host.

Alq3 is represented as follows.

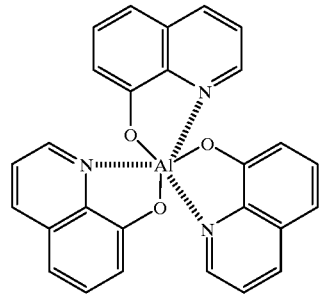

DCM-1 is represented as follows.

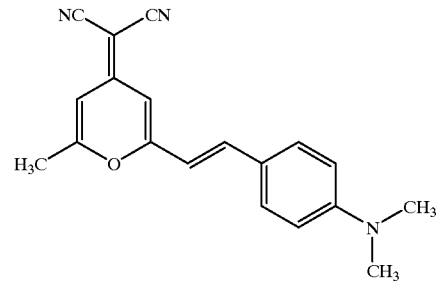

A hole-transmissible layer is made of N,N'-di(α-naphthyl)-N,N'-diphenyl-1,1'-biphenyl-4,4'-diamine (which will be hereinafter referred to as α-NPD).

α-NPD is represented as follows.

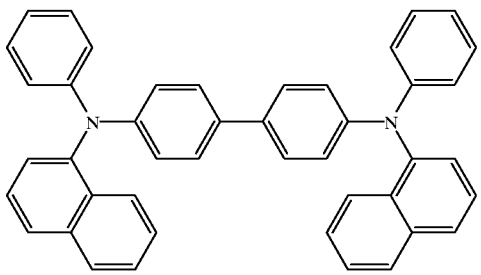

The electron-transmissible light emission layer includes a re-coupling region for re-coupling an electron and a hole. If no other light emission material is contained other than Alq3 used, an energy caused by re-coupling of an electron and a hole is absorbed, and green light is generated by Alq3. However, since DCM-1 is dispersed in the layer, DCM-1 absorbs the energy caused by re-coupling of an electron and a hole, emitting red light.

Each of the organic EL layers 11b of the organic EL elements 11 for green consists of an electron-transmissible light emission layer formed in the side of the cathode electrode 11a and the hole-transmissible layer formed in the side of the anode electrode 11c.

The electron-transmissible light emission layer is made of beryllium-bis(10-hydroxybenzo[h]quinolinate (which will be hereinafter referred to as Bebq2) represented by the following composition.

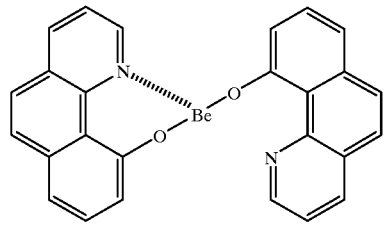

The positive-hole-transmissible layer is made of the same α-NPD as that in the hole-transmissible layers of the organic EL layers 11b for red.

In the organic EL elements 11 for green, an energy caused by re-coupling of an electron and a hole is absorbed by Bebq2 of the electron-transmissible light emission layer, thereby emitting green light.

Each of the organic EL layers 11b of the organic EL elements 11 for blue includes an electron-transmissible layer formed in the side of the cathode electrode 11a, a hole-transmissible layer formed in the side of the anode electrode 11c, and a light emission layer formed between the electron-transmissible layer and the hole-transmissible layer.

The electron-transmissible layer is made of Alq3 used for the electron-transmissible light emission layers of the organic EL elements 11b for red.

The hole-transmissible layer is made of the same α-NPD as that in the hole-transmissible layers of the organic EL elements 11b for red and green.

The light emission layer consists of 96 weight % of 4,4'-Bis(2,2-diphenylvinylene)biphenyl (which will be hereinafter referred to as DPVBi) and 4 weight % of 4,4'-Bis ((2-carbazole)vinylene)biphenyl (which will be hereinafter referred to as BCzVBi).

DPVBi is represented as follows.

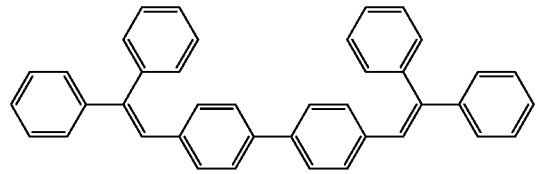

BCzVBi is represented as follows.

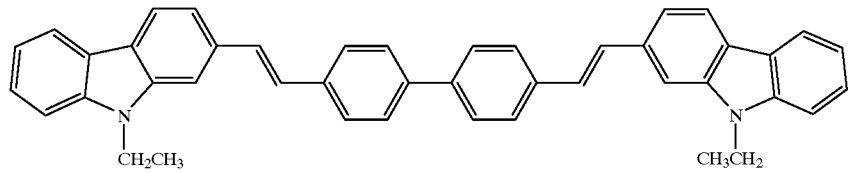

In the organic EL layers 11b of the organic EL elements 11 for blue, a re-coupling region of an electron and a hole is a light emission layer consisting of DPVBi and BCzBi. An energy caused by re-coupling of an electron and a hole in the light emission layer is absorbed by DPVBi and BCzBi, thereby emitting blue light.

Figure 5:
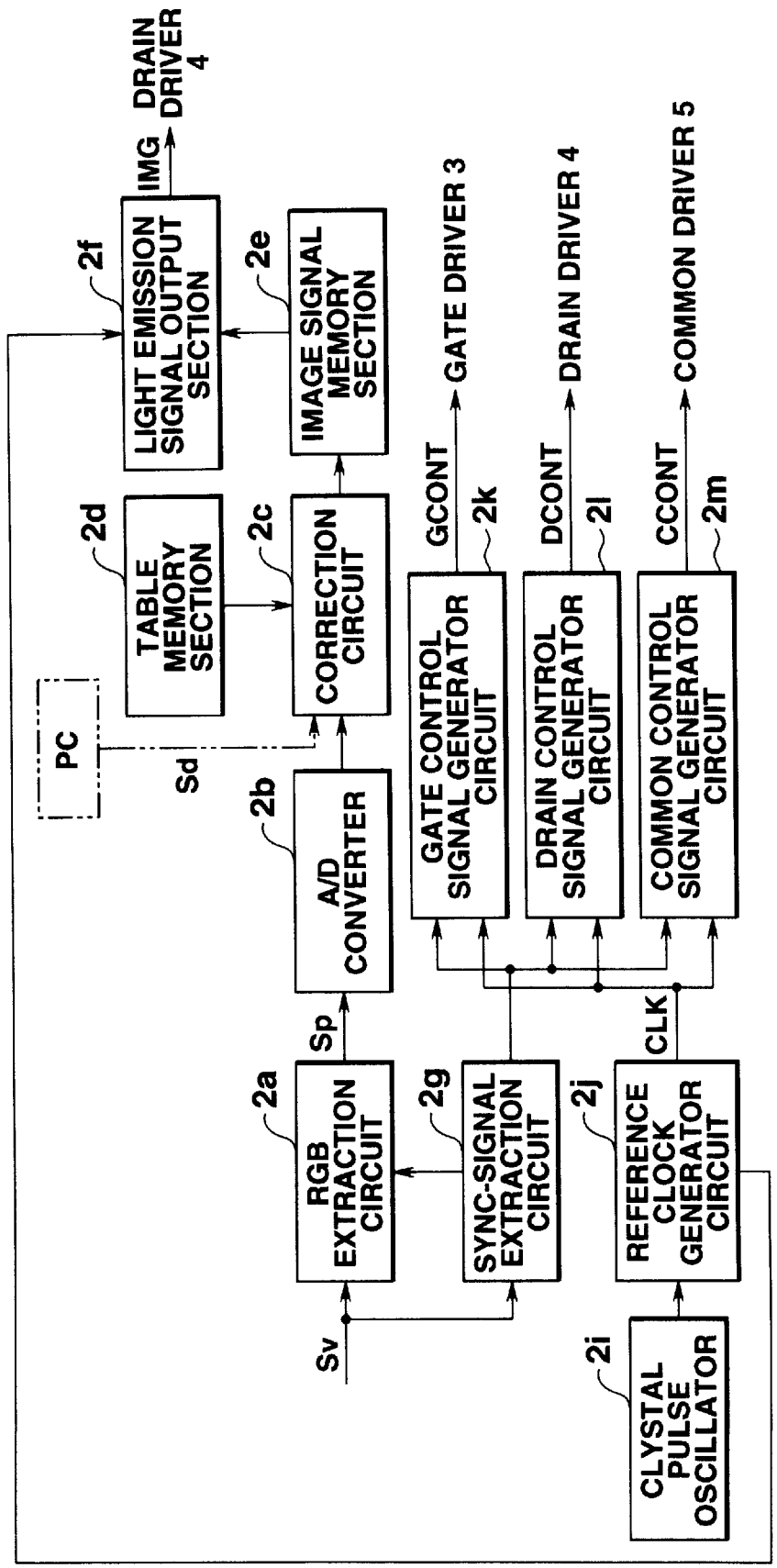
FIG. 5 is a block diagram showing a structure of a controller of the organic EL display apparatus shown in FIG. 1.

FIG. 5 is a block diagram showing the structure of the controller 2 shown in FIG. 1.

As shown in the figure, the controller 2 comprises an RGB extraction circuit 2a, an A/D converter 2b, a correction circuit 2c, a table memory section 2d, an image signal memory section 2e, a light emission signal output section 2f, a synchronization signal extraction circuit 2g, a crystal pulse oscillator 2i, a reference clock generator circuit 2j, a gate control signal generator circuit 2k, a drain control signal generator circuit 2l, and a common control signal generator circuit 2m.

Video signals Sv supplied from outside are inputted to the RGB extraction circuit 2a and the synchronization signal extraction circuit 2g. The synchronization signal extraction circuit 2g extracts horizontal and vertical synchronization signals from the video signals Sv. The RGB extraction circuit 2a extracts image signals Sp of red (R), green (G), and blue (B) from luminance signals and color difference signals in the video signals Sv, in a predetermined order, on the basis of horizontal and vertical synchronization signals extracted by the synchronization signal extraction circuit 2g. The reference clock generator circuit 21 generates a reference clock signal CLK for measuring one horizontal period of one sub-frame, on the basis of a system clock generated by the crystal pulse generator 21.

The image signal memory section 2e temporarily stores an image signal Sp which has been subjected to A/D conversion by the A/D converter 2b and corrected by the correction circuit 2c. The image signal Sp stored in the image signal memory section 2e is a signal represented as a binary value of four figures. Among image signals Sp for one frame equivalent to one image, those components for a first sub-frame equivalent to first figures of first to Nth rows are read into the light emission signal output section 2f, for every row, in an order from the first row to the Nth row on the basis of the timings generated by the reference clock generator circuit 2j. Subsequently, those components for a second sub-frame equivalent to the second figures of the first to Nth rows of the image signals Sp are read into the light emission signal output section 2f, for every row, in an order from the first row to the Nth row. Finally, those components for a fourth sub-frame equivalent to the fourth figures of the image signals Sp of the first to Nth rows are read, for every row of the first to Nth rows, and thus, image signals Sp for one frame are read. The larger the value of the image signal SP, the brighter an image of the corresponding pixel is. Specifically, in the organic EL display apparatus, the gradation is divided into sixteen gradation levels of 0 to 15. As the gradation level increases from 0 to 15, the display changes from dark to bright.

The light emission signal output section 2f determines whether or not the organic EL elements 11 of the pixels should be illuminated, for every sub-frame, in accordance with the image signals Sp stored in the image signal memory section 2e, and outputs a light emission signal IMG for every row, at a predetermined timing, on the basis of a reference clock supplied from the reference clock generator circuit 2j. Specifically, if a figure corresponding to a sub-frame of the pixel of the image signal Sp is "0", the light emission signal IMG is an OFF signal. If the figure is "1", the light emission signal IMG is outputted as an ON signal to the drain driver 4.

Table 1 shows a relationship between the gradation determined by the light emission signal output section 2f and sub-frames.

A light emission signal IMG outputted from the light emission signal output section 2f is supplied to the drain driver 4.

The gate control signal generator circuit 2k generates a gate control signal GCONT on the basis of horizontal and vertical synchronization signals extracted by the synchronization signal extraction circuit 2g, and a reference clock generated by the reference clock generator circuit 2j. The gate control signal GCONT generated by the gate control signal generator circuit 2k is supplied to the gate driver 3.

The drain control signal generator circuit 21 generates a drain control signal DCONT on the basis of horizontal and vertical synchronization signals extracted by the synchronization signal extraction circuit 2g, and a reference clock generated by the reference clock generator circuit 2j. The gate control signal GCONT includes a start signal described later, a switch signal, and an output enable signal. The drain control signal DCONT generated by the drain control signal generator circuit 2k is supplied to the drain driver 4.

The common control signal generator circuit 2m generates a common control signal CCONT, on the basis of horizontal and vertical synchronization signals extracted by the synchronization signal extraction circuit 2g. The common control signal CCONT generated by the common control signal generator circuit 2m is supplied to the common driver 5.

The gate driver 3 shown in FIG. 1 outputs selection signals $X_1$ to $X_N$ in accordance with the gate control signal GCONT supplied from the gate control signal generator circuit 2k. Any one of the selection signals $X_1$ to $X_N$ is active at one same timing, so that any one of gate lines GL of the organic EL panel 1 is selected. In this manner, the signals $X_1$ to $X_N$ are applied to the gate of the selection transistor 13 connected to the selected gate line GL, and the selection transistor 13 is turned on.

Figure 7:
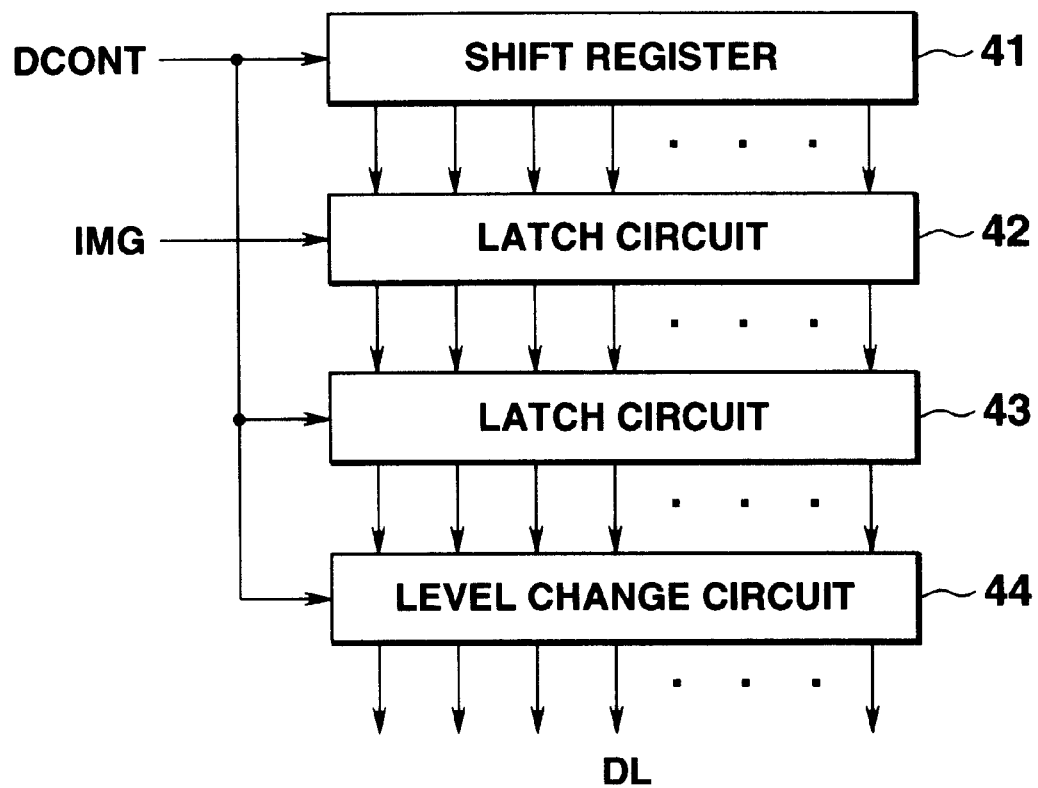
FIG. 7 is a block diagram showing a structure of a drain driver of the organic EL display apparatus shown in FIG. 1.

The drain driver 4 comprises a shift register 41, latch circuits 42 and 43, and a level change circuit 44, as shown in FIG. 7.

In the shift register 41, "1" (of a high level) is set in the first bit, by a start signal included in the drain control signal DCONT supplied from the drain control signal generator circuit 21, and is shifted by one bit every time when a shift signal included in the drain control signal DCONT is supplied.

The latch circuit 42 includes of latch sub-circuits corresponding in number to the number of bits of the shift register 41, and latches a light emission signal IMG supplied from the light emission signal output section 2f, into the latch circuit of the shift register 41 which corresponds to the bit of "1".

When light emission signals IMG for a gate line GL1 in one sub-frame are latched by the latch circuit 42, the light

TABLE 1

| | | ON/OFF OF SELECTION LIGHT EMISSION | | | |
|---|---|---|---|---|---|
| GRADATION | BINARY VALUE | FOURTH SUB-FRAME | THIRD SUB-FRAME | SECOND SUB-FRAME | FIRST SUB-FRAME |
| 0 | 0000 | on | off | off | off |
| 1 | 0001 | off | off | off | on |
| 2 | 0010 | off | off | on | off |
| 3 | 0011 | off | off | on | on |
| 4 | 0100 | off | on | off | off |
| 5 | 0101 | off | on | off | on |
| 6 | 0110 | off | on | on | off |
| 7 | 0111 | off | on | on | on |
| 8 | 1000 | on | off | off | off |
| 9 | 1001 | on | off | off | on |
| 10 | 1010 | on | off | on | off |
| 11 | 1011 | on | off | on | on |
| 12 | 1100 | on | on | off | off |
| 13 | 1101 | on | on | off | on |
| 14 | 1110 | on | on | on | off |
| 15 | 1111 | on | on | on | on | emission signals IMG are latched by the latch circuit 43 in the next stage, in accordance with a switch signal in the drain control signal DCONT. Further, the latch circuit 42 latches light emission signals IMG for the next line.

A level change circuit 44 outputs drive signals $Y_1$ to $Y_M$ having a predetermined voltage level to the drain lines DL of the organic EL panel 1, in correspondence with the light emission signals IMG latched by the latch circuit 43, on the basis of an output enable signal in the drain control signal DCONT. The drive signals Y1 to YM outputted from the level change circuit 44 are stored in the gate 12a of the drive transistor 12, so that the drive transistor 12 is turned on.

The common driver 5 shown in FIG. 1 generates common signals $Z_{1\ to\ ZN}$ to be applied to the anode electrodes 11c of the organic EL elements 11, on the basis of the common control signal CCONT supplied from the common control signal generator circuit 2m. These common signals are applied to the anode electrodes 11c of the organic EL elements 11, for every row, through the common lines CL. The luminance ratio between the sub-frames of the organic EL elements 11 selected by voltages Vdd1, Vdd2, Vdd4, and Vdd8 applied to first to fourth sub-frames, respectively, is 1:2:4:8. Vdd1 having the lowest voltage level is set to a voltage with which the source-drain voltage Vsd of the drive transistor 12 exceeds 3(V) when the gate voltage Vg of the drive transistor 12 is set to 15(V), and Vdd1 is preferably close to Vth shown in FIG. 2. The voltage Vdd8 applied to the anode electrode 11c in the fourth sub-frame to which the voltage of the highest level is applied is preferably close to (Vth+Vx). Supposing that one frame period (for which one image is kept displayed) is 16.7 ms, the one frame period is divided into four sub-frame periods (for first to fourth sub-frames). Each of sub-frame writing periods $T_W1$ to $T_W4$ is 4.2 ms. Each of the sub-frame periods $T_E1$ to $T_E4$ is substantially 4.2 ms. Each of the sub-frame light emission periods $T_E1$ to $T_E4$ is substantially 8.2 ms. A substantial light emission period in a sub-frame period of the organic EL elements 11 in each row is a period for which a sub-frame voltage Vdd is applied, and is substantially equal to the sub-frame writing time $T_W$. Where the Nth row is a 480th row, the light emission period is substantially 4.2 ms.

In the following, explanation will be made of operation of the organic EL display apparatus in one frame period according to the present embodiment.

R, G, and B image signals Sp extracted at predetermined timings by the RGB extraction circuit 2a are subjected to digital conversion by the A/D converter 2b and to correction such as γ-correction or the like by the correction circuit 2c. Thereafter, the signals are stored in the image signal memory section 2e. The image signals Sp stored in the image signal memory section 2e are represented as binary values each consisting of four figures, as has been described before.

Gradation light emission may be achieved by directly outputting data of digital image signals Sd outputted from a personal computer PC or the like, to the correction circuit 2c, in place of using video signals Sv.

Meanwhile, the gate control signal generator circuit 2k, the drain control signal generator circuit 2l, and the common control signal generator circuit 2m respectively generate a gate control signal GCONT, a drain control signal DCONT, and a common control signal CCONT, on the basis of horizontal and vertical signals extracted by the synchronization signal extraction circuit 2g and a reference clock CLK generated by the reference clock generator circuit 2j.

In a first sub-frame, the light emission signal output section 2f sequentially reads first figures (or lowest figures) of image signals Sp for one frame, stored in the image signal memory section 2e, in accordance with the reference clock CLK generated by the reference clock generation circuit 2j, and outputs the first figures as light emission signals IMG, to the drain driver 4. At the same timing as the timing at which the light emission signals IMG are outputted from the light emission signal output section 2f, the drain control signal generator circuit 21 outputs a start signal to the drain driver 4.

In the drain driver 4, "1" is set in the first bit of the shift register 41 when the start signal is supplied to the shift register 41. Further, every time when the shift signal in the drain control signal DCONT is inputted, the shift register 41 performs bit-shifting. While the shift register 41 performs bit-shifting, the latch circuit 42 sequentially latches light emission signals IMG of the first sub-frame from the light emission signal output section 2f, in an order from the first row. The light emission signals IMG for one row of the first sub-frame, latched by the latch circuit 42, are latched by the latch circuit 43 in the second stage, by the switch signal in the drain control signal DCONT. Next, the drain driver 4 takes in light emission signals IMG for second and more rows, by the same operation as described above. When the drain driver 4 completes taking-in of the light emission signals IMG of the first sub-frame for the Nth row, the drain driver 4 sequentially takes in light emission signals IMG of the second sub-frame.

The gate driver 3 firstly outputs a selection signal $X_1$ to the gate line GL of the first row, for one period of the reference clock CLK, on the basis of the gate control signal GCONT from the gate control signal generator circuit 21. In this manner, the selection transistors 13 connected to the gate line GL of the first row are turned on. In this state, the level change circuit 44 of the drain driver 4 is supplied with an output enable signal in the drain control signal, and drive signals $Y_1$ to $Y_M$ having a predetermined voltage, according to the light emission signals IMG latched by the latch circuit 43, are outputted to the drain lines Dl of corresponding rows, from the level change circuit 44. Then, within a period in which the selection signal X1 is outputted, the drive signals $Y_1$ to $Y_M$ are written into the gates 12a of the drive transistors 12 of the first row.

The drive transistors 12 in the first row are turned on when the drive signals $Y_1$ to $Y_M$ are of a high level, and are turned off when the drive signals $Y_1$ to $Y_M$ are of a low level. Upon completion of selection of the gate line GL of the first row, the common driver 5 keeps applying a common signal $Z_1$ of a voltage level of Vdd1 (=Vth+⅛Vx) through the common line CL of the first row, until the gate driver 3 selects the gate line of the first row in a second sub-frame.

When the drive transistor 12 is turned on, the ON resistance of the drive transistor is sufficiently smaller than the resistance of the organic EL element 11, and therefore, a voltage substantially equal to the Vdd1 level is applied between the electrodes of the organic EL element 11 so that light emission is obtained with a light emission luminance 1 within the first sub-frame light emission period $T_E1$. As a result, a current corresponding to the level of the voltage flows through the organic EL layer 11b of the organic EL element 11, 50 that the selected organic EL element 11 emits light. Meanwhile, when the drive transistor 12 is turned off, the OFF resistance of the drive transistor 12 is sufficiently larger than the resistance of the organic EL element, and therefore, no voltage higher than the threshold value does not flow between the electrodes of the organic EL element 11. As a result of this, the organic EL element 11 does not emit light.

While a common signal $Z_1$ is outputted through the common line CL of the first row after the gate line GL of the first row is selected, the gate driver 2 subsequently selects the gate line GL of the second row. Then, the drive signals $Y_1$ to $Y_M$ for the second row are written into the gates 12a of the drive transistors 12, likewise. In the following, the organic EL elements 11 emit light in the same manner as described above. Further, when outputting of a common signal $Z_N$ to the common line CL of the last row (or the Nth row) is completed, the first sub-frame is completed. As described above, in the first sub-frame, those organic EL elements 11 which have image signals Sp each having "1" as a first figure emit light with a luminance 1, and those organic EL elements 11 which have image signals Sp each having "0" as a first figure do not emit light. In the first sub-frame light emission period $T_E 1$, the period for which organic EL elements 11 of each row emit light is substantially the period for which Vdd1 is applied.

Further, the second sub-frame write period $T_W 2$ is started before light emission of the Nth row ends in the first sub-frame light emission period $T_E 1$. Specifically, after the writing into the Nth row is completed in the sub-frame write period $T_W 1$, rows are sequentially selected from the first row, in the sub-frame write period $T_E 2$. Therefore, light emission of the Nth row in the first sub-frame light emission period $T_E 1$ and the light emission of the first row in the second sub-frame light emission period $T_E 2$ overlap each other on the time axis. Operation in the second sub-frame is similar to the case of the first sub-frame. However, the light emission signal output section 2f outputs second figures (or second lowest figures) stored in the image signal memory section 2e, as light emission signals IMG, in place of the first figures of the image signals Sp. In addition, the voltage level of common signals $Z_1$ to $Z_N$ outputted from the common driver 5 is set to Vdd2 (=Vth+⅓Vx), so that light emission is obtained with a luminance 2 in the second sub-frame light emission period $T_E 2$. Therefore, the organic EL elements 11 of rows are applied with a voltage Vdd2 and emit light in the second sub-frame light emission period $T_E 2$ immediately after a selection is made sequentially for every row in the second sub-frame write period $T_W 2$. Therefore, the light emission luminance of organic EL elements 11 in the second sub-frame is a luminance 2 which is as twice high as the light emission luminance of the organic EL elements 11 in the first sub-frame. In the second sub-frame light emission period $T_E 2$, the period for which the organic EL elements 11 of each row is substantially the period for which Vdd2 is applied thereto.

Therefore, in the second sub-frame, those organic EL elements 11 which have image signals each having a second figure of "1" emit light with a luminance 2, and those organic EL elements 11 which have image signals each having a second figure of "0" do not emit light.

Operation in the third sub-frame is substantially the same as that in the case of the first sub-frame. However, the light emission signal output section 2f outputs third figures (or third lowest figures) of the image signals Sp stored in the image signal memory section 2e, as light emission signals IMG, in place of the first figures of the image signals Sp. In addition, the voltage level of common signals $Z_1$ to $Z_N$ outputted from the common driver 5 is set to Vdd4 (=Vth+½Vx), so that light emission is obtained with a luminance 4 in the third sub-frame light emission period $T_E 3$. Therefore, the organic EL elements 11 of rows are applied with a voltage Vdd4 and emit light in the third sub-frame light emission period $T_E 3$ immediately after a selection is made sequentially for every row in the third sub-frame write period $T_W 3$. Therefore, the light emission luminance of organic EL elements 11 in the third sub-frame is a luminance 4 which is as four times high as the light emission luminance of the organic EL elements 11 in the first sub-frame. In the third sub-frame light emission period $T_E 3$, the period for which the organic EL elements 11 of each row is substantially the period for which Vdd4 is applied thereto.

Therefore, in the third sub-frame, those organic EL elements 11 which have image signals each having a third figure of "1" emit light with a luminance 4, and those organic EL elements 11 which have image signals each having a third figure of "0" do not emit light.

Operation in the fourth sub-frame is substantially the same as that in the case of the first sub-frame. However, the light emission signal output section 2f outputs fourth figures (or the highest figures) of the image signals Sp stored in the image signal memory section 2e, as light emission signals IMG, in place of the first figures of the image signals Sp. In addition, the voltage level of common signals $Z_1$ to $Z_N$ outputted from the common driver 5 is set to Vdd8 (=Vth+Vx), so that light emission is obtained with a luminance 8 in the fourth sub-frame light emission period $T_E 4$. Therefore, the organic EL elements 11 of rows are applied with a voltage Vdd8 and emit light in the fourth sub-frame light emission period $T_E 4$ immediately after a selection is made sequentially for every row in the fourth sub-frame write period $T_W 4$. Therefore, the light emission luminance of the organic EL elements 11 in the fourth sub-frame is a luminance 8 which is as eight times high as the light emission luminance of the organic EL elements 11 in the first sub-frame. In the fourth sub-frame light emission period $T_E 4$, the period for which the organic EL elements 11 of each row is substantially the period for which Vdd8 is applied thereto.

Therefore, in the fourth sub-frame, those organic EL elements 11 which have image signals each having a fourth figure of "1" emit light with a luminance 8, and those organic EL elements 11 which have image signals each having a fourth figure of "0" do not emit light. Although all the voltage levels Vdd1 to Vdd8 of common signals $Z_1$ to $Z_N$ have been set within a range of Vth to (Vth+Vx), the ratio of applied voltage values need not always be equal to the luminance ratio as far as the applied voltage values are arranges such that the luminance ratio of the first to fourth sub-frames is 1:2:4:8. Therefore, voltages corresponding to the luminance ratio may be applied in case of using an organic EL element which has a characteristic in which the light emission luminance and the voltage values cannot be represented by a linear function.

Figure 8:
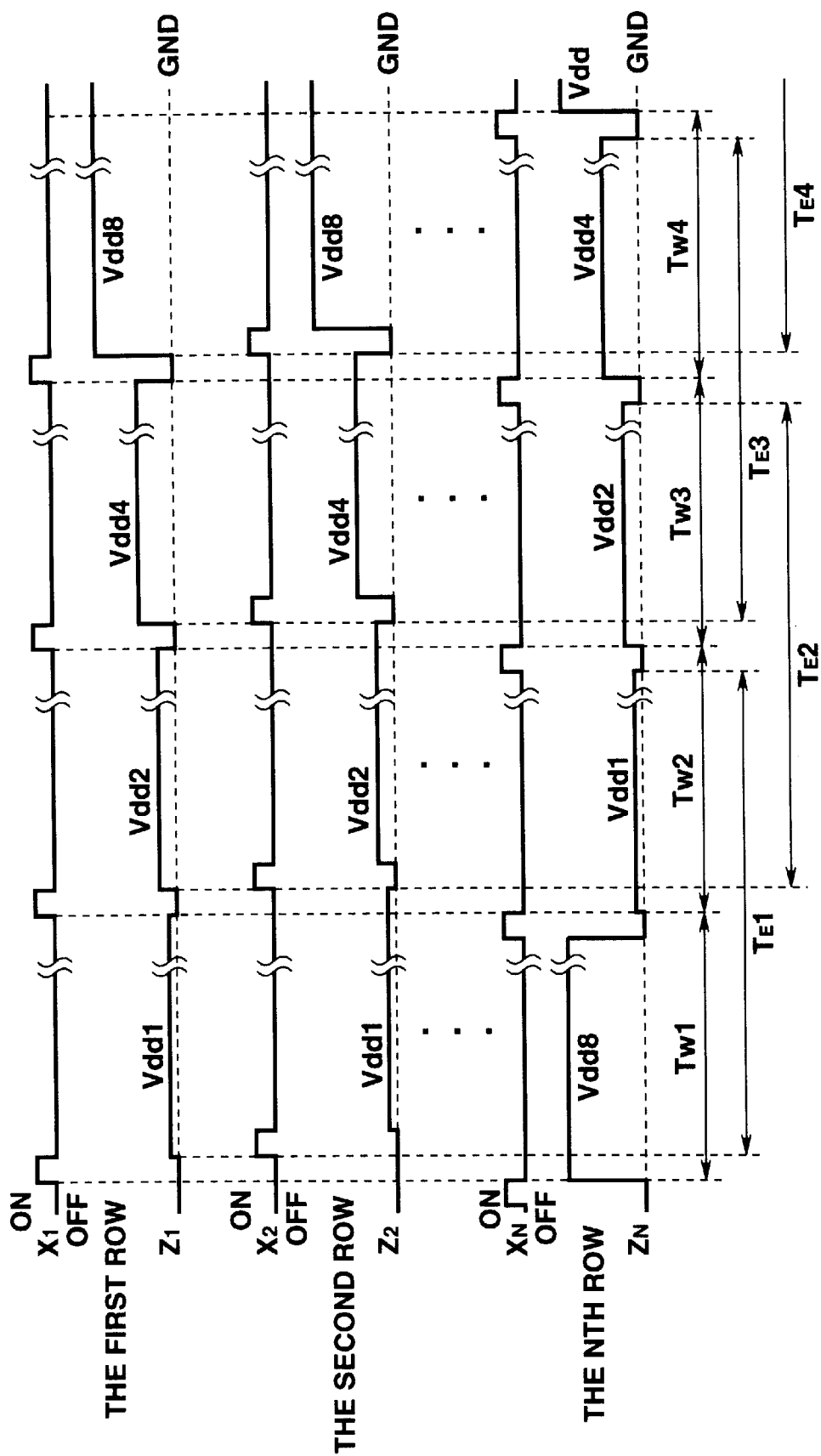
FIG. 8 is a timing chart showing drive waveforms in an organic EL display apparatus according to the present invention.

In the driving method as described above, timings of the selection signals $X_1$ to $X_N$ and common signals $Z_1$ to $Z_N$ outputted in each of sub-frame write periods are shifted for every row, as shown in FIG. 8. Therefore, the sub-frame light emission period in which selected pixels of the first row emit light and the sub-frame light emission period in which selected pixels of an Nth row emit light are shifted from each other, to be in the first half and the second half of the first sub-frame light emission period $T_E 1$, respectively. Therefore, the light emission period for which a selected pixel in an Nth row emits light bridges to a next sub-frame write period in the first to (N−1) rows. An image divided into the first to fourth sub-frames is visually synthesized as an image of one frame by an after-image phenomenon. By repeating the first to fourth sub-frames, a plurality of frame images can be displayed sequentially.

Figure 9:
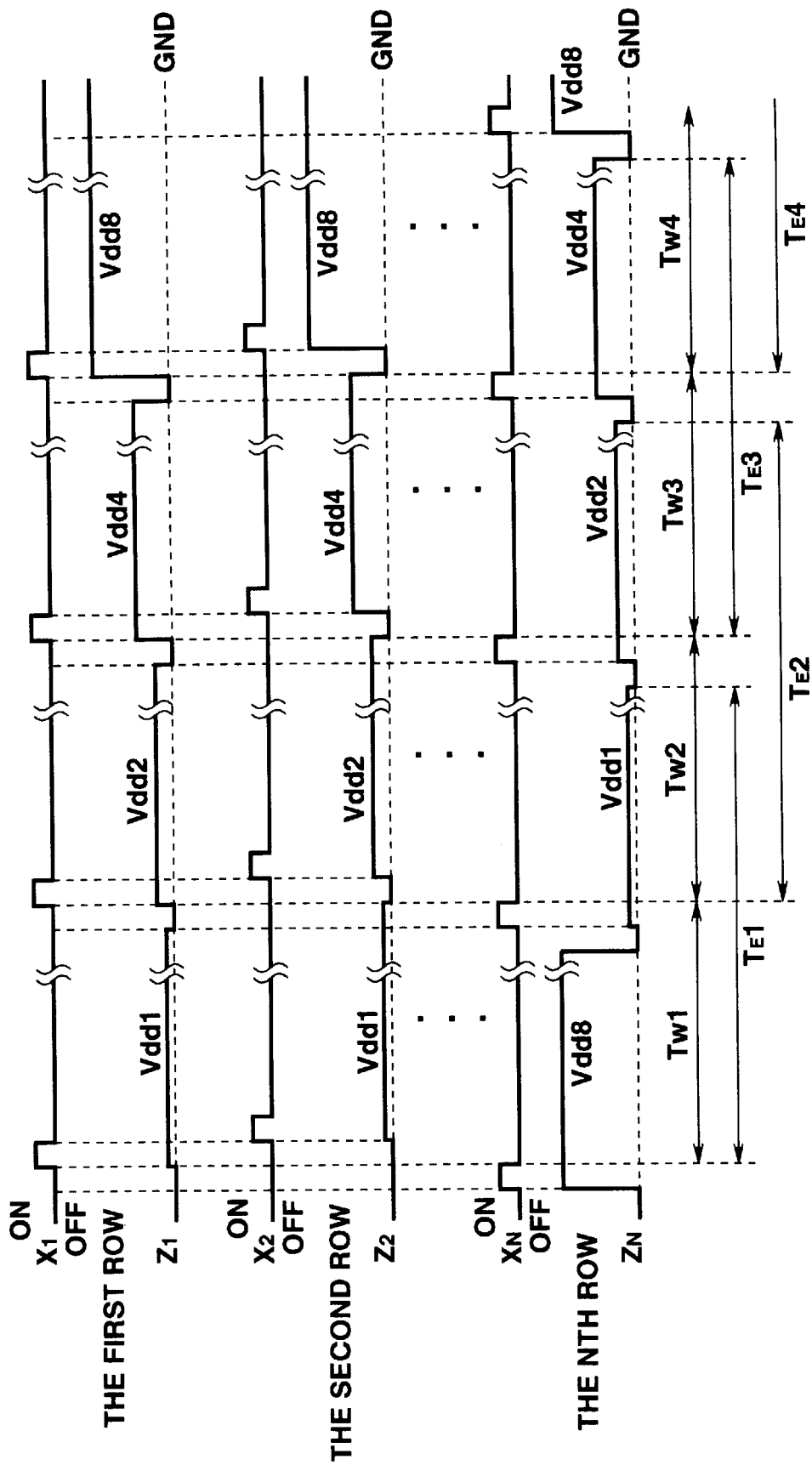
FIG. 9 is a timing chart showing other drive waveforms in the organic EL display apparatus according to the present invention.

In this case, the total of the luminance of the organic EL element 11 which has a gradation value of 15 in one frame is 15. The total of the luminance of the organic EL element 11 which has a gradation value of 0 in one frame is 0. The total of the luminance of the organic EL element 11 which has an intermediate gradation value in one frame is a value corresponding to the intermediate gradation value. As a result of this, each of the organic EL elements 11 visually appears as if it emits light with a brightness corresponding to a gradation value in one frame. In addition, light emitted from three types of organic EL elements 11 of R, G, and B is visually synthesized so that it appears as if a full-color image is displayed on the organic EL panel 1. In FIG. 8, a common signal Za is outputted immediately after a selection signal Xa (where a is an integer which satisfy a relation of $1 \leq a \leq N$). A common signal Za may be outputted in synchronization with the selection signal Xa or at a timing partially or perfectly overlapping the selection signal Xa in FIG. 9.

As has been described above, in the organic EL display apparatus according to the present embodiment, the driver transistors 12 are used as binary ON/OFF switches so that drain currents Isd are saturated, and the voltage applied to the anode electrodes 11c connected to the common driver 5 is controlled, thereby to achieve gradation display. Therefore, even if the characteristics of the drive transistors 12 and/or selection transistors 13 vary, the light amount emitted from the organic El element 11 of each of the pixels to the side of the anode electrode 11c can be maintained to be constant in one same gradation. Accordingly, the organic EL display apparatus attains a displayed image with high quality. Besides, there is no difference in display performance between a plurality of organic EL panels manufactured through manufacturing steps. Since light-reflective cathodes 11a, light emission layers 11b, and transparent anode electrodes 11c are provided above transistors 12 and 13, as shown in FIGS. 3 and 4, transistors do not limit pixel regions, but it is possible to realize a display apparatus which has pixels each attaining a light emission area at a very high ratio. In addition, light emission from the light emission layers 11b is shielded by cathode electrodes 11a, so that semiconductor layers of transistors 12 and 13 are prevented from being optically excited to cause an operation error.

In the above embodiment, the common driver 5 outputs common signals $Z_1$ to $Z_N$, after the gate driver 3 selects a gate line GL in one sub-frame and drive signals $Y_1$ to $Y_M$ are written from the drain driver 4 until the gate driver 3 selects the same gate line GL in a next sub-frame. That is, the light emission period of organic EL elements in each sub-frame is substantially close to one sub-frame period. As a result of this, it is possible to efficiently display images.

In addition, in the organic EL display apparatus according to the present embodiment, the anode electrodes of organic EL elements 11 in each row are formed in common in each row, and light emission of the organic EL elements 11 is started and stopped for every row, by the common signals $Z_1$ to $Z_N$ from the common driver 5. Therefore, in comparison with a method used for a plasma display panel or the like, in which all pixels are lightened at once in one sub-frame, variations of transmission delays are reduced so that the entire organic El panel 1 can emit light uniformly. A material such as ITO or the like having a high resistance value must be selected for the anode electrodes of the organic EL elements, from the view point of light transparency. Therefore, a conventional anode electrode results in partial variations in luminance since the sheet resistance of a conventional anode electrode partially varies even though a conventional anode electrode can be entirely made of one sheet. In contrast, in the display apparatus according to the present embodiment, anode electrodes 11c are formed in common for every row, so that the common voltage varies less than in a conventional anode electrode. Therefore, the organic EL elements 11 are capable of emitting light of a substantially equal brightness.

In addition, the present embodiment cites an example of an organic EL display apparatus which uses organic EL elements 11 having an excellent response characteristic, as light emission elements. Since the organic EL elements 11 have an excellent response characteristic, a sufficient light amount can be obtained even if one frame is divided into sub-frames and the period for which the organic EL elements 11 are applied with a voltage is shortened. Specifically, the present invention is preferably applied to an organic EL display apparatus.

In the embodiment described above, each pixel of the organic EL panel 1 comprises the organic EL element 11, the drive transistor 12 made of a TFT, the selection transistor 13, and the capacitor Cp. However, the structure of each pixel of the organic EL panel is not limited hitherto, but a switching element such as an MIM or the like may be used as a selection transistor and/or a drive transistor.

In addition, in the present embodiment, the drive transistor 12 and the organic EL element 11 are connected in series, and one of the anode and the cathode is connected to the common line CL while the other is grounded to a ground line. However, a fixed line set to a positive or negative potential may be used in place of a ground line, and the minimum value of the gradation voltage other than 0, applied to a common line CL, may be set to a potential which is higher in the positive side of the potential of the fixed line and which is shifted by an absolute value or more of Vth in FIG. 2.

Figure 6:
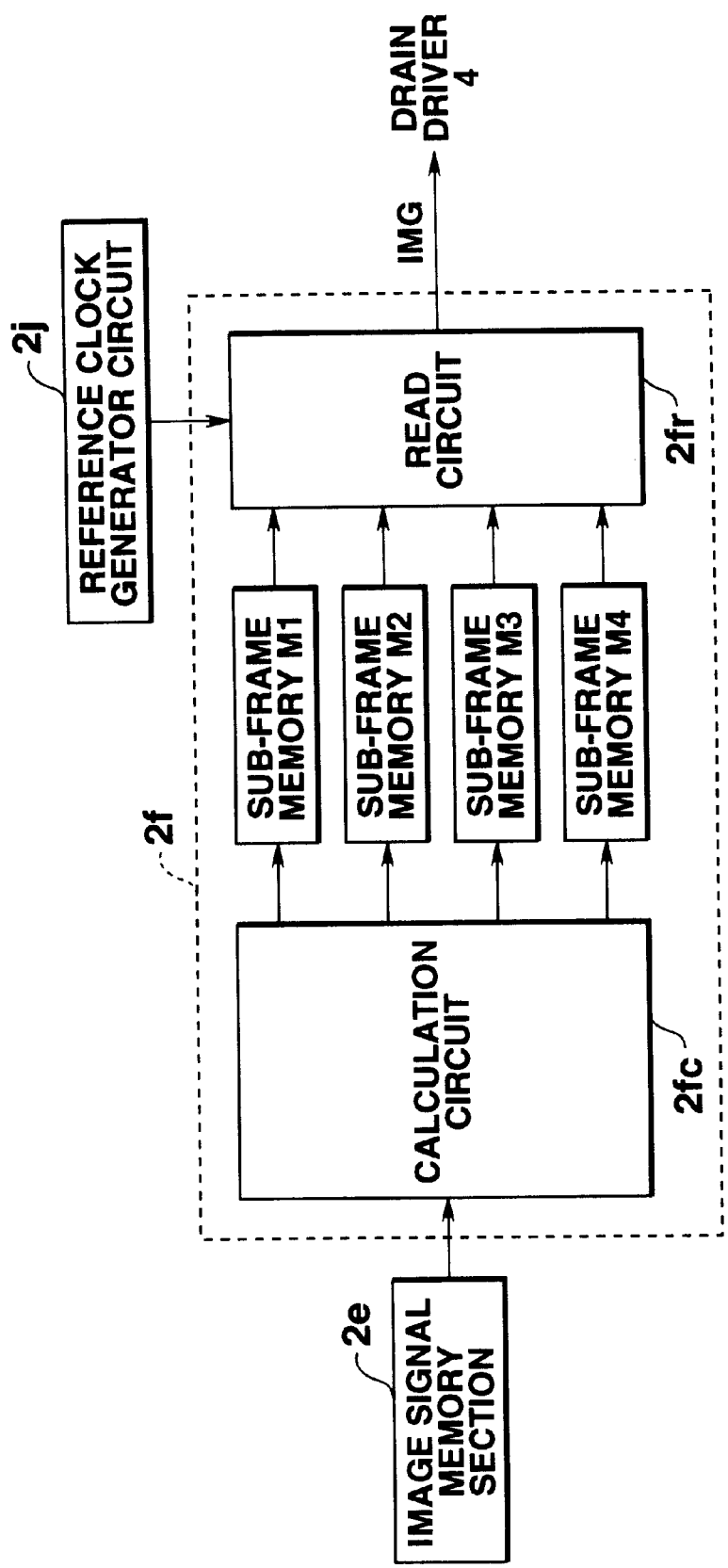
FIG. 6 is a block diagram showing a structure of a part of a controller of the organic EL display apparatus shown in FIG. 1.

In the present embodiment, those signals for a first sub-frame corresponding to first figures of a first row to an Nth row among image signals Sp for one frame stored in the image signal memory section 2e are read into the light emission signal output section 2f, for every row, in an order from the first row to the Nth row, on the basis of the timings of the reference clock generator circuit 2j. Subsequently, those signals for a second sub-frame corresponding to second figures of the first row to the Nth row among the image signals Sp are read for every row. Finally, those signals for a fourth sub-frame corresponding to fourth figures of the first row to the Nth row among the image signals Sp are read for every row. Data for one frame is thus set such that image signals Sp are read. The light emission signal output section 2f outputs an ON/OFF signal for every sub-frame of every row, in correspondence with the image signals Sp subsequently read by the light emission signal output section 2f, on the basis of the reference clock generator circuit. In this respect, it is possible to make the following arrangement, as shown in FIG. 6. Specifically, the image signal memory section 2e outputs image signals Sp for one frame, each consisting of four figures, to a calculation circuit 2fc of the light emission signal output section 2f, for every row or every one frame, and the figures corresponding to first to fourth sub-frames are respectively divided and distributed to sub-frame memories M1, M2, M3, and M4. Data thus divided are outputted to a read circuit 2fr, and light emission signals corresponding to sub-frames of every row are sequentially outputted to the drain driver, on the basis of the reference clock of the reference clock generator circuit 2j.

In addition, in the present embodiment, the drive transistor 12 is connected to the cathode electrode 11a of the organic EL element 11. However, the drive transistor 12 may be connected to the anode electrode 11c of the organic EL element 11.

Figure 17:
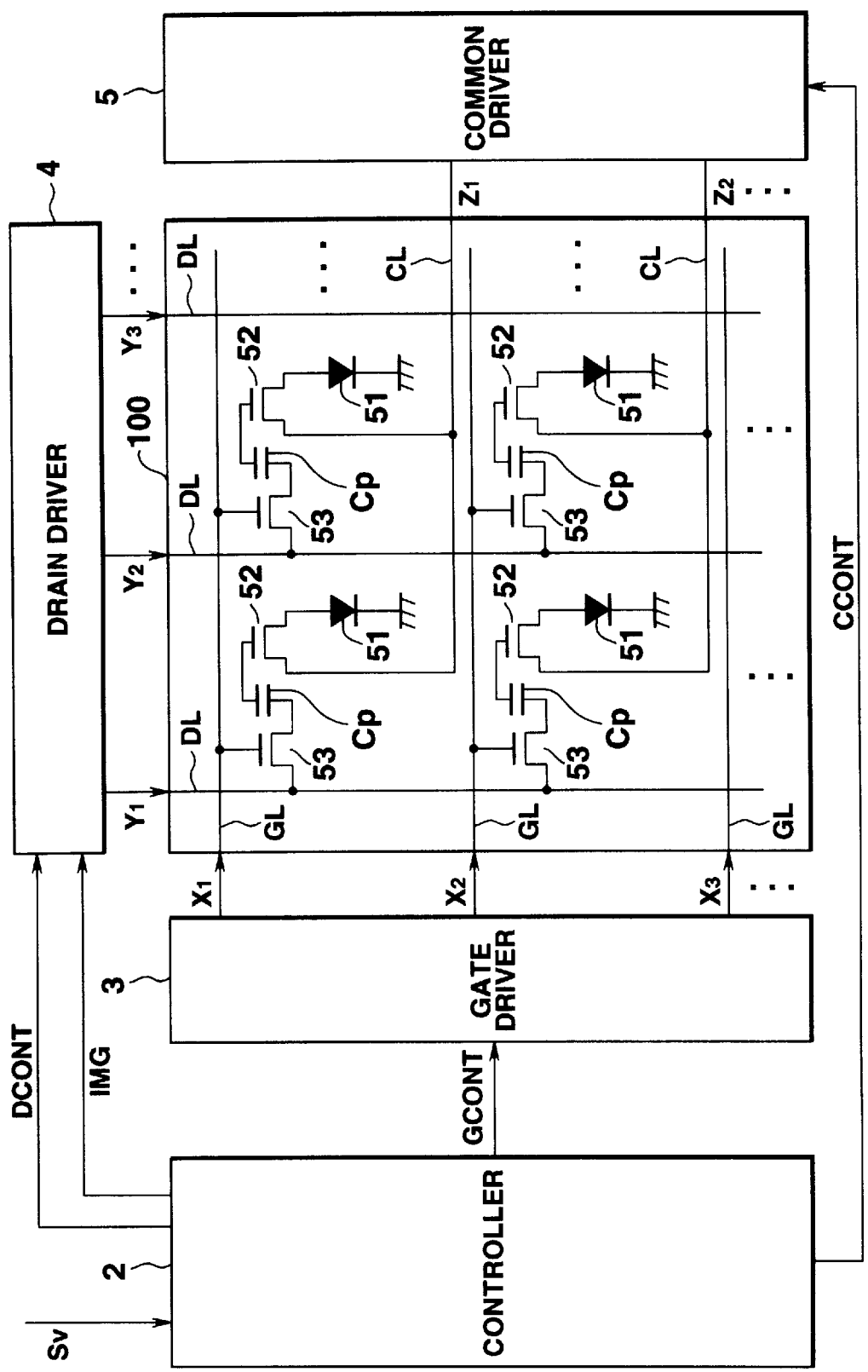
FIG. 17 is a circuit diagram showing a structure of an organic EL display apparatus according to second and sixth embodiments of the present invention.
Figure 18:
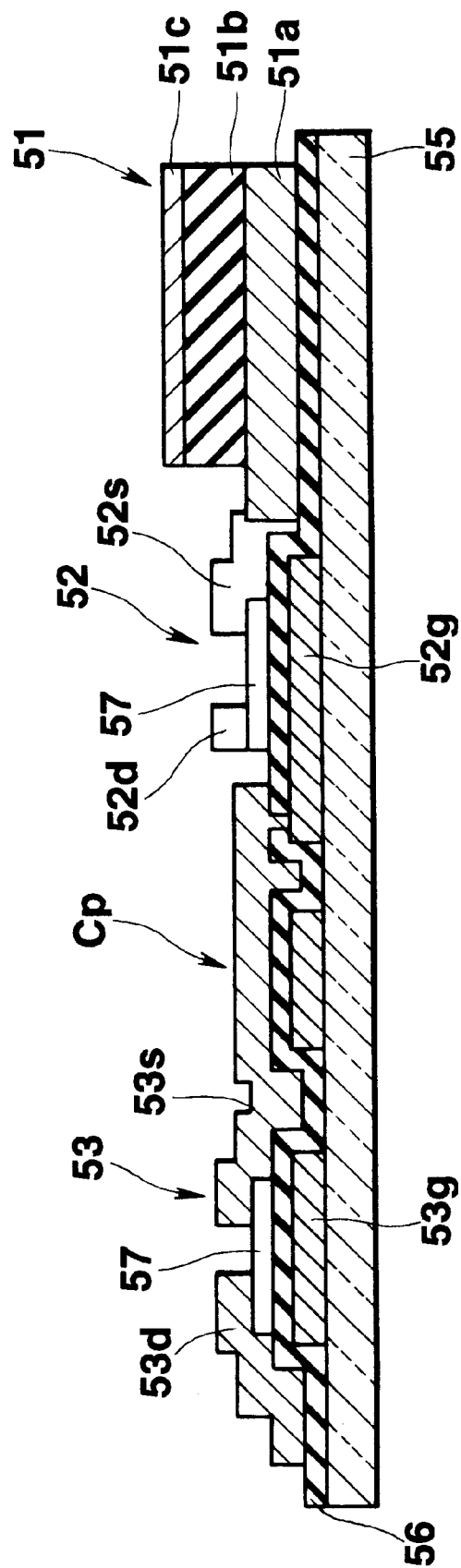
FIG. 18 is a cross-sectional view showing a part of a structure of the organic EL panel shown in FIG. 17.

In the following, an organic EL display apparatus according to a second embodiment of the present invention will be explained. The structure of the organic EL display apparatus having an organic EL panel is shown in FIG. 17. FIG. 18 is a cross-sectional view showing a structure corresponding to one pixel of the organic EL panel shown in FIG. 17.

As shown in the figures, one pixel the organic EL panel according to the present embodiment includes an organic EL element 51, a drive transistor 52, a selection transistor 53, and a data maintain capacitor Cp.

The selection transistor 53 includes a gate electrode 53g connected to a gate line GL, a gate insulating film 56 provided on the gate electrode 53g, a semiconductor layer 57 provided on the gate insulating film 56, a drain electrode 53d connected to a drain line DL, and a source electrode 53s.

The drive transistor 52 includes a gate electrode 52g connected to the source electrode 53s of the selection transistor 53, a gate insulating film 56 provided on the gate electrode 52g, a semiconductor layer 57 provided on the gate insulating film 56, a drain electrode 52d, and a source electrode 52s.

The drain electrodes 52d of the drive transistors 52 are connected to a common driver 5 through a common line CL, for every row, and the source electrode 52s is connected to the anode electrode 51a of the organic EL element 51.

Further, drive signals $Y_1$ to $Y_M$ from a drain driver 4 are maintained in data maintain capacitors Cp.

In addition, in each pixel on a substrate 55 in the organic EL panel, an organic EL element 51 is formed at a portion where the drive transistor 52, the selection transistor 53, or the data maintain capacitor Cp is not formed.

The organic EL element 51 includes an anode electrode 51a made of ITO, an organic EL layer 51b, and a cathode electrode 51c made of light-reflective metal having a low work function. The anode electrode 51a is not formed as one of those which are common to each row as in the organic EL panel in the embodiment described above, but is formed independently for every organic EL element 51. All the cathode electrodes 51c are grounded.

Figure 10:
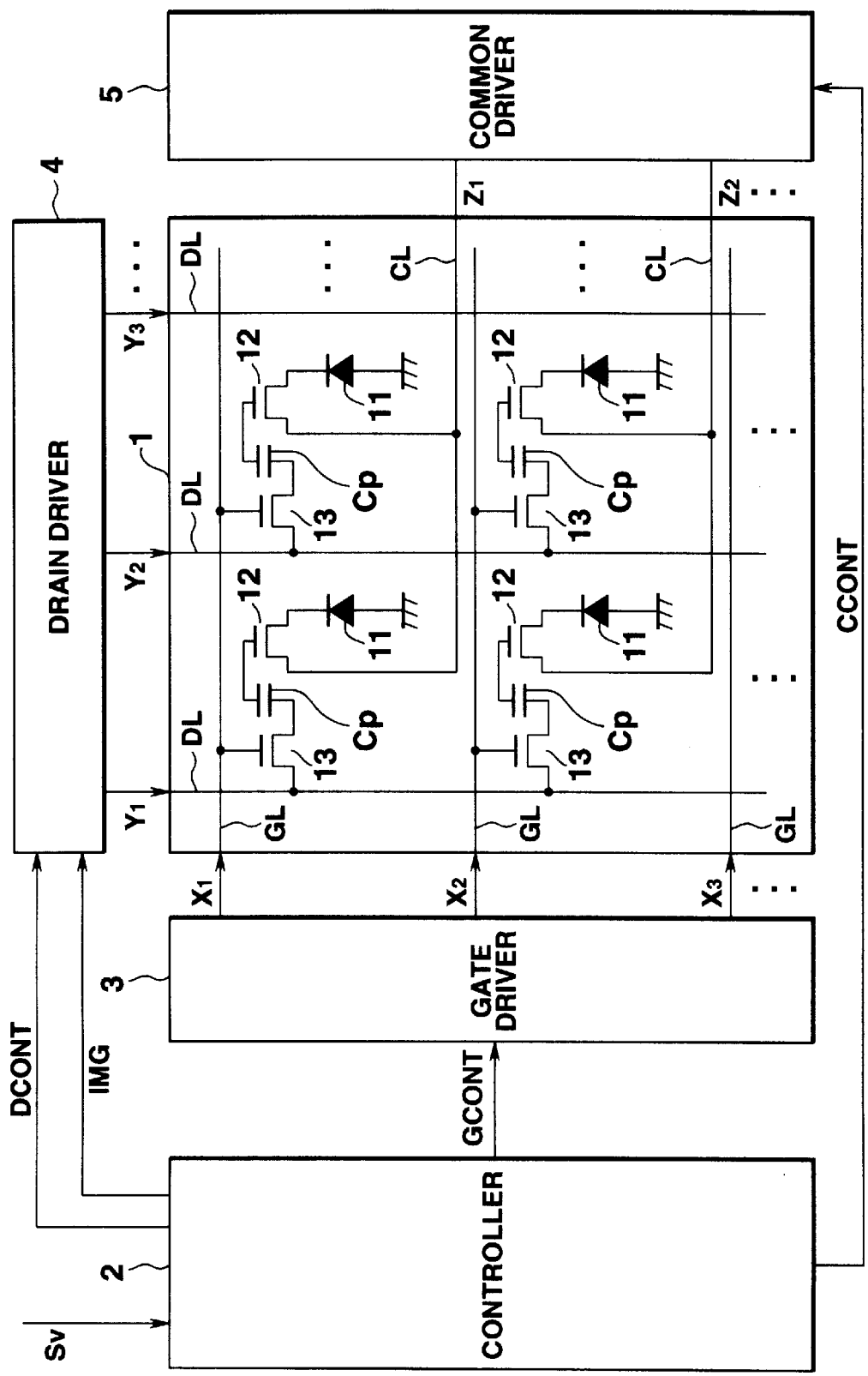
FIG. 10 is a circuit configuration of an equivalent circuit of an organic EL panel used in an organic EL display apparatus according to a third embodiment of the present invention.
Figure 11:
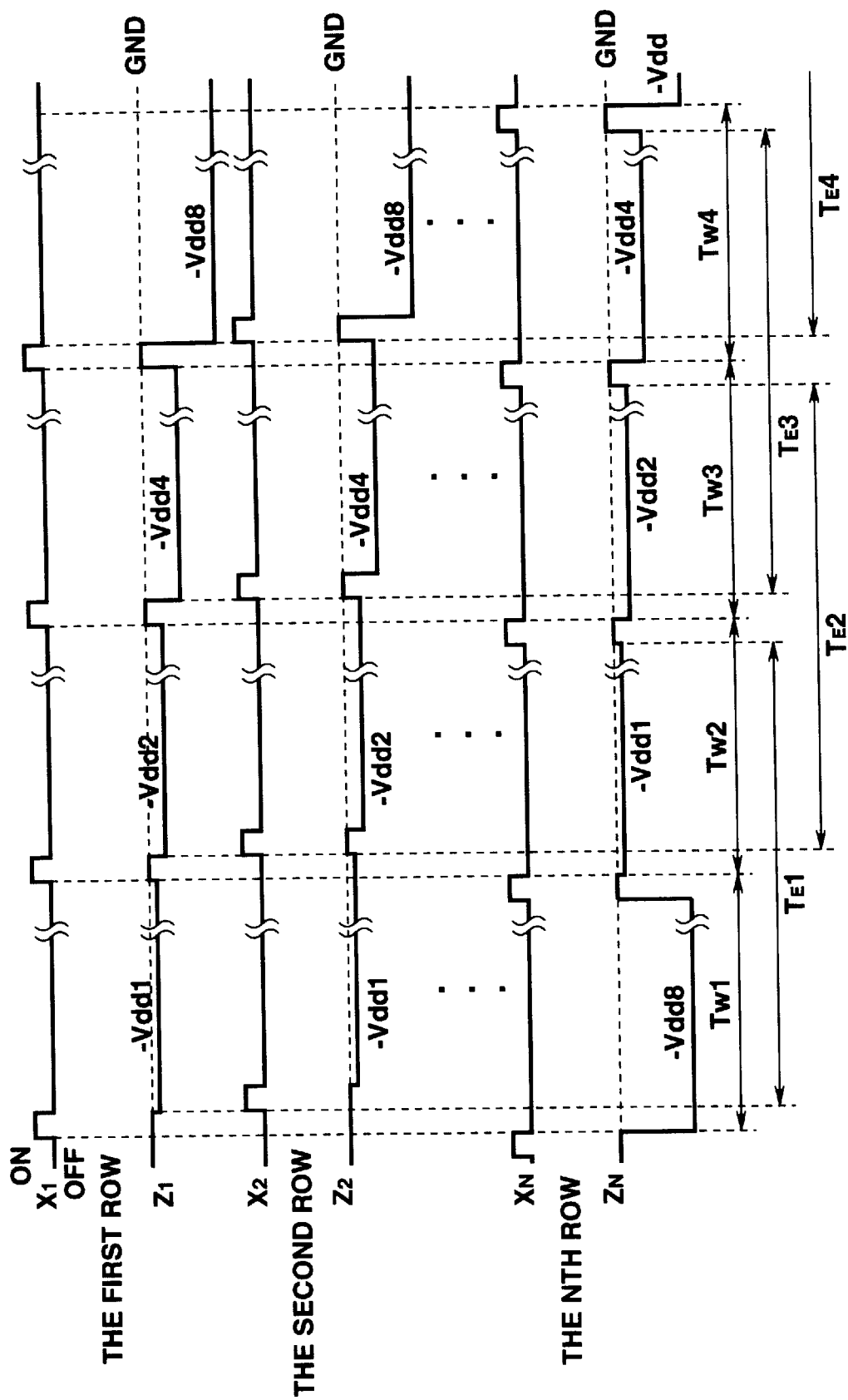
FIG. 11 is a timing chart showing drive waveforms in an organic EL display apparatus according to a third embodiment of the present invention.

FIG. 10 shows a circuit configuration of an equivalent circuit of one pixel in an organic EL panel used in an organic EL display apparatus according to a third embodiment. FIG. 11 is a timing chart showing operation in the organic EL display apparatus according to the third embodiment.

In each organic EL element 11, an anode electrode is grounded, and a cathode electrode is connected to a source of a drive transistor 12. Drains of drive transistors 12 in a predetermined row are connected in common to a common line CL. A common driver 5 selectively applies any one of −Vdd1, −Vdd2, −Vdd4, and −Vdd8 in correspondence with sub-frame periods, as shown in FIG. 11.

In the present embodiment, the drive transistor 12 and the organic El element 11 are connected in series with each other, and one of an anode and a cathode is grounded while the other is connected to the common line CL. However, a fixed line set to a positive or negative potential may be used in place of a ground line, and the minimum value of the gradation voltage other than 0, applied to the common line CL, may be set to a potential which is higher in the positive side of the potential of the fixed line and which is shifted by an absolute value or more of Vth in FIG. 2.

Figure 12:
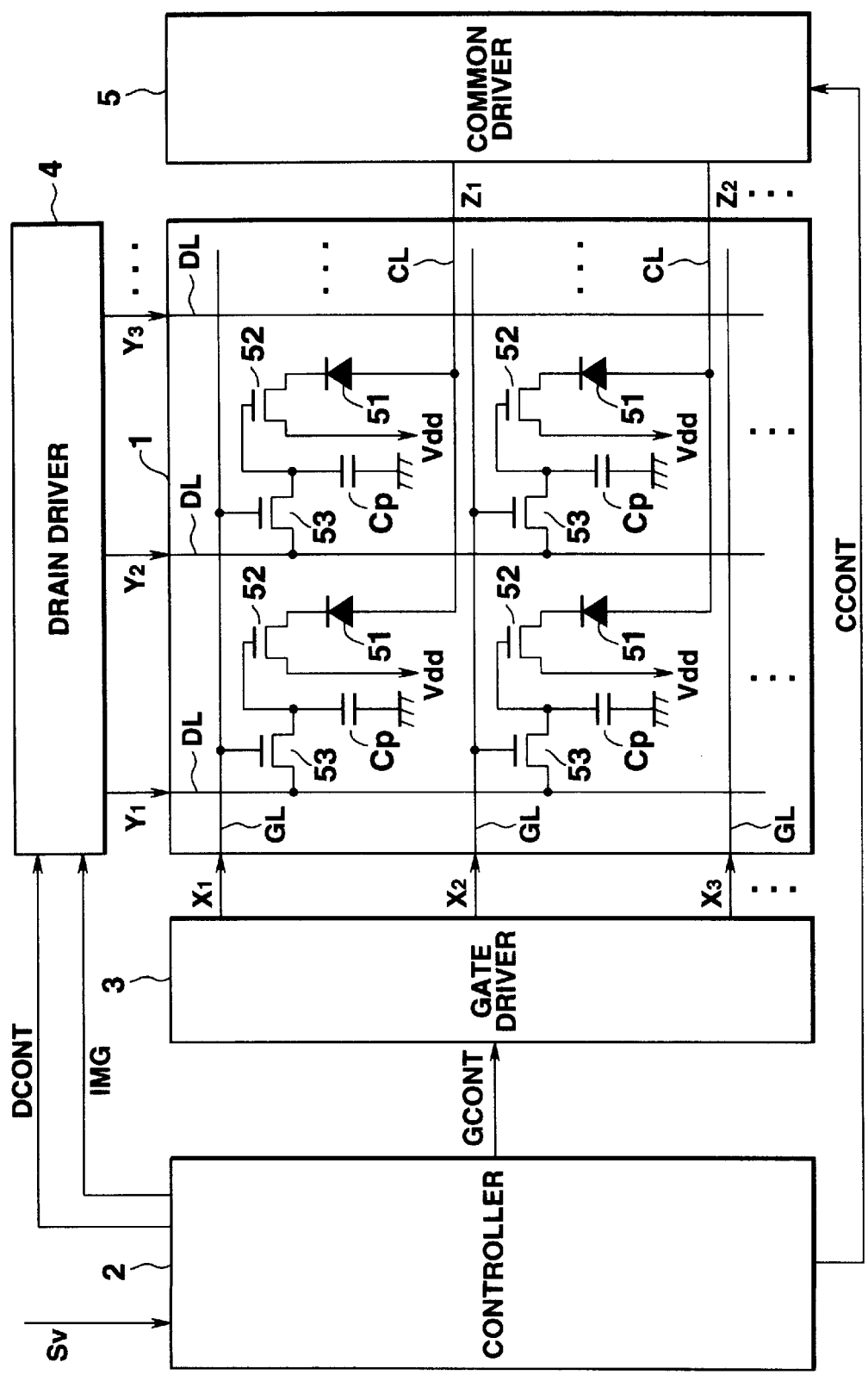
FIG. 12 is a circuit diagram showing a structure of an organic EL display apparatus according to a fourth embodiment of the present invention.
Figure 13:
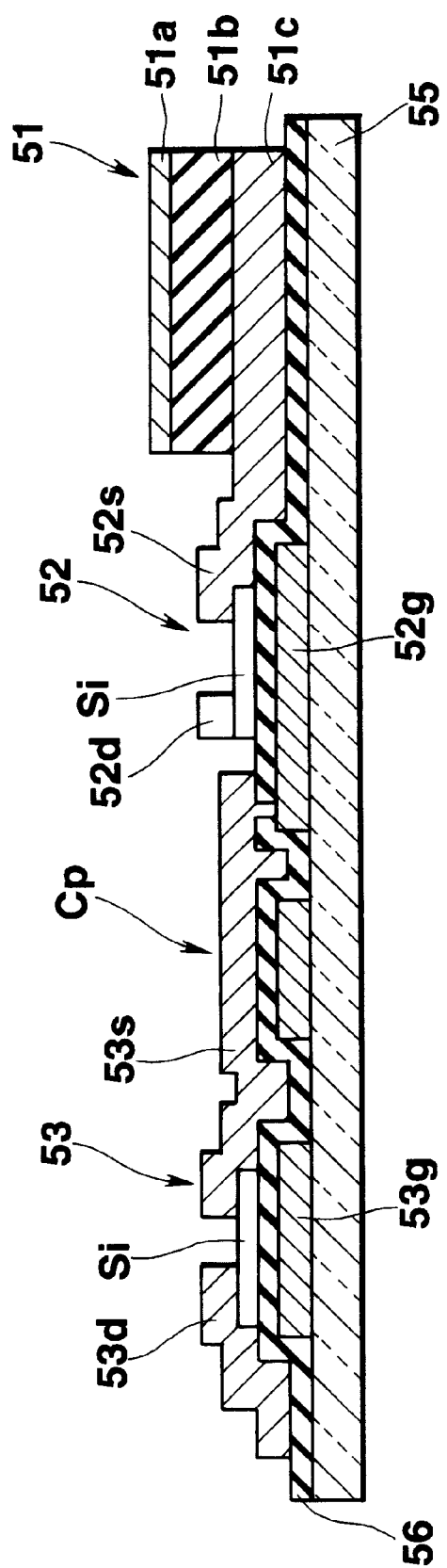
FIG. 13 is a cross-sectional view showing a structure of a part of the organic EL panel shown in FIG. 12.

FIG. 12 shows a circuit configuration of an equivalent circuit of one pixel in an organic EL panel used in an organic EL display apparatus according to a fourth embodiment. FIG. 13 is a cross-sectional view showing the structure of one pixel of the organic EL panel shown in FIG. 12.

As shown in the figures, one pixel of the organic EL panel according to the fourth embodiment includes an organic EL element 51, a drive transistor 52, a data maintain capacitor Cp, and a selection transistor 53. In the figures, references 53g, 53d, and 53s respectively denote a gate electrode, a drain electrode, and a source electrode of the selection transistor 53. References 52g, 52d, and 52s respectively denote a gate electrode, a drain electrode, and a source electrode of the drive transistor 52.

In the organic EL panel, drive signals $Y_1$ to $Y_M$ from a drain driver 4 are maintained in data maintain capacitors Cp. Further, the drive transistor 52 and the data maintain capacitor Cp realize the same function as that obtained by the drive transistor 12 and the capacitor Cp in the above-described embodiment.

In addition, in the organic EL panel, each organic EL element includes a cathode electrode 51c, an organic EL layer 51b, and an anode electrode 51a, and in each pixel, the organic EL element 51 is formed at a portion where the drive transistor 52, the data maintain capacitor Cp, or the selection transistor 53 is not formed. The cathode electrode 51a is not formed as one of those which are common to each row as in the organic EL panel in the embodiment described above, but is formed independently for every organic EL element 51. All the cathode electrodes 51c are grounded. The anode electrode 51a of the organic EL element 51 is connected to a common line (not shown) formed on a data line (not shown) with an insulating film inserted therebetween. The source electrode 52s of the drive transistor 52 is always applied with a fixed voltage Vds (=Vth).

Figure 2:
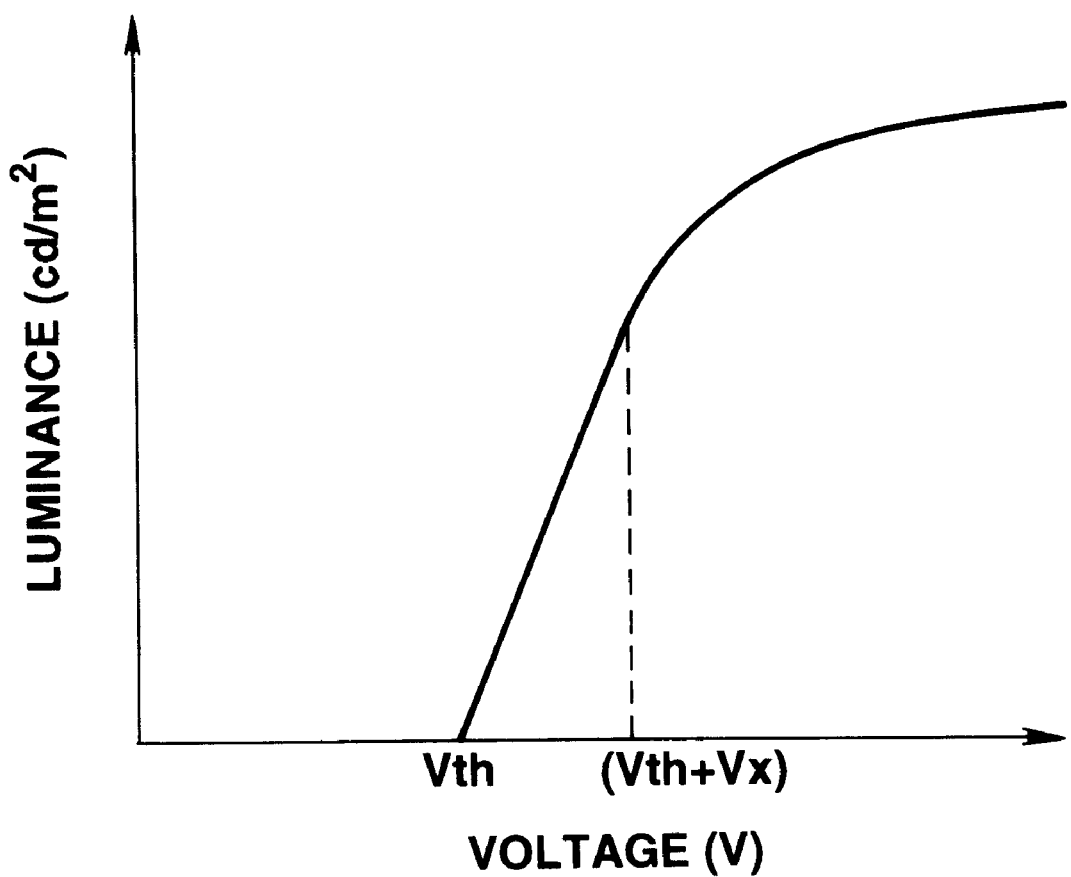
FIG. 2 is a characteristic graph relating to a plurality of organic EL elements used in an organic EL panel of the organic EL display apparatus shown in FIG. 1.

In case where the organic EL panel is driven in the same manner as in the above-described cases, the voltages applied to common lines CL are respectively −⅛Vx, −¼Vx, −½Vx, and −Vx in first to fourth sub-frames, supposing that the organic EL element 51 has a characteristic as shown in FIG. 2 described above.

In this organic EL panel, as shown in FIG. 13, the cathode electrode 51c is formed in the side of the glass substrate 55 with a transparent insulating film 56 interposed therebetween. The cathode electrode 51c may be made of a transparent ITO layer, or may have a transparent two-layer structure consisting of a layer formed by dispersing a material such as Mg or the like having a low work function in a material of the organic EL layer 51b provided in the side of the interface with the light emission layer 51b, and an ITO layer provided in the side of the glass substrate 55. Therefore, light emitted by the organic EL layer 51b penetrates through the transparent glass substrate 55, so that an image is displayed in the side of the glass substrate 15. In addition, the organic El element of the present embodiment may be constructed in a structure as shown in FIGS. 3 and 4.

In the organic EL panel 1 according to the embodiment described above, the cathode electrode 51c and the anode electrode 51a are respectively connected to the drive transistor 52 and the common line CL. However, the electrodes 51a and 51c may be connected inversely. In this case, the voltage applied to the cathode electrode from a common driver may be set to be lower in a negative side than the fixed voltage Vds.

In addition, the common line CL and the line through which the fixed voltage Vds is applied may be connected inversely.

In the embodiment described above, the source electrode 52s of the drive transistor 52 may be any of a positive potential, a potential 0 V, and a negative potential, as long as the common line CL is shifted in the positive side of the potential.

Also, in the embodiment described above, the light emission luminance of the organic EL element 11 linearly increases as the voltage applied between the anode and the cathode exceeds the threshold voltage. Therefore, a voltage −Vdd obtained by negatively inverting the polarity of the threshold voltage may be applied to the cathode electrode 11a of the organic El element 11, and the voltage applied to the anode electrode 11c may be controlled in proportion to the light emission luminance in every sub-frame, thereby to control the light emission luminance of the organic EL element 11. Further, it is possible to apply the present invention to an organic EL element whose light emission luminance increases not linearly in response to a voltage equal to or higher than the threshold voltage. In this case, the voltage applied between the anode and the cathode of the organic EL element may be controlled such that the light emission luminance of the organic EL element satisfies a predetermined ratio between predetermined sub-frames.

In the embodiments as described above, one frame is divided into four sub-frames between which the light emission luminance satisfies a ratio of 1:2:4:8, and the sub-frames are selected to obtain display of 16 gradation levels. However, the organic EL display apparatus according to the present invention is capable of displaying an image of arbitrary gradation levels of 32 or more. For example, in order to display $2^n$ gradation levels, one frame may be divided into n sub-frames, and the ratio between the light emission amounts of the sub-frames may be set to $1:2:4: \ldots : 2^{n-1}$ (where n is an integer of 1 or more). In addition, whether or not a pixel should be selected to emit light is determined on the basis of the gradation value of the pixel, represented as a binary value, like in the embodiments described above.

In the embodiments described above, in one frame, the light emission amount of the organic EL elements is gradually increased in an order from a first sub-frame. However, a sub-frame having a larger light emission amount may be displayed earlier, and a sub-frame having the largest light emission amount may be displayed next to a sub-frame having the smallest light emission amount.

In the embodiments described above, common signals $Z_1$ to $Z_N$ are applied from the common driver 5 to the anode electrodes 11c of the organic El elements 11 until light emission signals IMG of a next sub-frame is started after writing of light emission signals IMG into the gates of the drive transistors 12. Specifically, the light emission period of the organic EL elements 11 in one sub-frame is substantially the same as one sub-frame period. However, the light emission period of the organic EL elements 11 may be set arbitrarily. In addition, the brightness of an image displayed on the organic EL panel 1 may be adjusted in a manner in which a use can set the light emission period of the organic EL elements 11.

In the embodiments described above, interlace scanning is not performed. However, scanning may be performed alternately by dividing rows into a field of odd-numbered rows and a field of even-numbered rows.

In the embodiments described above, image signals Sp whose frame is divided into sub-frames are directly displayed without suppression. However, if the gradation levels are increased in the present invention, there may be cases in which a sufficient period for writing data into gates of drive transistors from a drain driver cannot be obtained and a sufficient period for selective light emission of organic EL elements by a common driver cannot be obtained. In these cases, image signals Sp may be subjected to suppression according to predetermined rules and are then displayed on an organic EL panel.

In the embodiments described above, a voltage corresponding to a light emission signal IMG of each pixel is maintained in the capacitor Cp or the data maintain capacitor Cp. In this respect, the structure may be arranged such that neither the capacitor nor the data maintain capacitor is provided but a memory transistor having a gate insulating film doped with impurities is used as the drive transistor.

Also, in the embodiments described above, the organic EL display apparatus for displaying full-color image is constructed by providing the organic EL elements 11 having light emission layers for colors of R, G, and B in a predetermined order on the organic EL panel 1. In place of thus using three types of the organic EL elements, it is possible to use organic EL elements having light emission layers for emitting white light including light of colors of R, G, and B and color filters for three colors of R, G, and B.

In addition, the present invention is applicable to an organic EL display apparatus in which organic EL elements having light emission layers for one same color are arranged in a matrix and a monochrome image is displayed by the density of a color. In this case, image signals Sp are subjected to extraction only on the basis of luminance signals in video signals Sv.

In the embodiments described above, explanation has been made of a case in which the present invention is applied to the organic EL display apparatus respectively using organic El elements as light emission elements in pixels. However, the present invention is applicable to all kinds of display apparatuses such as an inorganic EL display apparatus and the like, each pixel of which consists of a selection transistor, a drive transistor (and a data maintain capacitor), and a light emission element. In case where the light emission element is constructed by an alternate current drive type inorganic EL element, the polarities may be inverted for every frame.

Also, in the embodiments described above, signals applied are arranged to have voltages different from each other between sub-frames. However, the signals applied in each of the sub-frames may have equal current values if all the organic EL elements 11 are formed as dots each having an equal light emission area.

In the following, a fifth embodiment of the present invention will be explained below.

In this embodiment, explanation will be made of an example of an organic EL display apparatus in which one frame period as a period for substantially displaying one image of one frame is divided into four sub-frame periods and the light-emission amounts of the sub-frames are set to a ratio of 1:2:4:8, to display 16-gradation levels.

The organic EL display apparatus according to the fifth embodiment of the present invention comprises an organic EL panel 1, a controller 2, a gate driver 3, a drain driver 4, and a common driver 5.

Each pixel of the organic EL panel 1, as shown in the circuit configuration of an equivalent circuit in the FIG. 1, includes an organic EL element 11, a drive transistor 12, a selection transistor 13, and a capacitor Cp.

The organic EL element 11 is a light emission element which emits light by applying a voltage equal to or higher than a threshold value, between an anode and a cathode. When a voltage equal to or higher than a threshold value is applied between the anode and cathode of the organic EL element 11, a current flows through an organic EL layer described later, and the organic EL element 11 emits light. Entirely, the organic EL elements 11 which emit light in red, green, and blue are arrayed in a predetermined order in a matrix.

The drive transistor 12 is made of a TFT. The gate of the drive transistor 12 is connected to a source of the selection transistor 13, and the source of the drive transistor 12 is connected to a cathode electrode of the organic EL element 11. The drain of the drive transistor 12 is grounded. The drive transistor 12 is used as a switch for turning on and off a power supplied to the organic EL element 11. The gate of the drive transistor 12 maintains a drive signal supplied from the drain driver 4 described later.

When the organic EL element 11 is applied with a common signal of a predetermined voltage value or a predetermined current value from the common driver 5 described later, the ON resistance of the drive transistor 12 becomes sufficiently smaller (by, for example, 1/10 time) than the resistance of the organic EL element 11, and the OFF resistance becomes sufficiently larger (by, for example, 10 times) than the resistance of the organic El element 11. Therefore, while the drive transistor 12 is turned on, most of the voltage outputted from the common driver 5 is distributed to the organic EL element 11. Therefore, the ON resistance of the drive transistor 12 is negligibly small, in comparison with the resistance of the organic EL element 11 while the drive transistor 12 is turned on. Meanwhile, while the drive transistor 12 is turned off, most of the voltage outputted from the common driver 5 is distributed to between the source and drain of the drive transistor 12. In other words, since the partial voltage distributed to the drive transistor 12 is extremely small in comparison with the partial voltage distributed to the organic EL element 11, the resistance ratio of the drive transistor 12 to the organic EL element 11 is small in accordance with the Kirchhoff's law, so that influences onto the luminance of the organic EL element 11 can be extremely reduced even if each of the ON resistance and the OFF resistance of the drive transistor 12 varies. If the drive transistor 12 uses a semiconductor layer made of amorphous silicon, the difference between the OFF resistance and the ON resistance is as large as a number of six figures or more. If the drive transistor 12 uses a semiconductor layer made of polysilicon, the difference between the OFF resistance and the ON resistance is as large as a number of seven figures or more. Any of these drive transistors can sufficiently function as a switch. Even if the difference between the OFF resistance and the ON resistance thus differs by one figure, the in-plane luminance balance can be maintained. Since the drain of the drive transistor 12 is connected to a reference voltage line SL, light emission of the organic EL element 11 mainly depends on a common signal Z outputted from a common line CL.

The selection transistor 13 is made of a TFT. The gate of the selection transistor 13 is connected to one of gate lines GL respectively provided for rows of the organic EL panel 1, and the drain of the selection transistor 13 is connected to one of drain lines DL respectively provided for lines of the organic EL panel 1. The source of the selection transistor 13 is connected to a gate of the drive transistor 12. The selection transistor 13 is used as a switch for supplying binary ON and OFF signals to the gate of the drive transistor 12, relating to a drive signal from the drain driver 4 described later. All the selection transistors 13 are capable of applying a voltage higher than 10(V) to a gate electrode 12a (FIG. 3) of the corresponding drive transistor 12, although the voltage varies more or less.

Each capacitor Cp maintains a drive signal supplied from the drain driver 4 described later, for at least one sub-frame period. The drive signal maintained by the capacitor Cp is used for turning on and off the drive transistor 12, and the capacitor Cp together with the drive transistor 12 constitutes a switch for making the organic EL element 11 emit light.

As shown in FIGS. 3 and 4, the organic EL panel 1 is constructed by forming organic EL elements 11, drive transistors 12, and selection transistors 13, on a glass substrate 14. The controller 2 is constructed as shown in FIG. 5.

The common driver 5 shown in FIG. 1 generates common signals $Z_1$ to $Z_N$ to be applied to the anode electrodes 11c of the organic EL elements 11, on the basis of a common control signal CCONT supplied from the common control signal generator circuit 2m. The signal is of a binary value of ON and OFF and is applied to anode electrodes 11c of the organic EL elements 11, for every row, through common lines CL. The ON voltage thus applied is sufficiently higher than the threshold voltage of the organic EL element 11 and is constant.

Meanwhile, while the drive transistor 12 is turned off, most of the voltage outputted from the common driver 5 is distributed to between the source and drain of the drive transistor 12, so that a voltage equal to or higher than the threshold value is not applied to the organic EL element 11 and the organic EL element 11 does not emit light. Further, while the drive transistor 12 is turned on, the light emission luminance per unit time is constant in the organic EL element 11 between the anode electrode 11c and the cathode electrode 11a of the organic EL element 11.

In the following, explanation will be made of operation of the organic EL display apparatus in a period for displaying one frame, in the organic EL display apparatus according to the present embodiment. R, G, and B image signals Sp extracted at predetermined timings by an RGB extraction circuit 2a are subjected to digital conversion by an A/D converter 2b and to correction such as γ-correction or the like by a correction circuit 2c. Thereafter, the signals are stored in the image signal memory section 2e. The image signals Sp stored in the image signal memory section 2e are represented as binary values each consisting of four figures, as has been described before. Gradation light emission may be achieved by directly outputting data of digital image signals Sd outputted from a personal computer PC or the like, to the correction circuit 2c, in place of using video signals Sv.

Meanwhile, a gate control signal generator circuit 2k, a drain control signal generator circuit 2l, and a common control signal generator circuit 2m respectively generate a gate control signal GCONT, a drain control signal DCONT, and a common control signal CCONT, on the basis of horizontal and vertical signals extracted by a synchronization signal extraction circuit 2g and a reference clock CLK generated by a reference clock generator circuit 2j.

Operation in a first sub-frame will be explained below with reference to FIG. 14.

The light emission signal output section 2f sequentially reads first figures (or lowest figures) of image signals Sp for one frame, stored in the image signal memory section 2e, in accordance with a reference clock CLK generated by the reference clock generation circuit 2j, and outputs the first figures as light emission signals IMG, to the drain driver 4. At the same timing as the timing at which the light emission signals IMG are outputted from the light emission signal output section 2f, the drain control signal generator circuit 21 outputs a start signal to the drain driver 4.

In the drain driver 4, "1" is set in the first bit of the shift register 41 when a start signal is supplied to the shift register 41. Further, every time when a shift signal in a drain control signal DCONT is inputted, the shift register 41 performs bit-shifting. While the shift register 41 performs bit-shifting, the latch circuit 42 sequentially latches light emission signals IMG of the first sub-frame from the light emission signal output section 2f, in an order from the first row. The light emission signals IMG for one row of the first sub-frame, latched by the latch circuit 42, are latched by the latch circuit 43 in the second stage, by a switch signal in a drain control signal DCONT. Next, the drain driver 4 takes in light emission signals IMG for second and more rows, by the same operation as described above. When the drain driver 4 completes taking-in of the light emission signals IMG of the first sub-frame for the Nth row, the drain driver 4 sequentially takes in light emission signals IMG of the second sub-frame.

The gate driver 3 firstly outputs a selection signal X1 to the gate line GL of the first row, for one period of a reference clock CLK, on the basis of a gate control signal GCONT from the gate control signal generator circuit 21. In this manner, the selection transistors 13 connected to the gate line GL of the first row are turned on. In this state, the level change circuit 44 of the drain driver 4 is supplied with an output enable signal in a drain control signal, and drive signals Y1 to YM having a predetermined voltage, according to the light emission signals IMG latched by the latch circuit 43, are outputted to the drain lines Dl of corresponding rows, from the level change circuit 44. Then, within a period in which the selection signal X1 is outputted, the drive signals Y1 to YM are written into the gates 12a of the drive transistors 12 of the first row.

The drive transistors 12 in the first row are turned on when the drive signals Y1 to YM are of a high level, and are turned off when the drive signals Y1 to YM are of a low level. Upon completion of selection of the gate line GL of the first row, the common driver 5 keeps applying a common signal Z1 to the common line CL of the first row, for a first period (or a first common signal period $T_c1$ of the reference clock signal CLK.

When the drive transistor 12 is turned on, the ON resistance of the drive transistor is sufficiently smaller than the resistance of the organic EL element 11, and therefore, a voltage equal to or higher than the threshold value is applied between the electrodes of the organic EL element 11. As a result, a current corresponding to the level of the voltage flows through the organic EL layer 11b, so that the organic EL element 11 emits light. Further, when outputting of the light emission signal $Z_1$ is completed, the voltage applied between the electrodes of the organic EL element 11 becomes 0 V, so that the organic EL element stops emitting light. Specifically, the light emission period of pixels in the first sub-frame period is substantially determined by the length of the first common signal period $T_c1$. Meanwhile, when the drive transistor 12 is turned off, the OFF resistance of the drive transistor 12 is sufficiently larger than the resistance of the organic EL element, and therefore, no voltage higher than the threshold value is not applied between the electrodes of the organic EL element 11. As a result of this, the organic EL element 11 does not emit light.

While a common signal $Z_1$ is outputted to the common line CL of the first row, the gate driver 2 subsequently selects the gate line GL of the second row. Then, drive signals $Y_1$ to $Y_M$ for the second row are written into the gates 12a of drive transistors 12, likewise. In the following, a common signal $Z_2$ is outputted to the common line CL of the second row and the organic EL elements 11 emit light in the same manner as described above. Further, when a gate signal $X_N$ is outputted to the gate line GL of the last row (or the Nth row) and outputting of a common signal $Z_N$ to the common line CL of the last row (or the Nth row) is completed, the first sub-frame write period $T_W1$ of the first sub-frame is completed. As described above, in the first sub-frame, those organic EL elements 11 which have image signals each having "1" as a first figure emit light within a first sub-frame light emission period $T_E1$ in correspondence with the length of one reference clock period CK (or the first common signal period $T_C1$), and those organic EL elements 11 which have image signals each having "0" as a first figure do not emit light.

In the first sub-frame light emission period $T_E1$, the period for which organic EL elements 11 of each row emit light is substantially the first common signal period $T_C1$.

Next, operation in a second sub-frame will be explained.

A selection signal $X_1$ to the gate line GL of the first row in the second sub-frame is outputted after outputting of a selection signal $X_N$ to the Nth row in the first sub-frame write period $T_W1$. The second sub-frame write period $T_W2$ is a write period for the gate lines GL from the first row to the Nth row in the second sub-frame. In this case, the first common signal period $T_C1$ of the Nth row may be bridged to the second sub-frame write period $T_W2$. Specifically, the first sub-frame light emission period $T_E1$ may partially overlap the second sub-frame write period $T_W2$.

Operation in the second sub-frame is substantially the same as the case of the first sub-frame. However, the light emission signal output section 2f outputs second figures (or second lowest figures) stored in the image signal memory section 2e, as light emission signals IMG, in place of the first figures of the image signals Sp. In addition, after the gate driver 3 outputs selection signals $X_1$ to $X_N$, the common driver 5 outputs a voltage of the same potential as in the first sub-frame to commons lines CL, for a period (or a second common signal period $T_C2$) which is twice longer than one reference clock period CK. Although the apparent luminance in each common signal period depends on the product of the light emission luminance per unit time and the light emission time, the second common signal period $T_C2$ needs not be based on the reference clock period CK as far as the second common signal period $T_C2$ is set to a period which is required for emitting light with the apparent luminance twice higher than the apparent luminance obtained by light emission in the first common signal period $T_C1$.

In the second sub-frame light emission period $T_E2$, the period for which organic EL elements 11 of each row emit light is substantially the second common signal period $T_C2$.

Therefore, in the second sub-frame, those organic EL elements 11 which have image signals each having a second figure of "1" emit light for a twice longer period than one reference clock period CK, in the second sub-frame light emission period $T_E2$, and those organic EL elements 11 which have image signals each having a second figure of "0" do not emit light.

Next, operation in a third sub-frame will be explained.

A selection signal $X_1$ to the gate line GL of the first row in the third sub-frame is outputted after outputting of a selection signal $X_N$ to the Nth row in the second sub-frame write period $T_W2$. The third sub-frame write period $T_W3$ is a write period for the gate lines GL from the first row to the Nth row in the third sub-frame. In this case, the second common signal period $T_C2$ of the Nth row may be bridged to the third sub-frame write period $T_W3$. Specifically, the second sub-frame light emission period $T_E2$ may partially overlap the third sub-frame write period $T_W3$.

Operation in the third sub-frame is substantially the same as the case of the first sub-frame. However, the light emission signal output section 2f outputs third figures (or third lowest figures) stored in the image signal memory section 2e, as light emission signals IMG, in place of the first figures of the image signals Sp. In addition, after the gate driver 3 outputs selection signals $X_1$ to $X_N$, the common driver 5 outputs a voltage of the same potential as in the first sub-frame to commons lines CL, for a period (or a third common signal period $T_C3$) which is four times longer than one reference clock period CK. The third common signal period $T_C3$ needs not be based on the reference clock period CK as far as the third common signal period $T_C3$ is set to a period which is required for emitting light with the apparent luminance four times higher than the apparent luminance obtained by light emission in the first common signal period $T_C1$.

Therefore, in the third sub-frame, those organic EL elements 11 which have image signals each having a third figure of "1" emit light for a three times longer period than one reference clock period CK, in the third sub-frame light emission period $T_E2$, and those organic EL elements 11 which have image signals each having a third figure of "0" do not emit light.

In the third sub-frame light emission period $T_E3$, the period for which organic EL elements 11 of each row emit light is substantially the third common signal period $T_C3$.

Next, operation in a fourth sub-frame will be explained.

A selection signal $X_1$ to the gate line GL of the first row in the fourth sub-frame is outputted after outputting of a selection signal $X_N$ to the Nth row in the third sub-frame write period $T_W3$. The fourth sub-frame write period $T_W4$ is a write period for the gate lines GL from the first row to the Nth row in the fourth sub-frame. In this case, the third common signal period $T_C3$ of the Nth row may be bridged to the fourth sub-frame write period $T_W4$. Specifically, the third sub-frame light emission period $T_E3$ may partially overlap the fourth sub-frame write period $T_W4$.

Operation in the fourth sub-frame is substantially the same as the case of the first sub-frame. However, the light emission signal output section 2f outputs fourth figures (or the highest figures) stored in the image signal memory section 2e, as light emission signals IMG, in place of the first figures of the image signals Sp. In addition, after the gate driver 3 outputs selection signals $X_1$ to $X_N$, the common driver 5 outputs a voltage of the same potential as in the first sub-frame to commons lines CL, for a period (or a fourth common signal period $T_C4$) which is eight times longer than one reference clock period CK. The fourth common signal period $T_C4$ need not be based on the reference clock period CK as far as the fourth common signal period $T_C4$ is set to a period which is required for emitting light with the apparent luminance eight times higher than the apparent luminance obtained by light emission in the first common signal period $T_C1$.

Therefore, in the fourth sub-frame, those organic EL elements 11 which have image signals each having a fourth figure of "1" emit light for an eight times longer period than one reference clock period CK, in the fourth sub-frame light emission period $T_E2$, and those organic EL elements 11 which have image signals each having a fourth figure of "0" do not emit light.

In the fourth sub-frame light emission period $T_E4$, the period for which organic EL elements 11 of each row emit light is substantially the fourth common signal period $T_C3$.

Voltage values of the signals $Z_1$ to $Z_N$ applied to common lines CL of first to Nth rows in the first to fourth common signal periods are always constant, and an image divided into the first to fourth sub-frames is visually synthesized as an image of one frame by an after-image phenomenon.

In this case, an organic EL element 11 of one pixel which has a gradation value of 15 emits light for a fifteen times longer period than one reference clock period CK, in one frame. An organic EL element 11 which has a gradation value of 0 does not emit light at all. An organic EL element 11 which has an intermediate gradation value emits light for reference clock periods CK corresponding to the intermediate gradation value. As a result of this, each of the organic EL elements 11 visually appears as if it emits light with a brightness corresponding to a gradation value in one frame. In addition, light emitted from three types of organic EL elements 11 of R, G, and B is visually synthesized so that it appears as if a 16-gradation image is displayed on the organic EL panel 1. By repeating the first to fourth sub-frames, a plurality of frame images can be continuously displayed.

As has been described above, in the organic EL display apparatus according to the present embodiment, the driver transistors 12 are used as ON/OFF switches so that the voltage applied to the anode electrodes 11c connected to the common driver 5 is controlled, thereby to achieve gradation display. Therefore, even if the characteristics of the drive transistors 12 vary, the light amount emitted from the organic El element 11 of each of the pixels can be maintained to be substantially constant in one same gradation. Accordingly, the organic EL display apparatus attains a displayed image with high quality. Besides, there is no difference in display performance between a plurality of organic EL panels manufactured through manufacturing steps.

In addition, in the organic EL display apparatus according to the present embodiment, the anode electrodes of the organic EL elements 11 are formed in common in each row, and light emission of the organic EL elements 11 is started and stopped for every row, by common signals $Z_1$ to $Z_N$ from the common driver 5. Therefore, in comparison with a method used for a plasma display panel or the like, in which all pixels are lightened at once in one sub-frame, variations of transmission delays are reduced so that the entire organic El panel 1 can emit light uniformly. In addition, since the anode electrodes 11c are formed in common in each row, the resistance value can be reduced to be lower than in the case in which anode electrodes 11c for every row are connected by wires. Therefore, voltage levels applied to the anode electrodes 11c by common signals $Z_1$ to $Z_N$ from the common driver 5 can be maintained to be substantially constant regardless of the distance from the common driver 5, so that organic EL elements 11 are capable of emitting light of a substantially equal brightness.

In addition, the present embodiment cites an example of an organic EL display apparatus which uses organic EL elements 11 having an excellent response characteristic, as light emission elements. Since the organic EL elements 11 have an excellent response characteristic, a sufficient light amount can be obtained even if the period for which a voltage is applied to the organic EL elements is as short as a first sub-frame. Thus, the present invention is preferably applied to an organic EL display apparatus.

In the present embodiment, operation of a next sub-frame proceeds in parallel with selection and light emission during a period of selection and light emission of a sub-frame. Therefore, organic EL elements can emit light, at most, in all the periods of one frame at the maximum luminance, depending on the setting of the selection periods.

Figure 15:
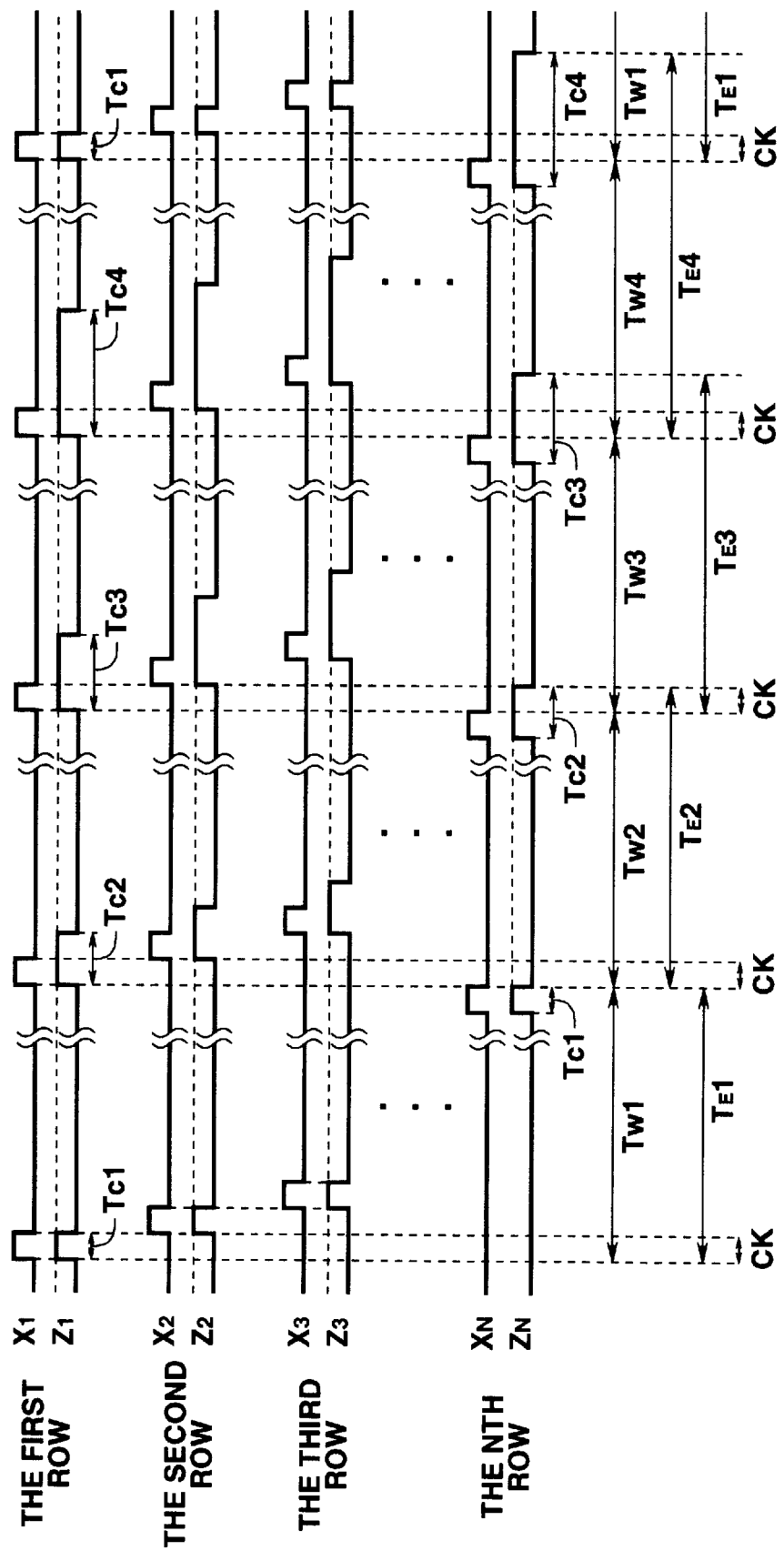
FIG. 15 is a timing chart showing other drive waveforms in the organic EL display apparatus according to the fifth embodiment of the present invention.

In the present embodiment described above, the ON-potential of the common signals $Z_1$ to $Z_N$ is outputted after selection signals $X_1$ to $X_N$ are ON-outputted. However, as shown in FIG. 15, ON-outputs of the common signals $Z_1$ to $Z_N$ may be outputted in synchronization of ON-outputting of the selection signals $X_1$ to $X_N$, and the ON-period of the common signals $Z_1$ to $Z_N$ may partially overlap the ON-period of the selection signals $X_1$ to $X_N$.

Figure 16:
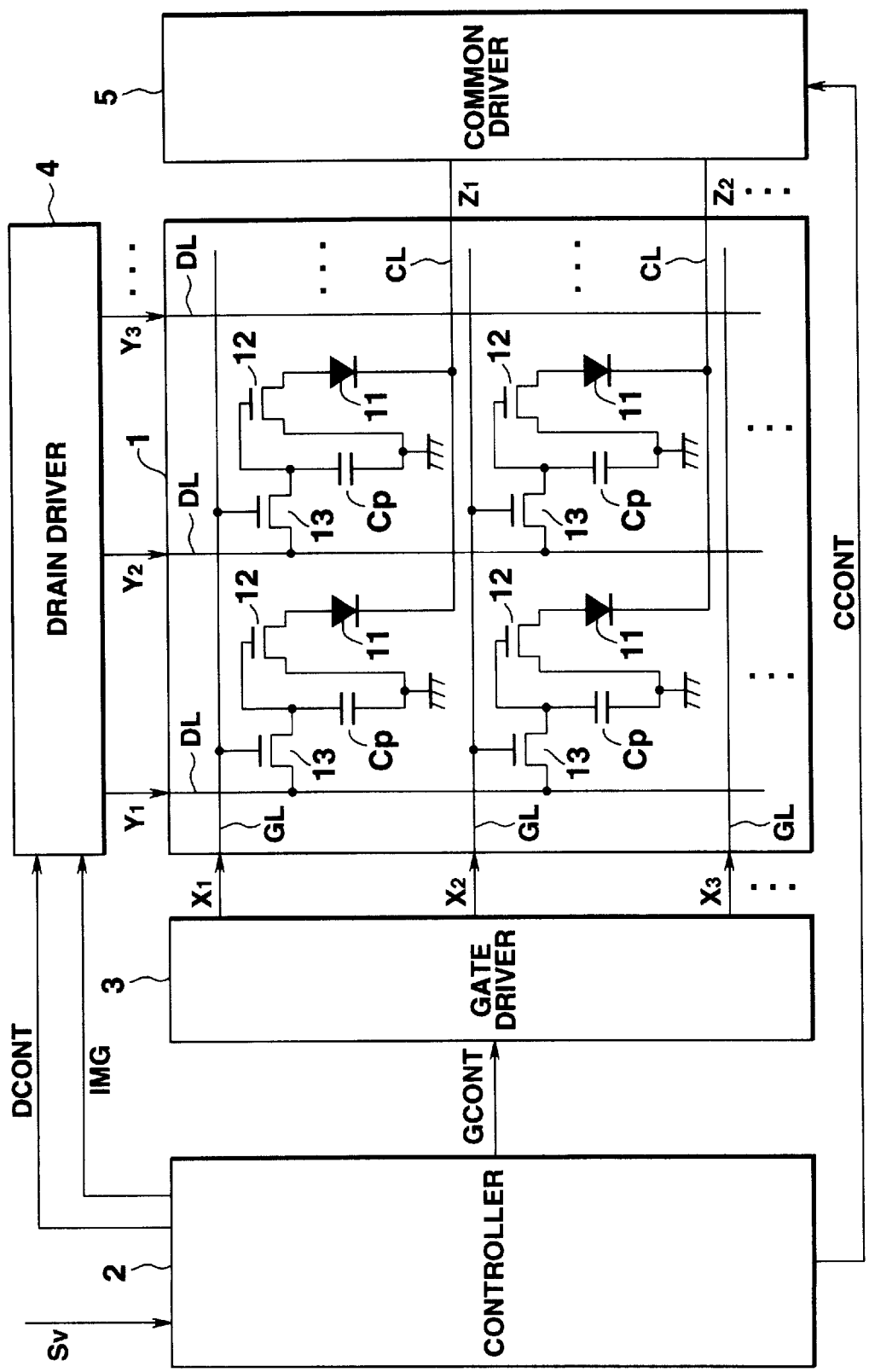
FIG. 16 is a circuit diagram showing a structure of another organic EL display apparatus of the present invention.

In addition, the anode electrode and the cathode electrode of each organic EL element 11 may be connected inversely, as shown in FIG. 16. In this case, common signals $Z_1$ to $Z_N$ are applied to the cathode electrodes of organic EL elements 11, with their polarities inverted.

Further, the structure of the organic EL panel 1 is not limited to those as shown in FIGS. 2 and 3.

In the embodiment described above, the drain of the drive transistor 12 is grounded and applied with a voltage of level of 0 V. However, the voltage applied to the drain of the drive transistor 12 need not be 0 V. For example, the drain of the drive transistor 12 may be applied with a negative voltage as a reference voltage, and a positive voltage may be outputted to a common line CL from the common driver 5 during a light emission period while a negative voltage lower than the reference voltage may be outputted to a common line CL from the common driver 5.

FIG. 17 is a circuit configuration of an equivalent circuit of one pixel of an organic EL display panel used in an organic EL display apparatus according to a sixth embodiment. FIG. 18 is a cross-sectional view showing a structure of one pixel of the organic EL panel shown in FIG. 17.

As shown in the figures, one pixel of the organic EL panel according to the present embodiment includes an organic EL element 51, a drive transistor 52, a selection transistor 53, and a data maintain capacitor Cp.

The selection transistor 53 includes a gate electrode 53g connected to a gate line GL, a gate insulating film 56 provided on the gate electrode 53g, a semiconductor layer 57 provided on the gate insulating film 56, a drain electrode 53d connected to a drain line DL, and a source electrode 53s.

The drive transistor 52 includes a gate electrode 52g connected to the source electrode 53s of the selection transistor 53, a gate insulating film 56 provided on the gate electrode 52g, a semiconductor layer 57 provided on the gate insulating film 56, a drain electrode 52d connected to a common line CL, and a source electrode 52s. The drain electrode 52d of the drive transistor 52 is connected to a common driver 5 through the common cline CL, for every row, and the source electrode 52s is connected to the anode electrode 51a of the organic EL element 51.

Further, drive signals $Y_1$ to $Y_M$ from a drain driver 4 are maintained in data maintain capacitors Cp.

In addition, in each pixel on a substrate 55 in the organic EL panel, an organic EL element 51 is formed at a portion where the drive transistor 52, the selection transistor 53, or the data maintain capacitor Cp is not formed.

The organic EL element 51 includes an anode electrode 51a made of ITO, an organic EL layer 51b, and a cathode electrode 51c made of light-reflective metal having a low work function. The anode electrode 51a is not formed as one of those which are common to each row as in the organic EL panel in the embodiment described above, but is formed independently for every organic EL element 51. All the cathode electrodes 51c are grounded.

Figure 14:
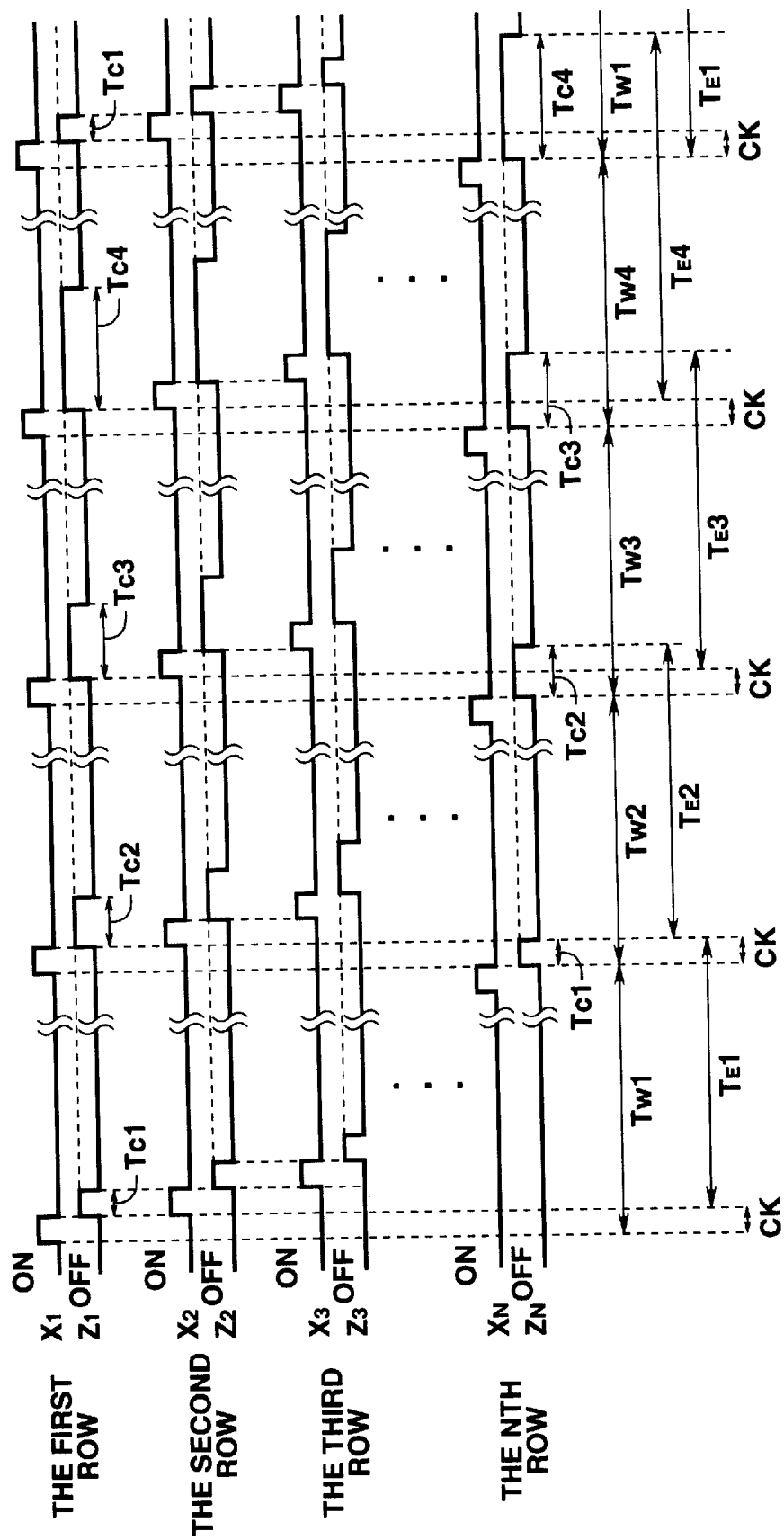
FIG. 14 is a timing chart showing drive waveforms in an organic EL display apparatus according to a fifth embodiment of the present invention.

In the organic EL panel of this case, an image of one frame is divided into a plurality of sub-frame periods, and pulse width gradation control is performed, in the same manner as shown in FIGS. 14 and 15. Therefore, excellent gradation display (or multi-color display) can be achieved.

In this organic EL panel, as shown in FIG. 18, the anode electrode 51a is formed in the side of the glass substrate 55 with a transparent insulating film 56 interposed therebetween. Since the anode electrode 51a is made of transparent ITO, light emitted by the organic EL layer 51b penetrates through the transparent glass substrate 55, thereby displaying an image.

Although the anode electrode 51a shown in FIG. 17 is connected to the drive transistor 52 and the cathode electrode 11a is grounded, this connection may be inverted, as shown in FIG. 12. In this case, the polarity of the voltage applied to the drive transistor 52 from a common driver is set to be negative.

In the embodiments described above, each pixel of the organic EL panel 1 comprises the organic EL element 11, the drive transistor 12 made of a TFT, the selection transistor 13, and the capacitor Cp. However, the structure of each pixel of the organic EL panel is not limited hitherto, but a switching element such as an MIM or the like may be used as the selection transistor and/or a drive transistor.

Also, in the embodiment described above, the cathode of each organic EL element 51 is grounded and applied with a voltage of level of 0 V. However, the voltage needs not be 0 V. For example, a reference voltage of a negative potential may be applied continuously to the cathode of the organic EL element 51, and a positive voltage may be added to the common line CL in a light emission period such that the same level of the threshold voltage of the organic EL element is obtained while a negative voltage lower than the reference voltage may be outputted from the common driver 5 during a non-light-emission period.

In the fifth and sixth embodiments, one frame is divided into four sub-frames between which the light emission luminance satisfies a ratio of 1:2:4:8, and the sub-frames are selected to obtain display of 16 gradation levels. However, the organic EL display apparatus according to the present invention is capable of displaying an image of arbitrary gradation levels of 32 or more. For example, in order to display $2^T$ gradation levels, one frame may be divided into T sub-frames, and the ratio between the light emission amounts of the sub-frames may be set to $1:2:4: \ldots :2^{T-1}$ (where n is an integer of 1 or more). In addition, whether or not a pixel should be selected to emit light is determined on the basis of the gradation value of the pixel, represented as a binary value, like in the embodiments described above.

In the fifth and sixth embodiments described above, a sub-frame displayed later has a longer period for selection and light emission. However, a sub-frame having a longer period for selection and light emission may be displayed earlier, and a sub-frame having the longest period for selection and light emission may be displayed next to the sub-frame having the shortest period for selection and light emission.

In the fifth and sixth embodiments described above, image signals Sp whose frame is divided into sub-frames are directly displayed without suppression. However, if the gradation levels are increased in the present invention, there may be cases in which a sufficient period for writing data into gates of drive transistors from a drain driver cannot be obtained and a sufficient period for selective light emission of organic EL elements by a common driver cannot be obtained. In these cases, image signals Sp may be subjected to suppression according to predetermined rules and are then displayed on an organic EL panel.

In the fifth and sixth embodiments described above, a voltage corresponding to a light emission signal IMG of each pixel is maintained in the capacitor Cp or the data maintain capacitor Cp. In this respect, the structure may be arranged such that neither the capacitor nor the data maintain capacitor is provided but a memory transistor having a gate insulating film doped with impurities is used as the drive transistor.

Also, in the fifth and sixth embodiments described above, the organic EL display apparatus for displaying full-color image is constructed by providing the organic EL elements 11 having the light emission layers for colors of R, G, and B in a predetermined order on the organic EL panel 1. In place of thus using three types of the organic EL elements, it is possible to use organic EL elements having light emission layers for emitting white light including light of colors of R, G, and B and color filters for three colors of R, G, and B.

In addition, the present invention is applicable to an organic EL display apparatus in which organic EL elements having light emission layers for one same color are arranged in a matrix and a monochrome image is displayed by the density of a color. In this case, image signals Sp are subjected to extraction only on the basis of luminance signals in video signals Sv.

In the fifth and sixth embodiments described above, explanation has been made of a case in which the present invention is applied to the organic EL display apparatus respectively using the organic El elements as light emission elements in the pixels. However, the present invention is applicable to all kinds of display apparatuses such as an inorganic EL display apparatus and the like, each pixel of which includes a selection transistor, a drive transistor (and a data maintain capacitor), and a light emission element. In case where the light emission element is constructed by an alternate current drive type inorganic EL element, the polarities may be inverted for every frame.

In the present embodiment, those signals for a first sub-frame corresponding to first figures of a first row to an Nth row among image signals Sp for one frame stored in the image signal memory section 2e are read into the light emission signal output section 2f, for every row, in an order from the first row to the Nth row, on the basis of the timings of the reference clock generator circuit 2j. Subsequently, those signals for a second sub-frame corresponding to second figures of the first row to the Nth row among the image signals Sp are read for every row. Finally, those signals for a fourth sub-frame corresponding to fourth figures of the first row to the Nth row among the image signals Sp are read for every row. Data for one frame is thus set such that image signals Sp are read. The light emission signal output section 2f outputs an ON/OFF signal for every sub-frame of every row, in correspondence with the image signals Sp subsequently read by the light emission signal output section 2f, on the basis of the reference clock generator circuit.

In this respect, it is possible to make the following arrangement, as shown in FIG. 5. Specifically, the image signal memory section 2e outputs image signals Sp for one frame, each consisting of four figures, to the calculation circuit 2fc of the light emission signal output section 2f, for every row or every one frame, and the figures corresponding to first to fourth sub-frames are respectively divided and distributed to sub-frame memories 1, 2, 3, and 4. Data thus divided are outputted to the read circuit 2fr, and light emission signals corresponding to sub-frames of every row are sequentially outputted to the drain driver, on the basis of the reference clock of the reference clock generator circuit 2j.

In addition, in the embodiments described above, the voltages applied in common signal periods are always constant. It is, however, possible to apply different voltages between common signal periods.

In the above embodiments, signals applied are arranged to have voltages different from each other between sub-frames. However, the signals applied in each of the sub-frames may have equal current values if all the organic EL elements 11 are formed as dots each having an equal light emission area.

As has been described above, according to the present invention, gradation display is enabled by a differences in length between the periods for which light emission elements are displayed. Therefore, the light emission amount from each of light emission elements of pixels in one same gradation level can be arranged to be constant, so that an image of high quality can be displayed. Besides, there is no difference in display performance between a plurality of organic EL panels manufactured through manufacturing steps.

In addition, according to the present invention, a predetermined voltage is applied to the light emission elements from the voltage drive means at least before completion of data writing. Therefore, variations of transmission delays are reduced so that the entire organic El panel 1 can emit light uniformly.

Further, electrodes of light emission elements in the side to which a voltage from the voltage drive means are formed in common in each of rows as units, so as to have an equal width in the row direction, so that the resistance value can be reduced to be lower than in the case of connecting the respective electrodes by means of wires. Therefore, regardless of whether the distances from the voltage drive means are long or short, the electrodes of the light emission elements can be applied with a voltage of a substantially equal level, so that the light emission elements can emit light of substantially equal brightness.

Figure 19:
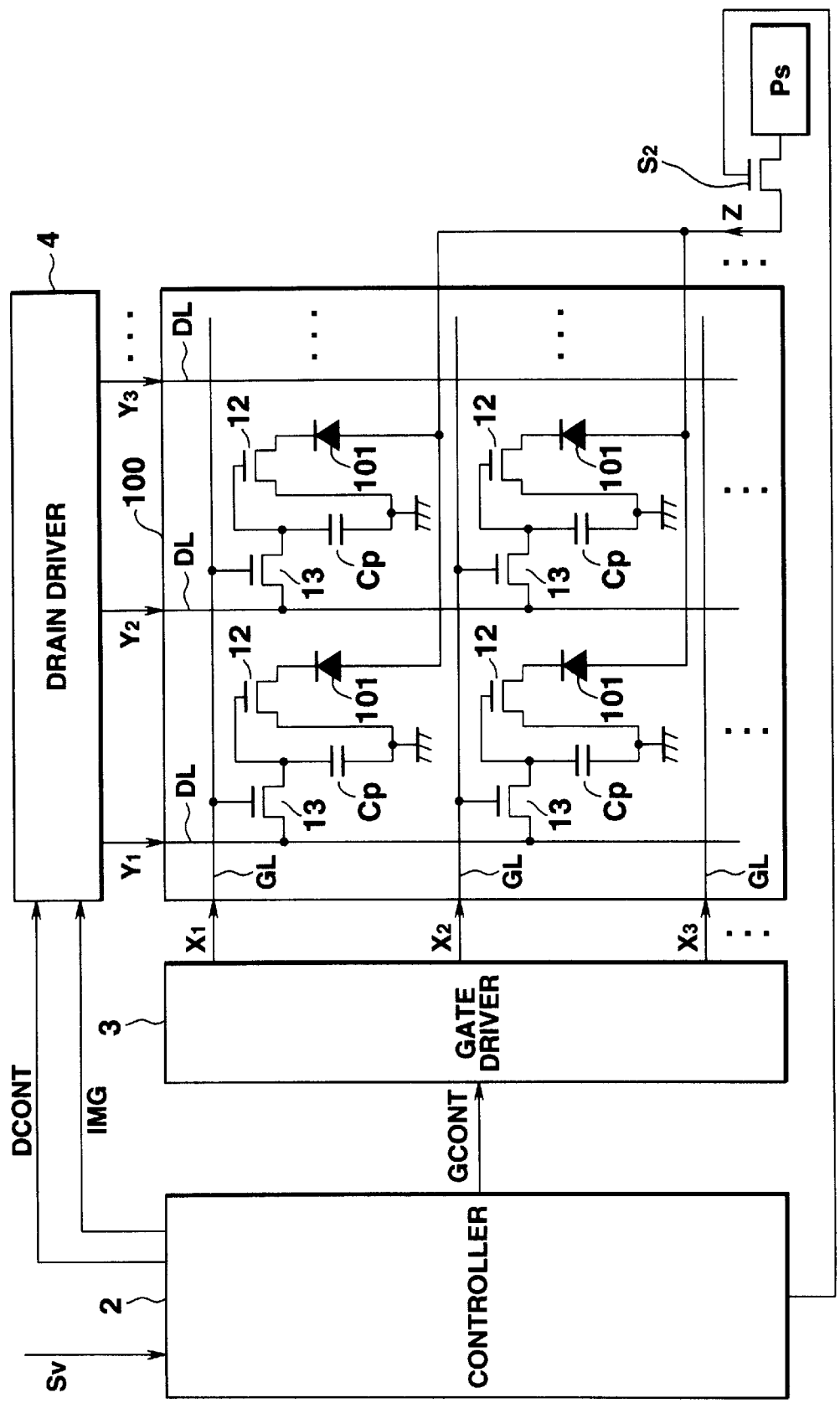
FIG. 19 is a circuit configuration showing a structure of an organic EL display apparatus according to a seventh embodiment of the present invention.

In the following, an electroluminescent display apparatus and a driving method according to a seventh embodiment of the present invention will be explained in details on the basis of the embodiment shown in FIG. 19. Before explanation of the driving method, the structure of the electroluminescent display apparatus will now be explained. FIG. 19 is a circuit configuration of a drive circuit of the electroluminescent display apparatus according to the present embodiment. As shown in the figure, organic EL elements 101 are respectively formed at pixel regions arranged in a matrix. The pixel regions are respectively formed at portions where a plurality of gate lines GL and a plurality of drain lines DL cross each other. In one pixel region, there are provided a selection transistor 13 connected to the gate line GL and the drain line DE, a capacitor Cp connected to the selection transistor 13, and a drive transistor 12 whose gate is connected to the selection transistor 13. The drive transistor 12 is connected to one electrode (e.g., a cathode electrode in this figure) of the organic EL element 101. When the selection transistor 13 is selected by a selection signal from the gate line GL and a drive signal is outputted through the drain line DL, the drive transistor 12 is turned on. The selection signal and the drive signal are binarily signals of ON/OFF. Note that the characteristic of the drive transistor 12 is set such that the resistance of the drive transistor 12 turned off is sufficiently high in comparison with the organic EL element 101 while the resistance of the drive transistor 12 turned on is negligibly low in comparison with the organic EL element 101.

Figure 22:
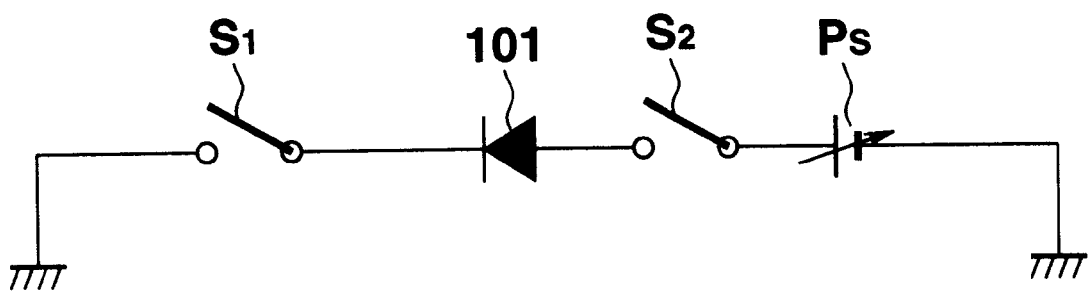
FIG. 22 is a circuit configuration of an equivalent circuit of an organic EL element according to the seventh embodiment.

FIG. 22 is a circuit configuration of an equivalent circuit of one pixel of the electroluminescent display apparatus. A switch S1 shown in the figure is connected to one electrode of each organic EL element 101, and light emission of the organic EL elements 101 is enabled while the switch S1 is closed. In addition, a switch S2 is connected to the other electrode of the organic EL element 101 and is used in common to all the pixels. The switch S2 can turn on/off all the pixels in accordance with a light emission time and a light emission voltage or a light emission drive current (e.g., voltages or currents of values respectively inherent to subframes) in a sub-frame period described later. In FIG. 22, Ps denotes a variable drive power source which is controlled so as to variably output voltage values or current values respectively inherent to sub-frame periods. The switch S1 comprises a controller 2, a gate driver 3, a drain driver 4, a drive transistor 12, a selection transistor 13, and a capacitor Cp.

Figure 20:
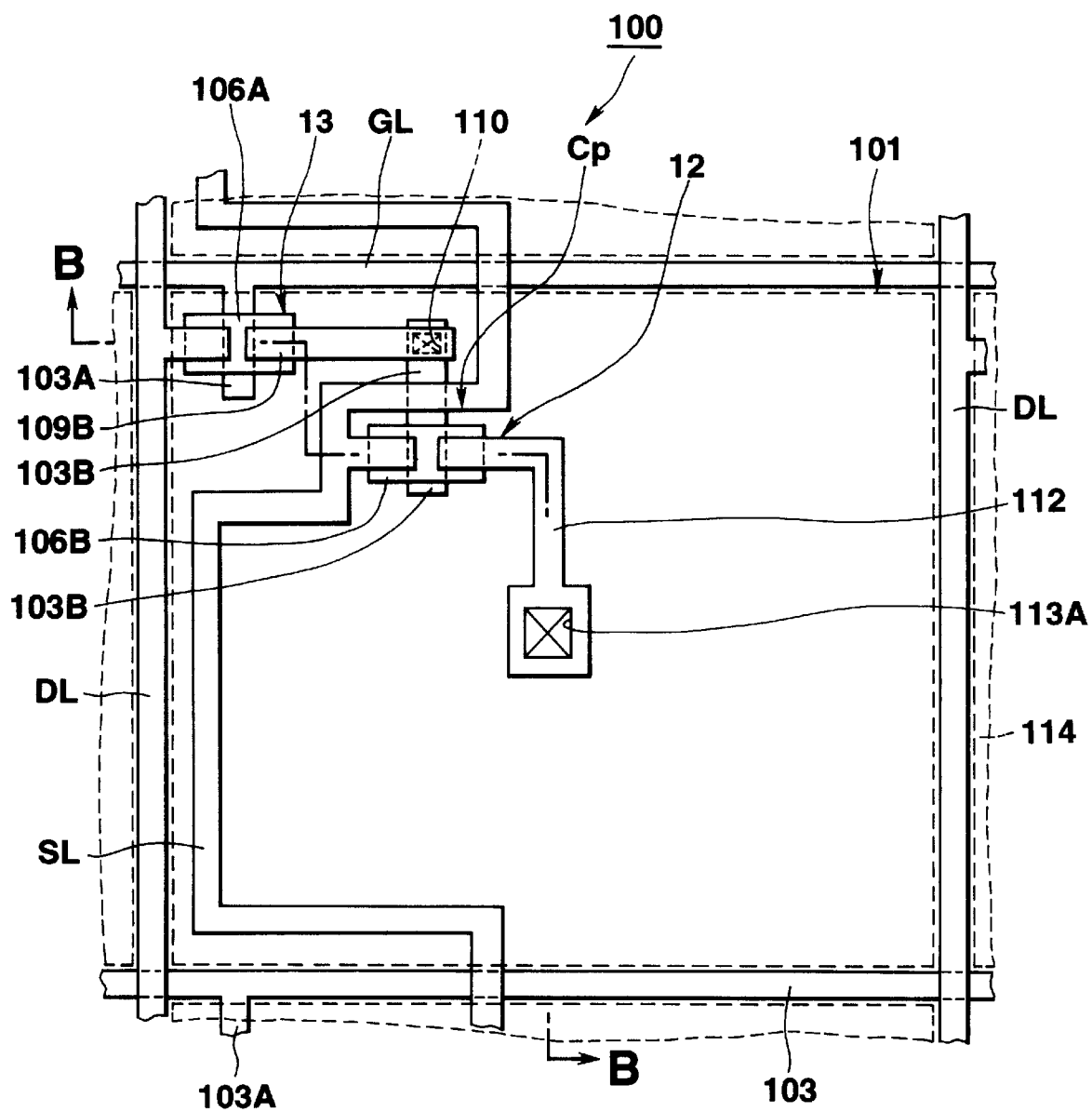
FIG. 20 is a plan view showing a structure of the organic EL element shown in FIG. 19.

The structure of the electroluminescent display apparatus according to the present embodiment will be explained more specifically with reference to FIGS. 20 and 21. FIG. 20 is a plan view showing one pixel portion of the electroluminescent display apparatus according to the present embodiment. FIG. 2 is a cross-sectional view cut along a line B—B in FIG. 20.

In the organic EL panel 100 according to the present embodiment, a plurality of gate lines GL, gate electrodes 103A of selection transistors 13, which are formed to be integral with the gate lines GL, and gate electrodes 103B of drive transistors 12 are formed on a substrate 102 made of glass or a resin film.

The plurality of gate lines are formed by patterning a gate metal film made of, e.g., aluminum (Al), so as to be parallel along the row direction and at equal intervals. Note that an anode oxide film 104 is formed on the gate electrodes 103A and 103B and the surfaces of the gate lines GL. In addition, a gate insulting film 105 is formed on the gate lines GL, the gate electrodes 103A and 103B, and the substrate 102.

Further, semiconductor layers 106A and 106B made of amorphous silicon or polysilicon are formed by patterning, on portions 105A and 105B of the gate insulating film 105 above the gate electrodes 103A and 103B. Blocking layers 107A and 107B made of silicon nitride and formed along the channel width direction are respectively formed at the centers of the semiconductor layers 106A and 106B. On the semiconductor layer 106A, two ohmic layers 108A made of amorphous silicon doped with n-type impurities are formed and separated into the source side and the drain side on the blocking layer 107A. Further, for the selection transistor 13, a drain line DL partially layered on and connected to the ohmic layer 108A in the ohmic side is formed, and a source electrode 109B partially layered on and connected to the ohmic layer 108A in the source side is formed. The source electrode 109B is connected to the gate electrode 103B of the drive transistor 12, through a contact hole 110 opened in the gate insulating film 105, as shown in FIG. 20. For the drive transistor 12, a reference voltage line SL layered on and connected to the ohmic layer 108B in the drain side is formed, and a source electrode 112 is formed so as to have an end layered on and connected to the ohmic layer 108B in the source side and another end connected to a cathode electrode 114 of the organic EL element 101, described later. In addition, a capacitor Cp is constructed by the gate electrode 103B, the gate insulating film 105, and the reference voltage line SL.

Next, the structure of the organic EL elements 101 will be explained below. Firstly, an interlayer insulating film 113 is deposited on the selection transistor 13, the drive transistor 12, and the gate insulating film 105, over the entire light emission display region. A contact hole 113A is formed in the interlayer insulating film 113 on the end portion of the source electrode 112 of the drive transistor 12 described above. In the present embodiment, the end portion of the source electrode 112 of the drive transistor 12 is arranged to positioned in the substantial center of one pixel region. Further, on the interlayer insulting film 113, a cathode electrode 114 which reflects visible light and is made of MgIn, MgAg, or the like is formed entirely over the substantial pixel region, in a rectangular shape. Specifically, the cathode electrode 114 of each organic EL element 101 is formed so as to substantially cover the region (or pixel region) surrounded by two adjacent drain lines DL and two adjacent gate lines GL. Therefore, the selection transistor 13 and the drive transistor 12 are entirely covered by the cathode electrode 114.

When the organic EL element 101 is applied with a common signal of a predetermined voltage value or a predetermined current value from a variable drive power source Ps, the ON resistance of the drive transistor 12 becomes sufficiently smaller (by, for example, $\frac{1}{10}$ time) than the resistance of the organic EL element 101, and the OFF resistance becomes sufficiently larger (by, for example, 10 times) than the resistance of the organic El element 101. Therefore, while the drive transistor 12 is turned on, most of the voltage outputted from the variable drive power source Ps is distributed to the organic EL element 101. Therefore, the ON resistance of the drive transistor 12 is negligibly small, in comparison with the resistance of the organic EL element 101 while the drive transistor 12 is turned on. Meanwhile, while the drive transistor 12 is turned off, most of the voltage outputted from the variable drive power source Ps is distributed to between the source and drain of the drive transistor 12. In other words, since the partial voltage distributed to the drive transistor 12 is extremely small in comparison with the partial voltage distributed to the organic EL element 101, the resistance ratio of the drive transistor 12 to the organic EL element 101 is small in accordance with the Kirchhoff's law, so that influences onto the luminance of the organic EL element 101 can be extremely reduced even if each of the ON resistance and the OFF resistance of the drive transistor 12 varies. If the drive transistor 12 uses a semiconductor layer made of amorphous silicon, the difference between the OFF resistance and the ON resistance is as large as a number of six figures or more. If the drive transistor 12 uses a semiconductor layer made of polysilicon, the difference between the OFF resistance and the ON resistance is as large as a number of seven figures or more. Any of these drive transistors can sufficiently function as a switch. Even if the difference between the OFF resistance and the ON resistance thus differs by one figure, the in-plane luminance balance can be maintained. Since the drain of the drive transistor 12 is connected to a reference voltage line SL, light emission of the organic EL element 101 mainly depends on a common signal Z outputted from a common line CL.

Figure 21:
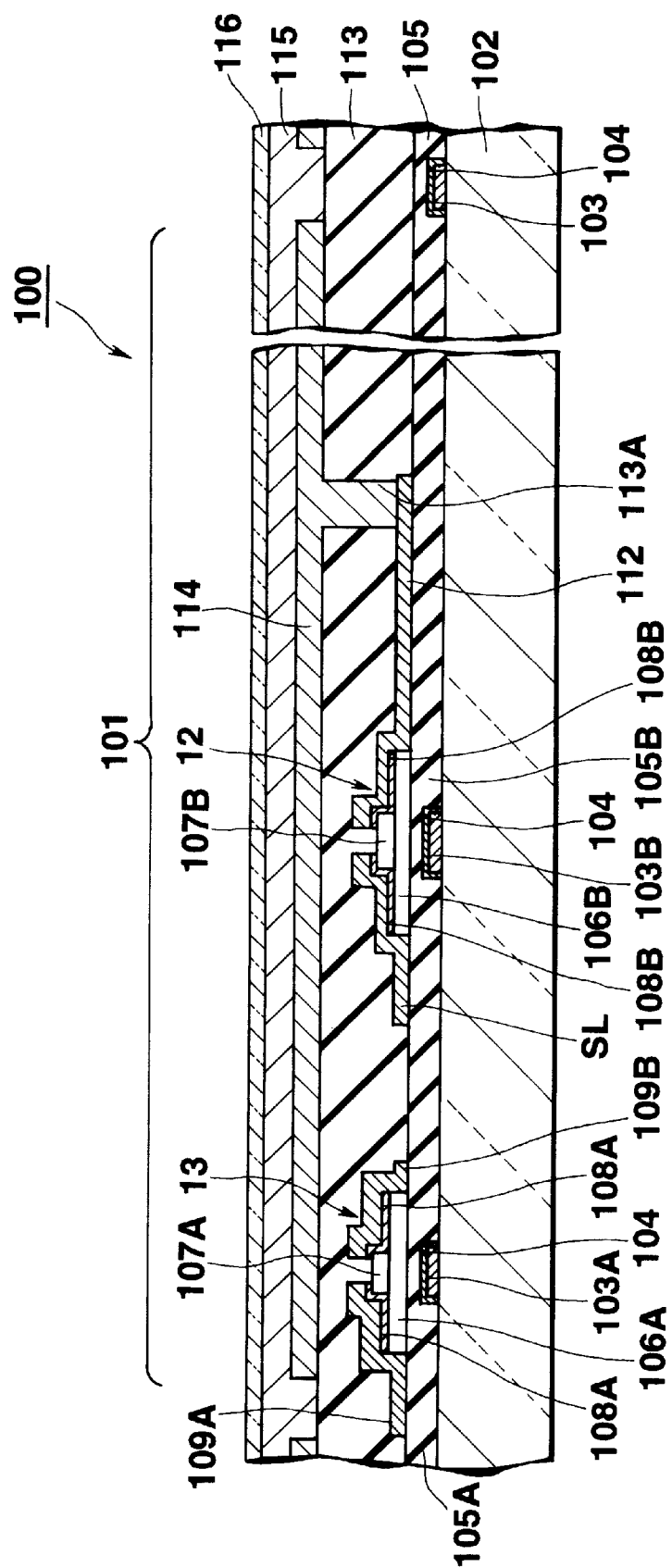
FIG. 21 is a cross-sectional view cut along a line B—B in FIG. 20.

Further, as shown in FIG. 21, an organic EL layer 115 is formed on the cathode electrode 114 and interlayer insulating film 113 formed for each pixel, over the entire light emission display region. The organic EL layer 115 is the same as the organic EL layer 11b shown in FIG. 4.

A sheet of anode electrode 116 made of transparent ITO is formed on the organic EL layer 115, over the entire light emission display region of all the organic EL elements 101, i.e., over the entire organic EL panel 100. In addition, the anode electrode 116 of each organic EL element 101 is connected through a switch S2 to a variable drive power source Ps for supplying drive voltages V1 to V4 or drive currents I1 to I4, set to values different from each-other.

Operation of the organic EL panel 100 constructed in a structure described above will be explained below. In the present embodiment, the cathode electrode 114 is formed so as to substantially cover a region (or pixel region) surrounded by adjacent two drain lines DL and adjacent two gate lines GL, so that the organic EL element 101 is capable of emitting light from the substantially entire region of one pixel region. In addition, since the cathode electrode 114 is made of a material which reflects light, display light generated by the organic EL layer 115 is emitted to the side of the anode electrode 116 without leaking downwards to the side of the glass substrate 102 when a drive voltage or a drive current is applied between the cathode electrode 114 and the anode electrode 116. Therefore, it is possible to prevent light unnecessarily entering into the semiconductor layers 106A and 106B of the selection transistor 13 and the drive transistor 12, so that operation errors can be prevented from being caused by a light electromotive force of each transistor. In addition, display light is emitted from the side of the transparent anode electrode 116, so that display light is not absorbed by a glass substrate 102 or the like but is emitted with high luminance.

Next, a drive circuit system of the organic EL panel 100 according to the present embodiment will be explained below. As shown in the circuit configuration of the equivalent circuit shown in FIG. 22, the EL display circuit of one pixel portion is constituted by the organic EL element 101, switches S1 and S2, and variable drive power source Ps. In addition, as described above, the switch S1 as a first switching circuit is capable of selectively supplying (or outputting) a ground voltage (or a common voltage) through the reference voltage line SL to the cathode electrode 114 of the organic EL element 101. The anode electrode side of the organic EL element 101 is connected through the switch S2 as a second switching circuit, to the variable drive power source Ps for supplying drive voltages V1 to V4 having positive polarities and voltage values different from each other or drive currents I1 to I4.

In the following, the driving method of the organic EL panel 100 according to the present embodiment will be explained. Firstly, in the present embodiment, the number of gate lines GL in the organic EL panel 100 is set to N (where N is preferably 480) and the number of drain lines DL is set to M (where M is preferably 600).

Figure 23:
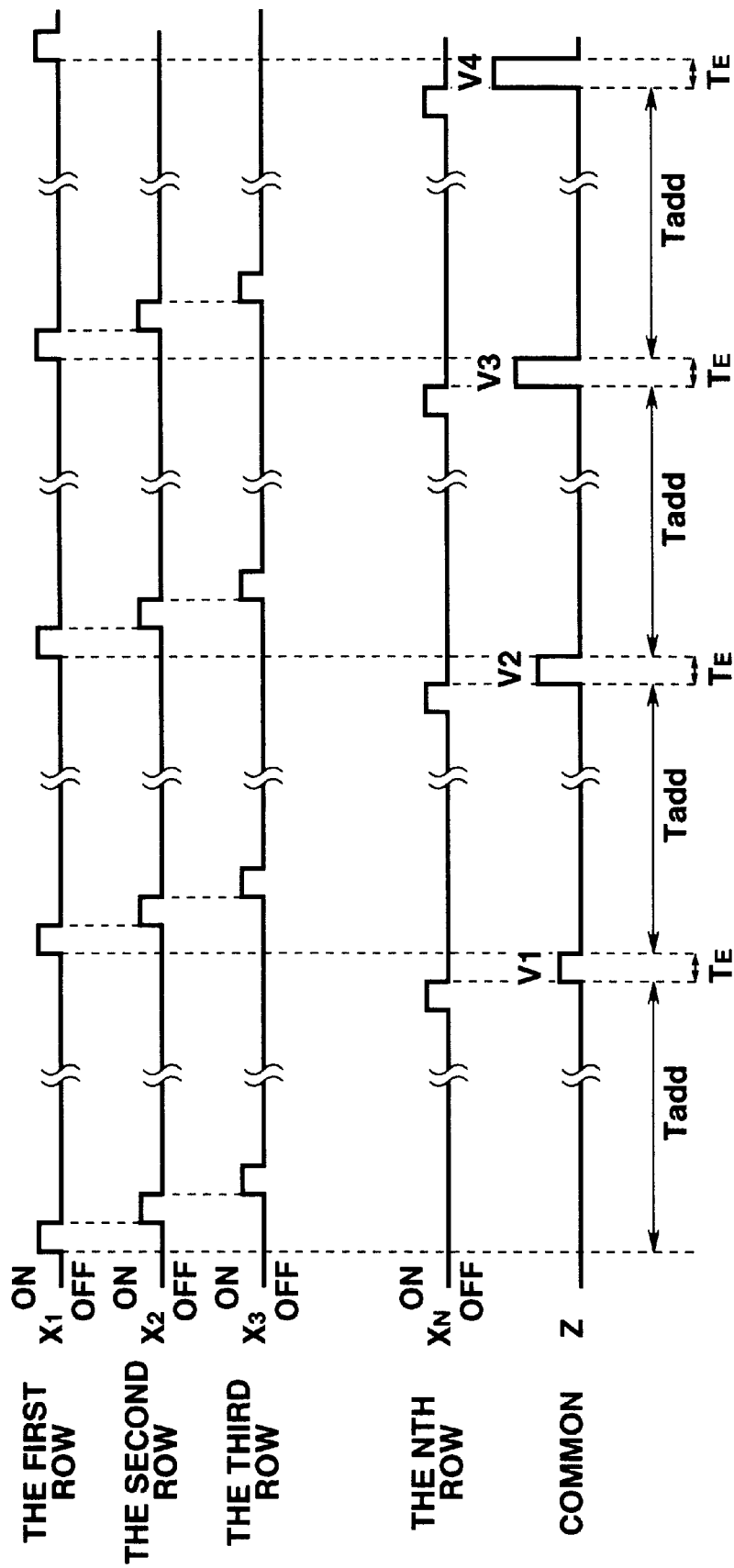
FIG. 23 is a timing chart showing drive waveforms in an organic EL display apparatus according to the seventh embodiment of the present invention.

Further, the present embodiment uses a gradation display system as shown in FIG. 23. One frame period for displaying one image (or maintaining display of an image) is set to 16.7 ms, and the one frame period is divided into four sub-frame periods (or first to fourth sub-frames). Each sub-frame period is set to 4.2 ms and consists of an address period Tadd (2.1 ms) for performing address writing and a light emission setting period $T_E$ (2.1 ms) in which a drive voltage or a drive current inherent to each sub-frame period is applied. Signals Z having values of applied voltages V1 to V4 or applied currents I1 to I4 are outputted through the drive power source Ps, so that the luminance of a selected organic EL element 101 is 1:2:4:8 in first to fourth sub-frames in the light emission setting period $T_E$, respectively.

Figure 24:
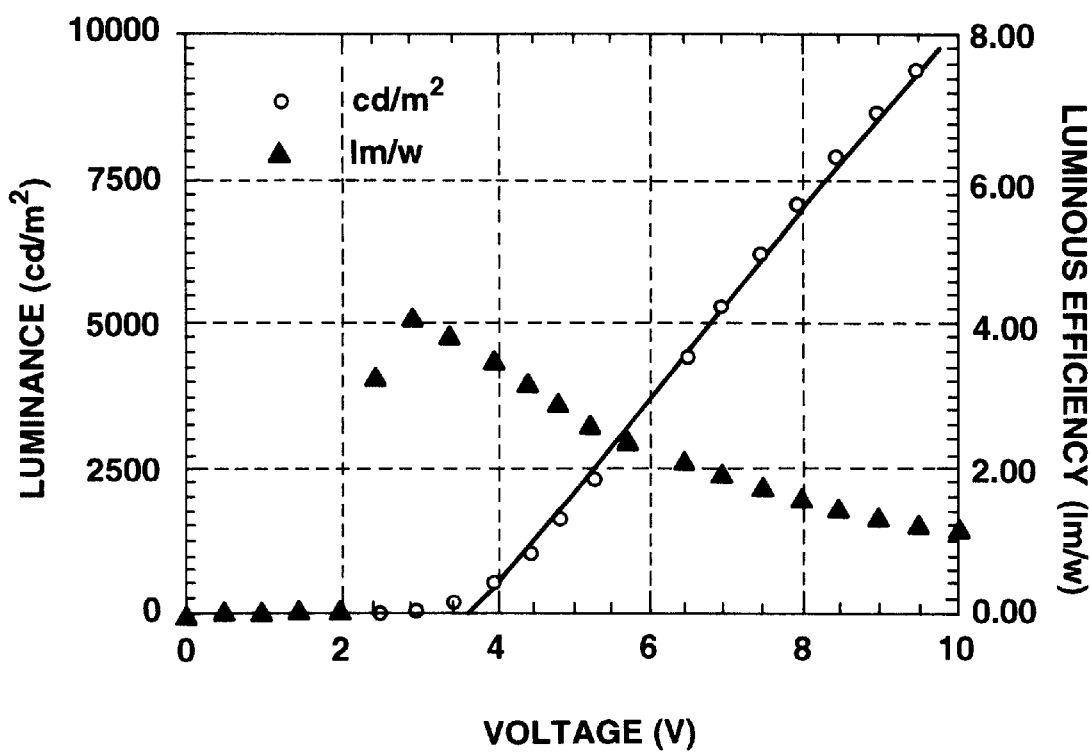
FIG. 24 is a characteristic graph of an organic EL element according to the seventh embodiment of the present invention.

FIG. 24 shows the characteristic of the organic EL element 101. The anode electrode 116 of the organic EL element 101 is made of an ITO film having a sheet resistance of about 8 to 10Ω and a film thickness of about 2000 Å, and the organic EL layer 115 includes a positive hole transfer layer of α-NPD having a film thickness of about 340 Å, a mixture layer of DPVBi and BCzVBi as a light emission layer having a film thickness of about 340 Å, and an electron transfer layer of Alq3 having a film thickness of about 220 Å. The cathode electrode 114 is made of a co-deposition film containing Mg and In at a ratio of about Mg:In=30:1 and having a film thickness of about 4000 Å. The light emission luminance ($cd/m^2$) of the organic El element 101 has a linear characteristic with respect to a forward bias voltage applied between the anode and cathode electrodes, and the ratio of the light emission luminance is proportional to the ratio of light emission drive voltage values or the ratio of light emission drive current values.

The ratio of the luminance depending on the light emission drive voltage values or drive current values applied in sub-frames is 1 in the first sub-frame: 2 in the second sub-frame: 4 in the third sub-frame: 8 in the fourth sub-frame. In this light emission setting periods, where the luminance of "1" is to be displayed in the light emission setting period of "1", the luminance of "1" is obtained by emitting light only in the first sub-frame. Where the luminance "2" is to be displayed, light is emitted only in the second sub-frame. Where the luminance "3" is to be displayed, light is emitted in the first and second sub-frames. Where the luminance "4" is to be displayed, light is emitted only in the third sub-frame. Thus, total 16 gradation levels can be displayed by combining the sub-frames.

In a Qth sub-frame, after address writing is completed in an address period Tadd, the electroluminescent elements 101 selected by addresses in all the rows are applied with a predetermined voltage value or a predetermined current during a light emission setting period $T_EQ$. Subsequently, in a (Q+1) sub-frame, address writing is performed in an address period Tadd, and the electroluminescent elements 101 selected by addresses in all the rows are simultaneously applied in a light emission setting period $T_E(Q+1)$ with a voltage or a current of a value different from that applied in the Qth sub-frame.

The above operation is performed in first to fourth sub-frames in one frame period. The timings of address selection are controlled by the switch Si shown in FIG. 22, and the timings of supply of drive voltages or drive currents are controlled by the switch S2. Specifically, by sequentially scanning the gate lines and the signal lines, selection transistors 13 of the pixels to be lightened at an equal light emission amount in one sub-frame period are turned on. When the selection transistor 13 are turned on, writing into the gate electrodes of drive transistors 12 is performed through the selection transistors 13 from signal lines, and channels are kept formed in the drive transistors 12 during an address period Tadd. After all the pixels to be lightened are selected in the address period, i.e., after completion of the address period Tadd, the selection state is maintained until a light emission setting period $T_E$. In the light emission setting period $T_E$, a variable drive power source Ps connected to the anode electrodes 116, for supplying drive voltages or drive currents respectively set in correspondence with sub-frames, is turned on by the switch S2. In the light emission setting period, the values of the drive voltages or the drive currents are respectively set to have height in compliance with sub-frames, as has been described above.

Figure 25:
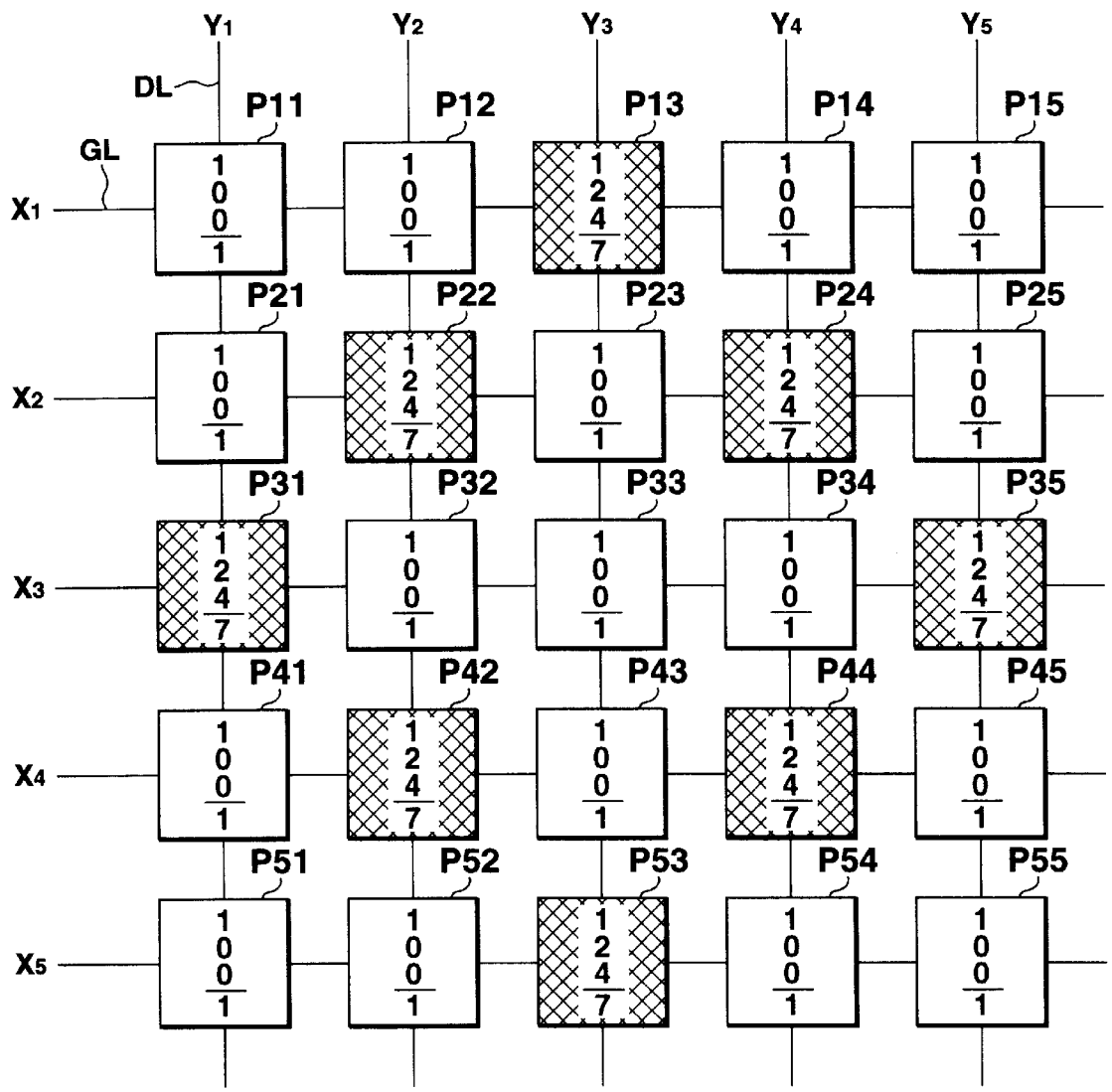
FIG. 25 is a view explaining the gradation display principle in case where one frame period is divided into three sub-frames.

Next, principles on which gradation display is achieved by the driving method of the present embodiment will be explained with reference to FIG. 25. For simplification of the explanation, the figure shows an example in which one frame period is divided into three sub-frames. The light emission amount of the light emission setting period in the first sub-frame is 1. The light emission amount in the second sub-frame is 2. The light emission amount in the third sub-frame is 4. FIG. 25 also shows an example in which pixels P13, P22, P24, P31, P42, P44, and P53 of the portions hatched by oblique lines have high luminance. For example, it is supposed that all the pixels are selected and light emission of luminance 1 is performed in a first sub-frame, and that only the pixels P13, P22, P24, P31, P35, P42, P44, and P53 are selected in the second and third sub-frames by sequential line scanning, thereby adding luminance 2 and luminance 4. Therefore, upon completion of the three sub-frames (or one frame period), the pixels P13, P22, P24, P31, P35, P42, P44, and P53 have a light emission amount 7 and thus have higher luminance in comparison with the other pixels which have a light emission amount 1. Thus, by dividing one-frame into a plurality of sub-frames, the gradation display of the organic EL panel 100 is enabled. These principles are also applicable to a case in which one frame period is divided into eight sub-frames, so that 256 gradation display is possible.

As has been described above, according to the present embodiment, a switch S2 controlled by binary signals of ON and OFF are used to switch drive voltages V1 to V4 or drive currents I1 to I4, and either one of binary signals of ON and OFF is selectively outputted to the selection transistors and drive transistors 12. Therefore, an organic EL element 101 having a resistance ratio during on, which is much larger than that of a drive transistor 12, is not substantially affected by variations of the ON resistance and the OFF resistance of a drive transistor 12, and it is possible to achieve light emission at luminance in accordance with a variable drive power source Ps.

In addition, a drive voltage having a voltage value of a light emission efficiency suitable for the organic element 101 or a drive current having a current value of a light emission efficiency suitable for the organic element 101 can be set, so that low power consumption can be achieved. Further, control of a voltage or current by a variable drive power source Ps is achieved by controlling voltages or currents corresponding to sub-frames, the number of which is much smaller than the number of gradation levels to be obtained by the organic EL panel 100 (e.g., corresponding to eight sub-frames where the number of gradation levels is 256). Therefore, the controllability can be improved.

Figure 26:
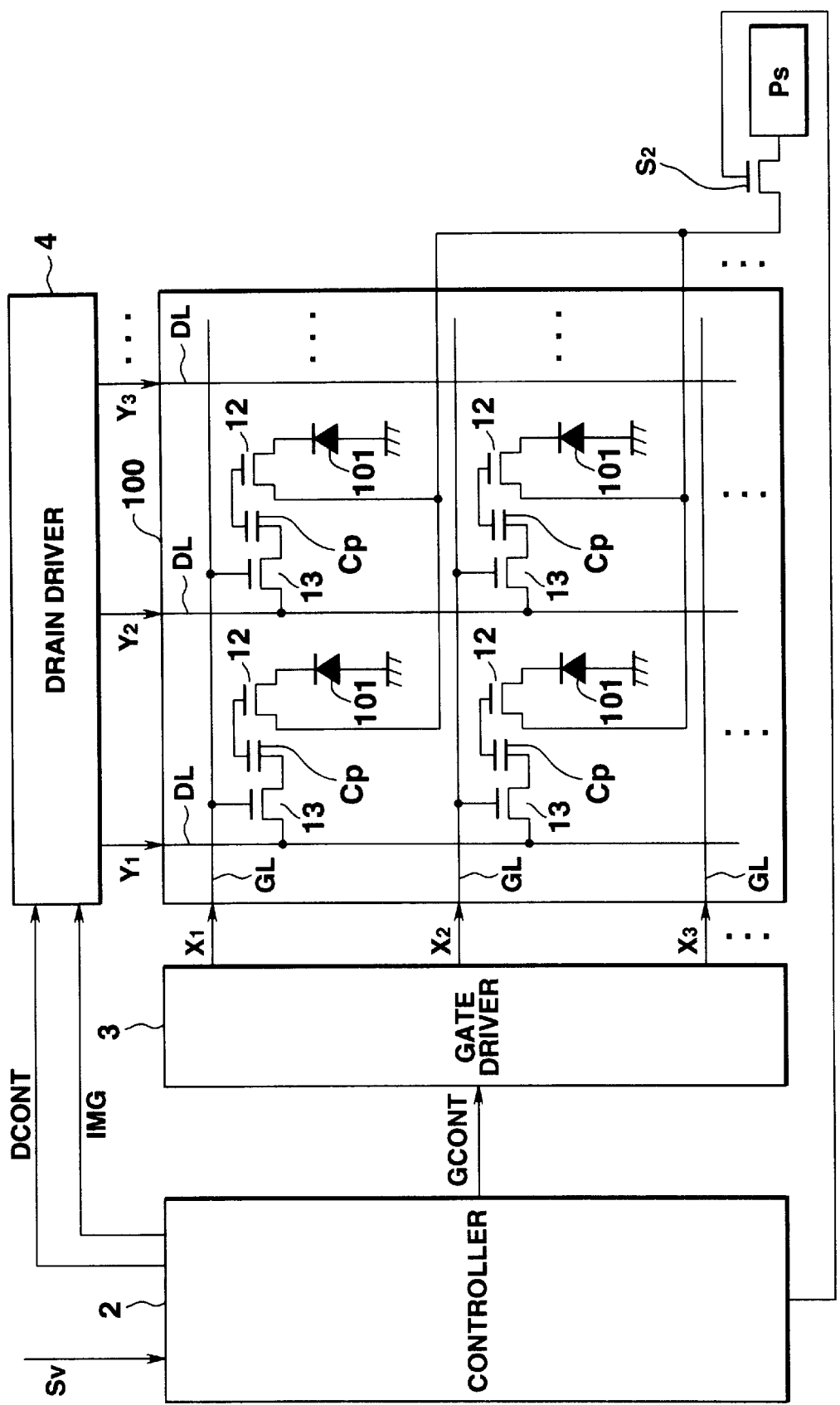
FIG. 26 is a circuit configuration showing a structure of another organic EL display apparatus according to the seventh embodiment of the present invention.
Figure 27:
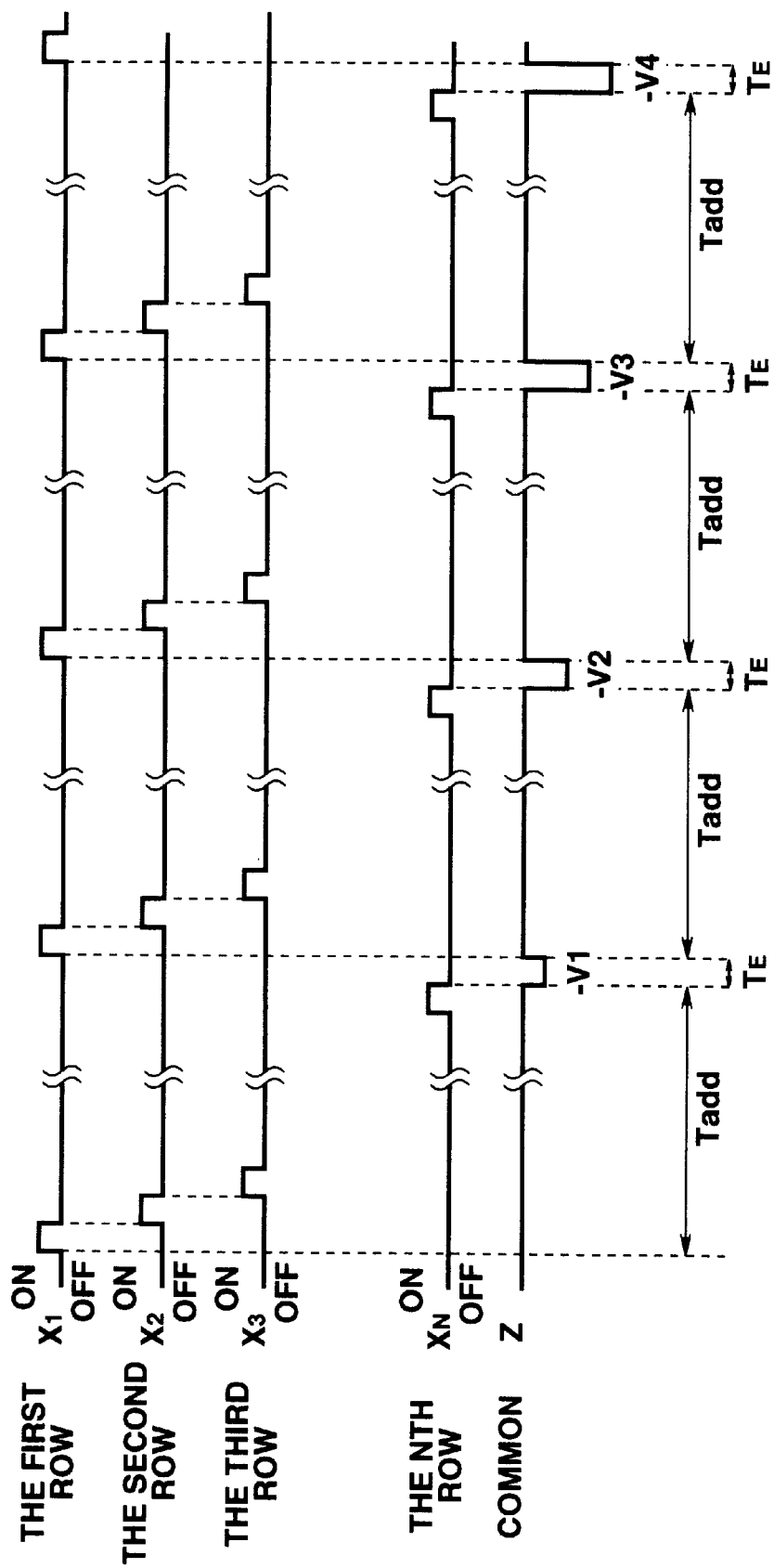
FIG. 27 is a timing chart showing drive waveforms in the organic EL display apparatus shown in FIG. 26.

The present embodiment explained above is not limited hitherto, but various modifications are possible in association with the subject matter of the structure. For example, in the above embodiment, the structure comprises the selection transistor 13 and the drive transistor 12 in order to maintain an address selection state during an address period in each sub-frame. However, the address selection state can be maintained with a structure arranged as shown in the circuit configuration of an equivalent circuit of one pixel in FIG. 26. In this figure, references 13, 12, and Cp respectively denote a selection transistor, a drive transistor, and a capacitor. Since the drive transistor 12 is connected with a capacitor Cp, a TFT having no EEPROM function can be used. One of the source and drain of the drive transistor 12 is connected to the cathode electrode of the organic EL element 101, and the other is connected through a switch S2 to a direct current power source Ps' for supplying a negative potential (−V1 to −V4) or a negative current (−I1 to −I4), so that the organic EL element 101 is applied with a forward bias. The drive waveforms in the organic EL display apparatus shown in FIG. 26 are shown in FIG. 27.

The organic EL elements 101 are constructed in a structure in which one sheet of the anode electrode formed over the entire light emission display region is grounded. When the drive transistor 12 is selected and the switch S2 is turned on by a signal from the controller 2, the selected organic EL element 101 emits light.

In addition, in the embodiment described above, those organic EL elements 101 are particularly effective as electroluminescent elements, which are capable of emitting light in a direct current electric field. However, inorganic EL elements or other electroluminescent elements may be naturally applicable. In the present embodiment, the light emission layer of the organic EL element may be made of two or more organic layers having charge transfer characteristics different from each other, and a shielding layer for shielding oxygen and water from entering can be provided on the anode electrode 116. In addition, it is possible to adopt a structure in which an anode electrode 116, an organic El layer 115, and a cathode electrode 114 are layered in this order from the side of a substrate 102.

In the present embodiment, the time length of the total of all address periods Tadd in one frame period is equal to the time length of the total light emission setting period $T_E$. However, either the address periods Tadd or the light emission setting periods $T_E$ may be elongated and the other may be shortened, in accordance with the characteristics of the selection transistors 13 and the drive transistors 12. In addition, although the drive voltages or drive currents are applied in an order from a smaller one (e.g., V1, V2, . . . , V4), the order is not limited hitherto and the voltages or currents may be applied in an order from a larger one (e.g., V4, V3, . . . , V1) or in an order not according to the amounts of the voltage values or current values, e.g., in an order of V4, V1, V3, to V2. In addition, the drive voltages V1 to V4 supplied from the variable drive power source Ps may be of an alternating current. Further, the number of gradation levels is not limited to 16 but may be more or less than 16 as far as a plurality of gradation levels are adopted.

Figure 28:
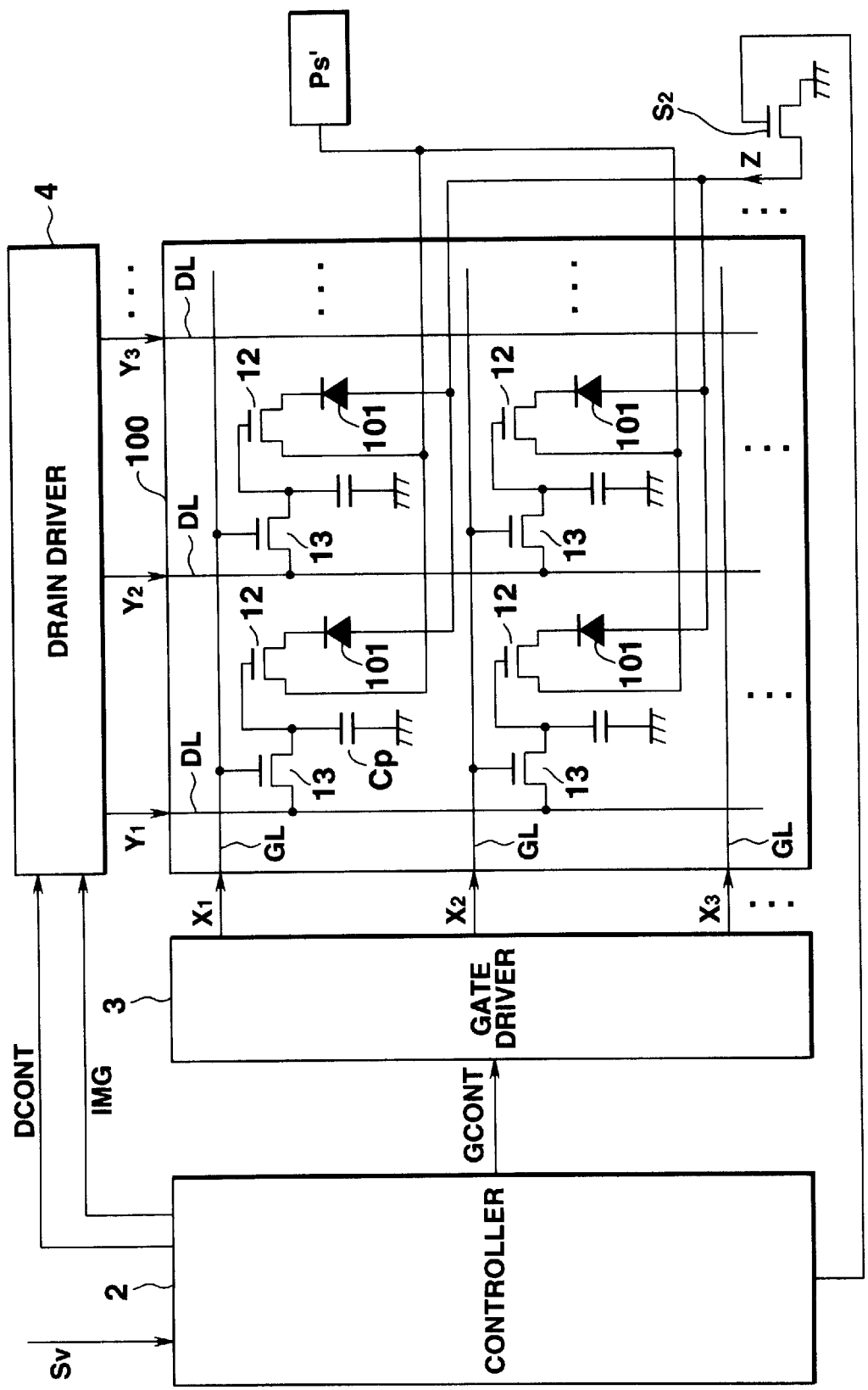
FIG. 28 is a circuit configuration showing a structure of further organic EL display apparatus according to the seventh embodiment of the present invention.

In the present embodiment, the switch S1 forming the selection transistor 13 and the drive transistor 12 is connected to a reference voltage line, and the switch S2 which is turned on during a light emission setting period T is connected to a variable drive power source Ps. However, as shown in FIG. 28, the switch S2 in the side of the anode electrode of the organic EL element 101 may be directly grounded without through the variable drive power source Ps, and the drive transistor 12 of the switch S1 in the side of the cathode electrode of the organic EL element may be connected to a variable drive power source Ps' for supplying a drive voltage of a negative potential or a negative drive current, in place of a reference voltage line. In this case, either one of binary signals is outputted to the gate lines GL and the drain lines DL, and the switch S2 connected to the anode electrode of the organic EL element 101 can be controlled to be turned on and off by binary signals. Specifically, during an address period Tadd, a drive voltage or a drive current of a negative potential is supplied to the side of the cathode electrodes of the organic EL elements 101. All the switches S2 are Aturned on during a light emission setting period $T_E$, and the anode electrodes of the organic EL elements 101 are grounded, so that light emission is obtained.

Further, in the present embodiment, the organic EL elements 101 are formed above the drive transistors 12 and selection transistors 13. However, the organic EL elements 101 may be formed in the same plane as the transistors 12 and 13. In this case, if an anode electrode 116, an organic EL layer 115, and a cathode electrode 114 are layered in this order form the side of the substrate 102, the cathode electrode 114 made of a material which has a low work function and is easily oxidized is not degraded through steps of forming the anode electrode 116 and the organic EL layer 115.

Figure 29:
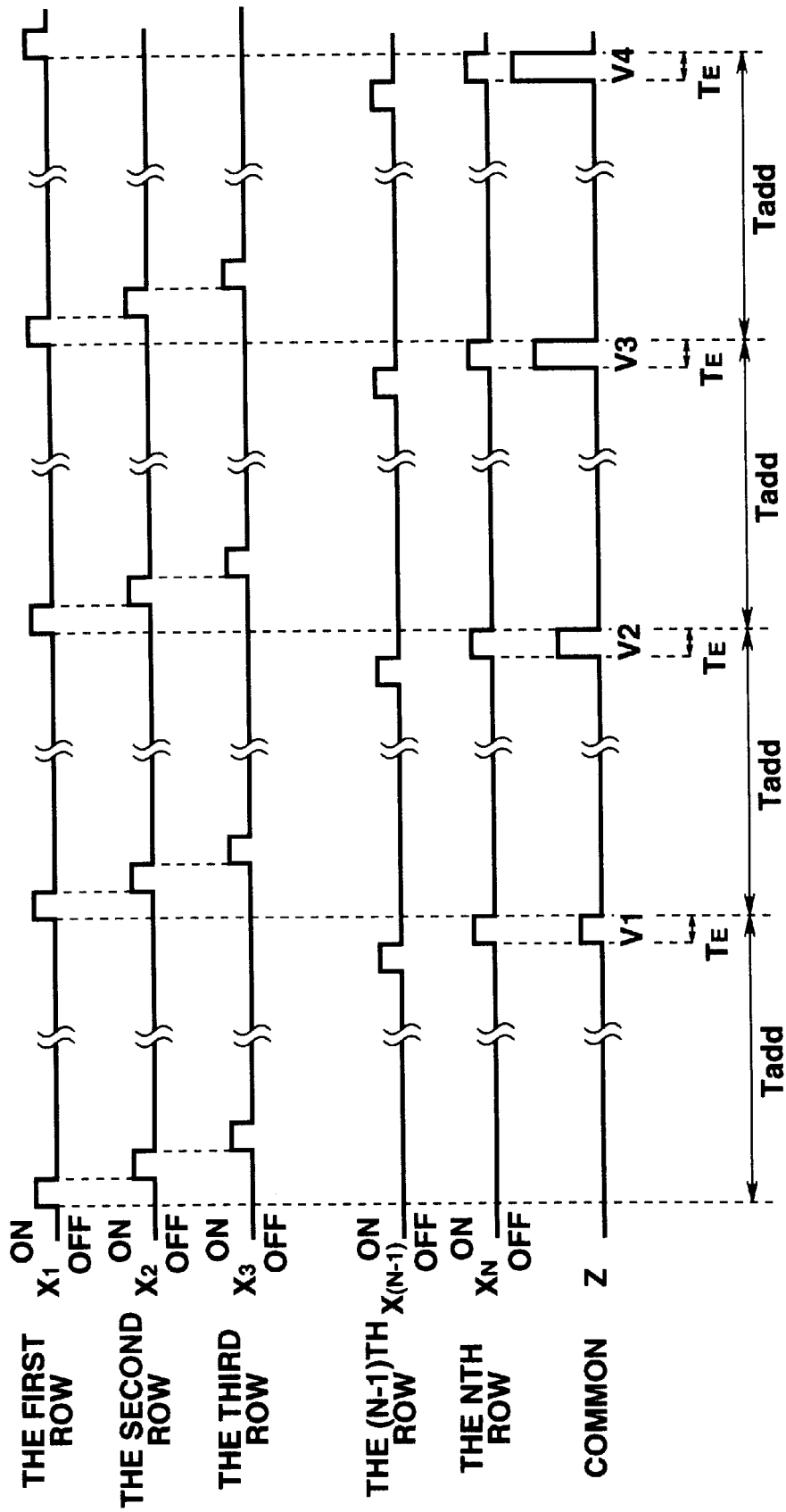
FIG. 29 is a timing chart showing other drive waveforms in the organic EL display apparatus.

Also, in the above embodiment, as shown in FIGS. 23 and 27, the address period Tadd and the light emission setting period $T_E$ are arranged such that both periods do not overlap each other. However, as shown in FIG. 29, a selection period of the last row may be overlapped by a light emission setting period $T_E$ of the sub-frame.

In the following, an electroluminescent display apparatus and a driving method according to an eighth embodiment of the present invention will be explained in details on the basis of the embodiment shown in figures. The electroluminescent display apparatus according to the present embodiment has a structure which is substantially the same as that of the seventh embodiment shown in FIGS. 19 to 21, and therefore, will be explained with reference to FIG. 19. In one pixel region, there are provided a selection transistor 13 driven by a signal X outputted through a gate line GL and a signal Y outputted through a drain line DL, a drive transistor 12 whose gate is connected to the selection transistor 13. The drive transistor 12 is connected to one of electrodes of an organic EL element 101. When the selection transistor 13 is selected and a drive signal Y is outputted through a drain line DL, the drive transistor 12 is turned on. The drive signal Y is a binary signal of ON or OFF. Note that the characteristic of the drive transistor 12 is set such that the resistance of the drive transistor 12 turned off is sufficiently high in comparison with the organic EL element 101 while the resistance of the drive transistor 12 turned on is negligibly low in comparison with the organic EL element 101. The present embodiment differs from the seventh embodiment in that the drive power source Ps is set so as to By apply a voltage of a constant value or a current of a constant value, and the switch S2 changes drive voltage supply periods $T_E$ of sub-frames to differ from each other. The drive voltage supply period $T_E$ is substantially equal to the light emission period.

Figure 30:
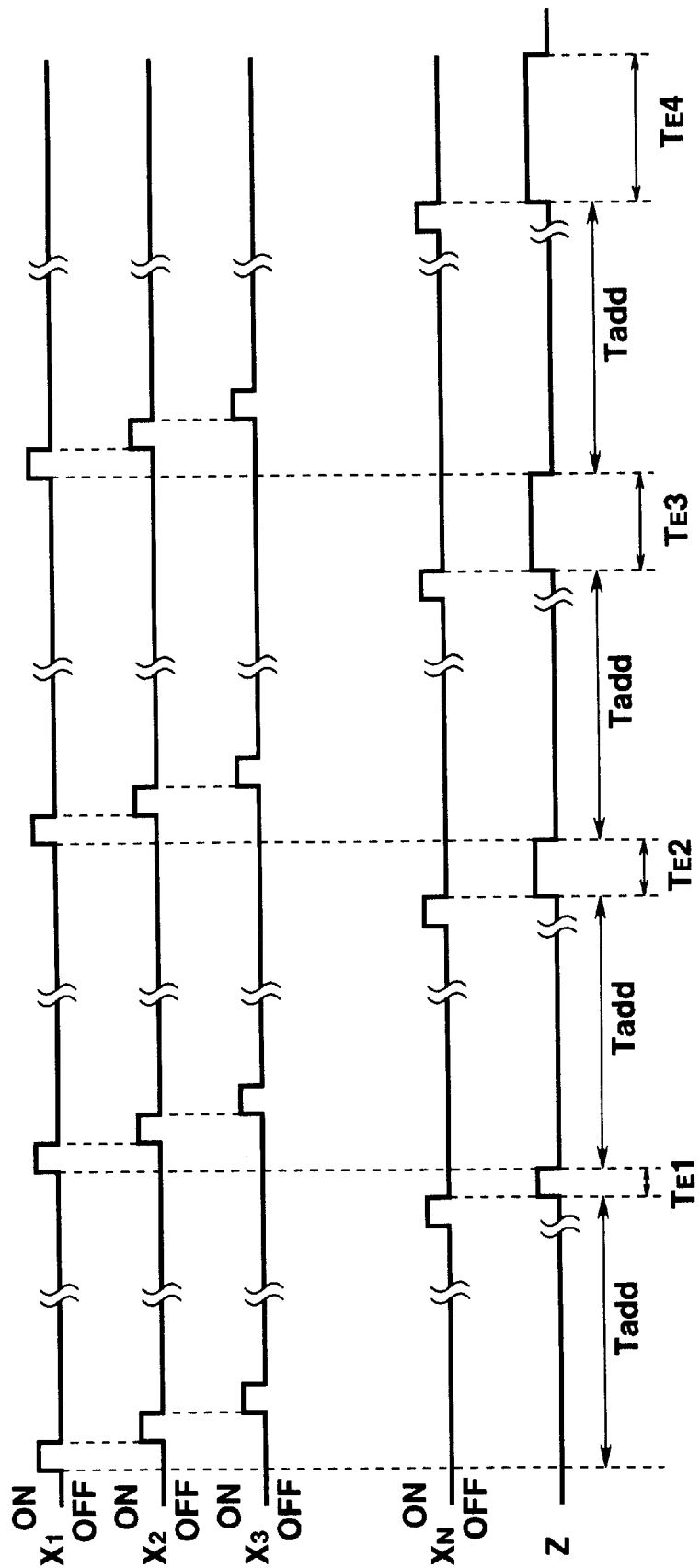
FIG. 30 is a timing chart showing drive waveforms of an organic EL display apparatus according to an eighth embodiment of the present invention.

In the following, the driving method of the organic EL panel 100 according to the present embodiment will be explained. The present embodiment uses a gradation display system as shown in FIG. 30. As shown in the figure, supposing that one frame period for displaying one image (or maintaining display of an image) is fixed to 16.6 ms, the one frame period is divided into four sub-frame periods (or first to fourth sub-frames). Each sub-frame period consists of an address period Tadd for performing address writing and drive voltage supply periods $T_E1$ to $T_E4$ corresponding to the address period. The apparent luminance of an organic EL element 101 depends on a product of light emission luminance per unit time and a light emission time. The ratio of the lengths of the drive voltage supply periods $T_E$ is 1 in $T_E1$: 2 in $T_E2$: 4 in $T_E3$: 8 in $T_E4$ where the drive voltage supply period $T_E1$ is expressed as 1. In these drive voltage supply periods, where luminance of 1 is displayed in a drive voltage supply period of "1", the luminance of 1 is obtained by emitting light only in the first sub-frame. To display luminance of "2", light is emitted only in the second sub-frame. To display luminance of "3", light is emitted in the first and second sub-frames. To display luminance of "4", light is emitted only in the third sub-frame. Thus, total 16 gradation levels can be obtained by combining the sub-frames.

In a Qth sub-frame, after address writing is completed in an address period Tadd, the electroluminescent elements 101 selected by addresses in all the rows are applied with a predetermined voltage value or a predetermined current during a light emission setting period $T_EQ$. Subsequently, in a (Q+1) sub-frame, address writing is performed in an address period Tadd, and the electroluminescent elements 101 selected by addresses in all the rows are simultaneously applied in a light emission setting period $T_E(Q+1)$ with a voltage or a current of a value equal to that applied in the Qth sub-frame. Driving of sub-frames described above are performed in one frame period consisting of first to fourth sub-frames, in a similar manner, and in a next frame, the driving of sub-frames is repeatedly performed from the first to fourth sub-frames. The timing of address selection can be controlled by the switch S1 shown in FIG. 22, and the drive voltage supply period can be controlled by the ON-period of the switch S2. Specifically, by sequentially scanning the gate lines and the signal lines in one sub-frame period, selection transistors 13 of the pixels to be lightened during a display discharge period inherent to the sub-frame are turned on. When the selection transistors 13 are turned on, writing into the gate electrodes of the drive transistors 12 is performed through the selection transistors 13 from signal lines, and channels are kept formed in the drive transistors 12 during an address period Tadd. After all the pixels to be lightened are selected in the address period, i.e., after completion of the address period Tadd, the selection state is maintained until a light emission setting period $T_E$. In the drive voltage supply period $T_E$, a variable drive power source Ps connected to anode electrodes 116 is turned on by the switch S2. The drive voltage supply periods are arranged to have respectively lengths for sub-frames.

Next, principles on which gradation display is achieved by the driving method of the present embodiment will be explained with reference to FIG. 6. For simplification of the explanation, the figure shows an example in which one frame period is divided into three sub-frames. The drive voltage supply period (or light emission period) for the first sub-frame is 1. The drive voltage supply period for the second sub-frame is 2. The drive voltage supply period for the third sub-frame is 4. FIG. 25 also shows an example in which pixels P13, P22, P24, P31, P42, P44, and P53 of the portions hatched by oblique lines have high luminance. For example, it is supposed that all the pixels are selected and light emission of luminance 1 is performed in a first sub-frame, and that only the pixels P13, P22, P24, P31, P35, P42, P44, and P53 are selected in the second and third sub-frames by sequential line scanning, thereby adding luminance 2 and luminance 4. Therefore, upon completion of the three sub-frames (or one frame period), the pixels P13, P22, P24, P31, P35, P42, P44, and P53 have a light emission amount 7 and thus have higher luminance in comparison with the other pixels which have a light emission amount 1. Thus, by dividing one-frame into a plurality of sub-frames, the ratio of the total of the address periods to the total of the drive voltage supply periods can be changed, so that the gradation display of the organic EL panel 100 is enabled. If a voltage value which provides the highest efficiency in the voltage-luminance-efficiency characteristic of an organic EL element shown in FIG. 24 is used for light emission driving, light emission driving can be achieved with a low power consumption. These principles are also applicable to a case in which one frame period is divided into eight sub-frames, so that 256 gradation display is possible.

As has been described above, according to the present embodiment, the switch S2 controlled by binary signals of ON and OFF are used to switch drive voltages V1 to V4 or drive currents I1 to I4, and either one of binary signals of ON and OFF is selectively outputted to the selection transistors 13 and drive transistors 12. Therefore, the organic EL element 101 having a resistance ratio during an ON period, which is much larger than that of the drive transistor 12, is not substantially affected by variations of the ON resistance and the OFF resistance of the drive transistor 12, and it is possible to achieve light emission at luminance in accordance with the variable drive power source Ps.

In particular, in case where three switching elements of the selection transistor 13, the drive transistor 12, and the switch S2 are constructed for one organic EL element, slight differences in electric characteristics inherent to the three elements are multiplied by each other, resulting in that the luminance gradation level of a pixel is greatly changed. However, in the present embodiment, the selection transistor 13, the drive transistor 12, and the switch S2 perform only ON/OFF control with use of voltage values within a saturated current region, and therefore, an advantage is obtained in that the luminance gradation levels are difficult to be influenced even if the characteristics vary more or less. In addition, since a voltage value which provides an excellent light emission efficiency for the organic EL element 101 can be set as a drive voltage, lower power consumption can be achieved.

Although the present embodiment has been explained above, the present invention is not limited hitherto, but various modifications are possible in association with the subject matter of the structure. For example, in the above eighth embodiment, the structure may be arranged as shown in FIGS. 26 and 28, and a negative voltage or a negative current may be outputted for different periods in sub-frames, respectively, so that organic EL elements 101 are applied with a forward bias when selected.

In addition, in the embodiment described above, those organic EL elements 101 are particularly effective as electroluminescent elements, which are capable of emitting light in a direct current electric field. However, inorganic EL elements or other electroluminescent elements may be naturally applicable. In the present embodiment, the light emission layer of the organic EL element may be made of two or more organic layers having charge transfer characteristics different from each other, and a shielding layer for shielding oxygen and water from entering can be provided on the anode electrode 116. In addition, it is possible to adopt a structure in which the anode electrode 116, the organic El layer 115, and the cathode electrode 114 are layered in this order from the side of the substrate 102.

In the present embodiment, the time length of the total of all address periods Tadd in one frame period is equal to the time length of the total voltage supply periods $T_E1$ to $T_E8$. However, either the address periods Tadd or the drive voltage supply periods $T_E$ may be elongated and the other may be shortened, in accordance with the characteristics of the selection transistors 13 and the drive transistors 12. In addition, although the drive voltages or drive currents are applied in an order from a shorter drive voltage supply period (e.g., $T_E1$, $T_E2$, ..., $T_E4$), the order is not limited hitherto and the voltages or currents may be applied in an order from a longer drive voltage supply period (e.g., $T_E4$, $T_E3$, ..., $T_E1$) or in an order not according to the lengths of the drive voltage supply periods, e.g., in an order of $T_E4$, $T_E1$, $T_E3$, to $T_E2$. In addition, the drive voltage Vdd supplied from the variable drive power source Ps may be of an alternating current or an alternating current voltage. Further, the number of gradation levels is not limited to 16 but may be more or less than 16 as far as a plurality of gradation levels are adopted.

Further, in the present embodiment, the organic EL elements 101 are formed above the drive transistors 12 and selection transistors 13. However, the organic EL elements 101 may be formed in the same plane as the transistors 12 and 13. In this case, if an anode electrode 116, an organic EL layer 115, and a cathode electrode 114 are layered in this order form the side of the substrate 102, the cathode electrode 114 made of a material which has a low work function and is easily oxidized is not degraded through steps of forming the anode electrode 116 and the organic EL layer 115.

Figure 31:
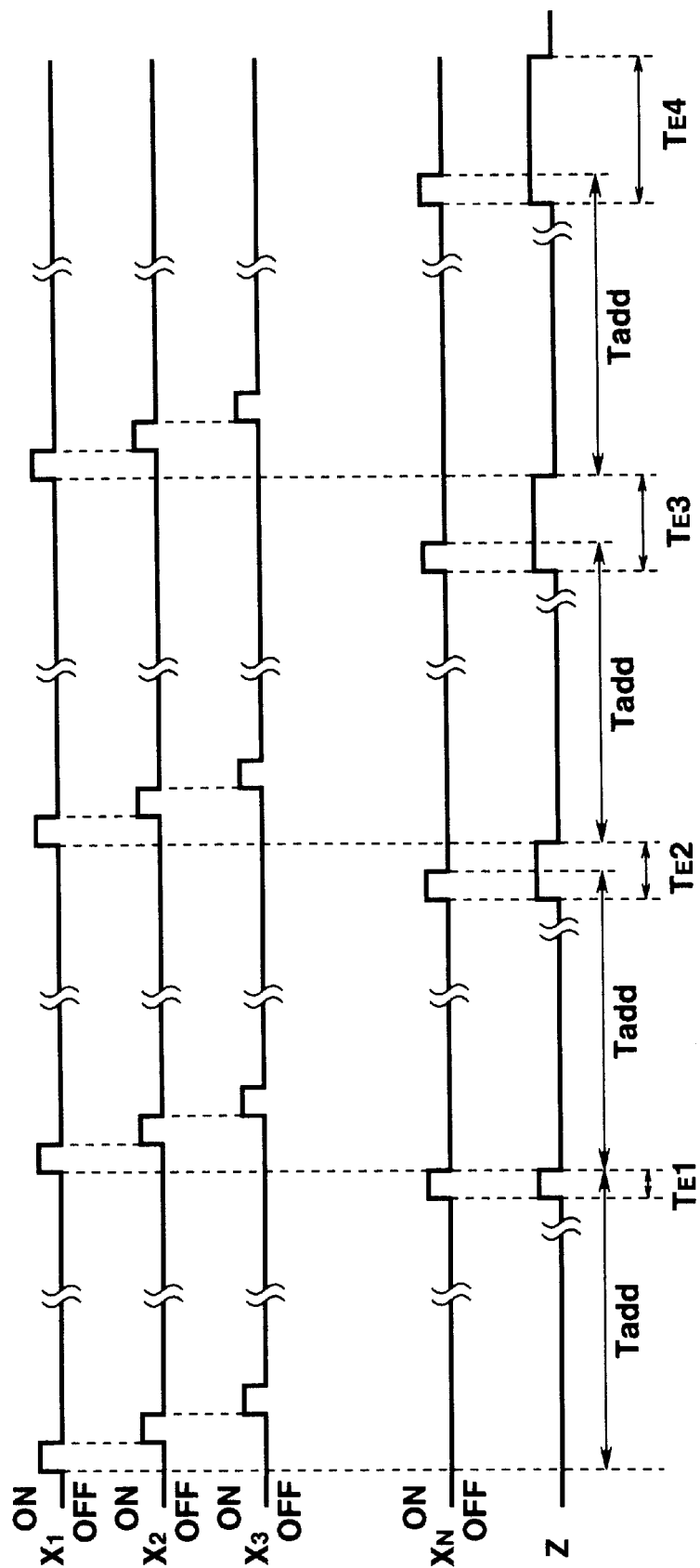
FIG. 31 is a timing chart showing other drive waveforms of the organic EL display apparatus according to the eighth embodiment of the present invention.
Figure 32:
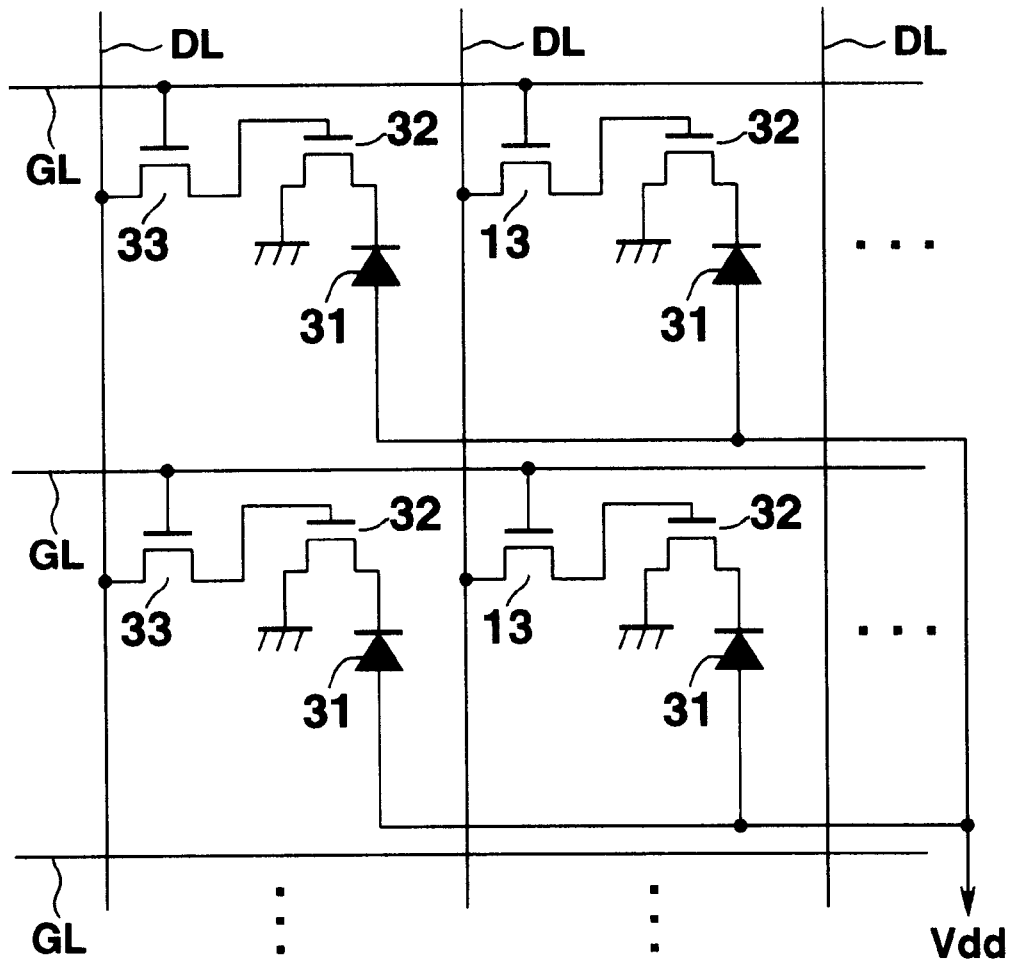
FIG. 32 is a view showing a structure of a conventional organic EL panel.
Figure 33:
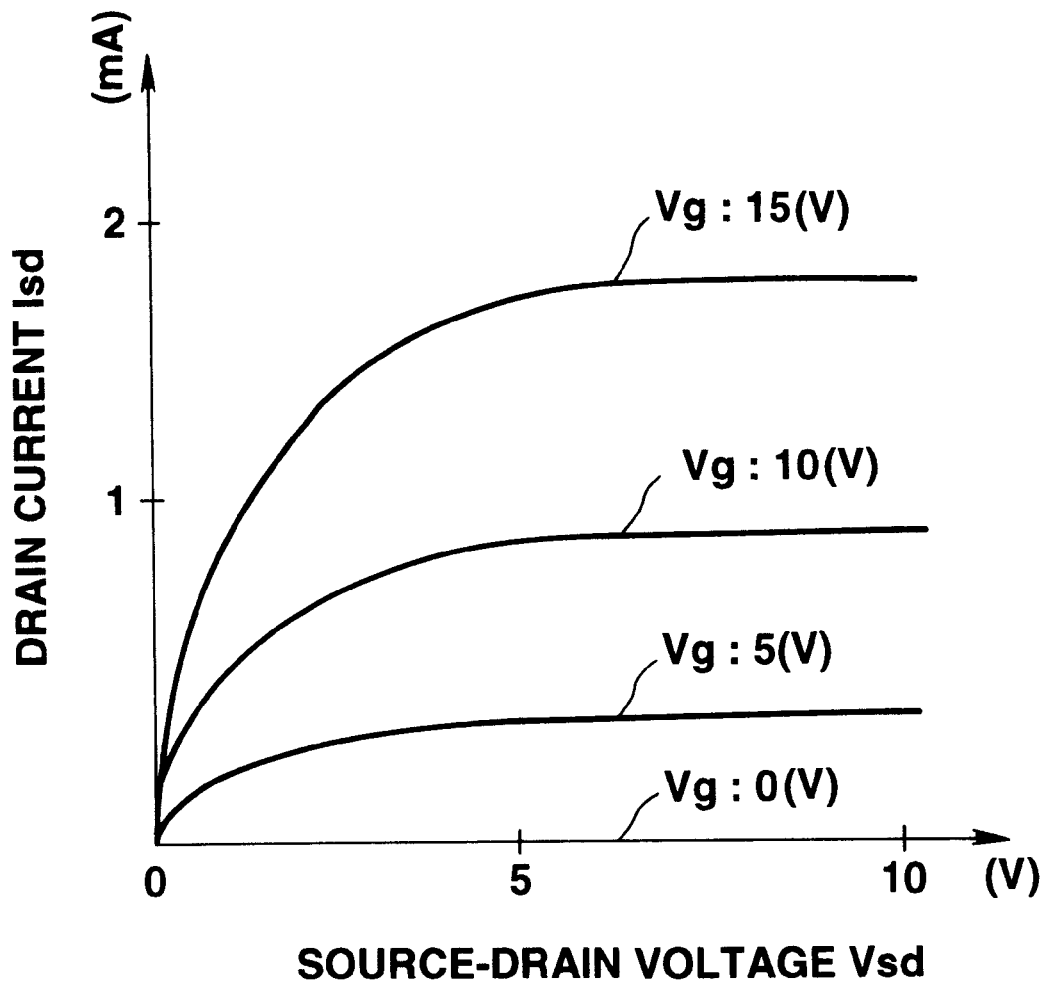
FIG. 33 is a characteristic graph of a drive transistor used in the organic EL panel shown in FIG. 32.

Also, in the above embodiment, as shown in FIG. 30, the address period Tadd and the light emission setting period $T_E$ are arranged such that both periods do not overlap each other. However, as suggested in the eighth embodiment shown in FIG. 31, a selection period of the last row may be overlapped by a light emission setting period $T_E$ of the sub-frame.

In the organic EL display apparatus according to the first to eighth embodiments described above, 16 gradation levels have been adopted. However, by adopting 256 gradation levels for each of R, G, and B colors, gradation display of 16,770,000 gradation levels is possible.

We claim:

1. An electroluminescent display apparatus comprising:
   a plurality of electroluminescent elements for emitting light in response to a voltage or a current applied, each of the electroluminescent elements including a first electrode, an electroluminescent layer in contact with the first electrode, and a second electrode in contact with the electroluminescent layer;
   a plurality of first switching circuits respectively connected to the first electrodes of the electroluminescent elements, for applying a first drive voltage to electroluminescent elements selected in each of address periods, in each of light emission setting periods, each of the first switching circuits having a smaller resistance ratio than that of each of the plurality of electroluminescent elements, during each of the light emission setting periods; and
   a second switching circuit connected to each of the second electrodes of the electroluminescent elements, for applying a second drive voltage different from the first drive voltage, to all the electroluminescent elements, in each of the light emission setting periods.

2. An electroluminescent display apparatus according to claim 1, wherein a frame period for forming an image consists of a plurality of sub-frame periods, and each of the sub-frame periods consists of the address period and the light emission setting period.

3. An electroluminescent display apparatus according to claim 2, wherein the organic electroluminescent element provides luminance per unit time, which differs between the sub-frame periods.

4. An electroluminescent display apparatus according to claim 3, wherein a potential difference between the first and second drive voltages differs between the sub-frame period.

5. An electroluminescent display apparatus according to claim 3, wherein a period for which the second switching circuit is applied with the second drive voltage differs between the sub-frame periods.

6. An electroluminescent display apparatus according to claim 1, wherein each of the first switching circuits includes:
- a selection transistor having a gate electrode connected to a gate line supplied with a scanning voltage, and a drain electrode connected to a drain line supplied with a signal voltage; and
- a drive transistor having a gate electrode connected to a source electrode of the selection transistor, a source electrode connected to the electroluminescent element, and a drain electrode for supplying the first drive voltage to the electroluminescent element.

7. An electroluminescent display apparatus according to claim 6, wherein the scanning voltage and the signal voltage are binary signals of ON/OFF corresponding to respective characteristics.

8. An electroluminescent display apparatus according to claim 1, wherein the second switching circuit is applied with binary signals of ON/OFF.

9. An electroluminescent display apparatus according to claim 1, wherein one of the first and second electrode is a sheet of conductive layer formed over the plurality of electroluminescent elements.

10. An electroluminescent display apparatus according to claim 1, wherein the electroluminescent elements are organic electroluminescent elements.

11. An electroluminescent display apparatus comprising:
- first and second groups each consisting of electroluminescent elements for emitting light in response to a voltage or a current applied, each of the electroluminescent elements including a first electrode, an electroluminescent layer in contact with the first electrode, and a second electrode in contact with the electroluminescent layer;
- a plurality of first switching circuits respectively connected to the first electrodes of the electroluminescent elements, for applying a first drive voltage to electroluminescent elements selected in each of address periods, in each of light emission setting periods, each of the first switching circuits having a smaller resistance ratio than that of each of the plurality of electroluminescent elements, during each of the light emission setting periods; and
- a second switching circuit connected to each of the second electrodes of the electroluminescent elements, for applying a second drive voltage different from the first drive voltage, to the first group of the electroluminescent elements, and subsequently, to the second group of the electroluminescent elements, in each of the light emission setting periods.

12. An electroluminescent display apparatus according to claim 11, wherein a frame period for forming an image consists of a plurality of sub-frame periods, and each of the sub-frame periods consists of the address period and the light emission setting period.

13. An electroluminescent display apparatus according to claim 12, wherein the organic electroluminescent element provides luminance per unit time, which differs between the sub-frame periods.

14. An electroluminescent display apparatus according to claim 13, wherein a potential difference between the first and second drive voltages differs between the sub-frame period.

15. An electroluminescent display apparatus according to claim 13, wherein a period for which applying the second drive voltage to the first and second groups of the electroluminescent elements by the second switching circuit, the period differs between the sub-frame periods.

16. An electroluminescent display apparatus according to claim 11, wherein each of the first switching circuits includes:
- a selection transistor having a gate electrode connected to a gate line supplied with a scanning voltage, and a drain electrode connected to a drain line supplied with a signal voltage; and
- a drive transistor having a gate electrode connected to a source electrode of the selection transistor, a source electrode connected to the electroluminescent element, and a drain electrode for supplying the first drive voltage to the electroluminescent element.

17. An electroluminescent display apparatus according to claim 16, wherein the scanning voltage and the signal voltage are binary signals of ON/OFF corresponding to respective characteristics.

18. An electroluminescent display apparatus according to claim 11, wherein one of the first and second electrode is a plurality of conductive layers which are divided by the first and second groups of the electroluminescent elements.

19. An electroluminescent display apparatus according to claim 11, wherein the electroluminescent elements are organic electroluminescent elements.

20. A driving method of an electroluminescent display apparatus comprising:
- a step of preparing a plurality of electroluminescent elements for emitting light in response to a voltage or a current applied, each of the electroluminescent elements including a first electrode, an electroluminescent layer in contact with the first electrode, and a second electrode in contact with the electroluminescent layer;
- a first drive voltage supply step of supplying a first drive voltage to the first electrodes of the electroluminescent elements which are addressed, in each of light emission setting periods, in a frame period for forming an image by synthesizing a plurality of sub-frames each consisting of an address period for addressing the plurality of electroluminescent elements, and one of the light emission setting periods for making the addressed electroluminescent elements emit light; and
- a second drive voltage supply step of supplying a second drive voltage different from the first drive voltage, to the second electrodes of all the electroluminescent elements, in each of the light emission setting periods.

21. A driving method of an electroluminescent display apparatus according to claim 20, wherein the image formed in the frame period is an image of $2^T$ gradation levels (where T is an integer greater than 1), and the plurality of sub-frame periods are T sub-frame periods.

22. A driving method of an electroluminescent display apparatus according to claim 21, wherein a ratio of light emission luminance defined by a product of instant luminance per unit time and a light emission period, between the light emission setting periods of T sub-frame periods, is $2^0:2^1: \ldots :2^{T-1}$.

23. A driving method of an electroluminescent display apparatus, comprising:
- (A) a step of preparing first and second groups each consisting of electroluminescent elements for emitting light in response to a voltage or a current applied, each of the electroluminescent elements including a first electrode, an electroluminescent layer in contact with the first electrode, and a second electrode in contact with the electroluminescent layer;

(B-1) a first electroluminescent element group address step of addressing the first group of the electroluminescent elements;

(B-2) a first electroluminescent element group light emission step of applying a common voltage to the electroluminescent elements addressed by the first electroluminescent element group address step;

(B-3) a second electroluminescent element group address step of addressing the second group of the electroluminescent elements, after the first electroluminescent element group address step; and (B-4) a second electroluminescent element group light emission step of applying a common voltage to the electroluminescent elements addressed by the second electroluminescent element group address step, wherein the first electroluminescent element group address step, the first electroluminescent element group light emission step, the second electroluminescent element group address step, and the second electroluminescent element group light emission step are carried out, in one of sub-frames of a frame period for forming an image by synthesizing the sub-frames each consisting of an address period for sequentially addressing the first and second groups, and a light emission setting period for making those of the electroluminescent elements of the first and second groups, which are addressed in the address period, emit light.

24. A driving method of an electroluminescent display apparatus according to claim 23, wherein the image formed in the frame period is an image of $2^T$ gradation levels (where T is an integer greater than 1), and the plurality of sub-frame periods are T sub-frame periods.

25. A driving method of an electroluminescent display apparatus according to claim 24, wherein a ratio of light emission luminance defined by a product of instant luminance per unit time and a light emission period, between the light emission setting periods of T sub-frame periods, is $2^0:2^1: \ldots :2^{T-1}$.

* * * * *